(12) United States Patent
Mok et al.

(10) Patent No.: US 7,247,035 B2
(45) Date of Patent: Jul. 24, 2007

(54) ENHANCED STRESS METAL SPRING CONTACTOR

(75) Inventors: Sammy Mok, Cupertino, CA (US); Fu Chiung Chong, Saratoga, CA (US); Roman Milter, San Francisco, CA (US)

(73) Assignee: Nanonexus, Inc., Fremont, CA (US)

( * ) Notice: Subject to any disclaimer, the term of this patent is extended or adjusted under 35 U.S.C. 154(b) by 55 days.

(21) Appl. No.: 10/932,552

(22) Filed: Sep. 1, 2004

(65) Prior Publication Data

US 2005/0026476 A1 Feb. 3, 2005
US 2006/0240690 A9 Oct. 26, 2006

Related U.S. Application Data

(63) Continuation-in-part of application No. 10/069,902, filed as application No. PCT/US01/19792 on Jun. 20, 2001, now Pat. No. 6,791,171.

(60) Provisional application No. 60/213,729, filed on Jun. 22, 2000, provisional application No. 60/212,923, filed on Jun. 20, 2000.

(51) Int. Cl.
*H01R 12/00* (2006.01)
*H05K 1/00* (2006.01)

(52) U.S. Cl. .......................... 439/81; 439/66

(58) Field of Classification Search .................. 439/66, 439/81, 91, 591; 257/678
See application file for complete search history.

(56) References Cited

U.S. PATENT DOCUMENTS 3,842,189 A 10/1974 Southgate
3,939,414 A 2/1976 Roch
4,035,046 A 7/1977 Kloth
4,320,438 A 3/1982 Ibrahim et al.

(Continued)

FOREIGN PATENT DOCUMENTS

AU 5964196 A 12/1996

(Continued)

OTHER PUBLICATIONS

S. Towle, H. Braunisch, C. Hu, R. Emory, and G. Vandentop, *Bumpless Build-Up Layer Packaging*, Intel Corporation, Components Research, Presented at ASME International Mechanical Engineering Congress and Exposition (IMECE), New York, Nov. 12, 2001.

(Continued)

*Primary Examiner*—Hae Moon Hyeon
(74) *Attorney, Agent, or Firm*—Michael A. Glenn; Glenn Patent Group

(57) ABSTRACT

Several embodiments of stress metal springs are disclosed, which typically comprise a plurality of stress metal layers that are established on a substrate, which are then controllably patterned and partially released from the substrate. An effective rotation angle is typically created in the formed stress metal springs, defining a looped spring structure. The formed springs provide high pitch compliant electrical contacts for a wide variety of interconnection systems, including chip scale semiconductor packages, high density interposer connectors, and probe contactors. Several embodiments of massively parallel interface integrated circuit test assemblies are also disclosed, comprising one or more substrates having stress metal spring contacts, to establish connections between one or more separated integrated circuits on a compliant wafer carrier.

22 Claims, 38 Drawing Sheets

U.S. PATENT DOCUMENTS

| | | | |
|---|---|---|---|
| 4,423,401 A | 12/1983 | Mueller |
| 4,636,722 A | 1/1987 | Ardezzone |
| 4,758,927 A | 7/1988 | Berg |
| 4,973,903 A | 11/1990 | Schemmel |
| 5,055,778 A | 10/1991 | Okubo et al. |
| 5,121,298 A | 6/1992 | Sarma et al. |
| 5,152,695 A | 10/1992 | Grabbe et al. |
| 5,166,774 A | 11/1992 | Benerji et al. |
| 5,225,037 A | 7/1993 | Elder et al. |
| 5,258,648 A | 11/1993 | Lin |
| 5,280,139 A | 1/1994 | Suppelsa et al. |
| 5,313,157 A | 5/1994 | Pasiecznik |
| 5,354,205 A | 10/1994 | Feigenbaum |
| 5,385,477 A | 1/1995 | Vaynkof et al. |
| 5,395,253 A | 3/1995 | Crumly |
| 5,412,866 A | 5/1995 | Woith et al. |
| 5,416,429 A | 5/1995 | McQuade et al. |
| 5,476,211 A | 12/1995 | Khandros |
| 5,532,612 A | 7/1996 | Liang |
| 5,563,521 A | 10/1996 | Crumbly |
| 5,568,054 A | 10/1996 | Iino et al. |
| 5,613,861 A | 3/1997 | Smith et al. |
| 5,621,333 A | 4/1997 | Long et al. |
| 5,665,648 A | 9/1997 | Little |
| 5,694,050 A | 12/1997 | Noguchi |
| 5,744,283 A | 4/1998 | Spierings et al. |
| 5,764,070 A | 6/1998 | Pedder |
| 5,772,451 A | 6/1998 | Dozier, II et al. |
| 5,786,701 A | 7/1998 | Pedder |
| 5,801,441 A | 9/1998 | DiStefano et al. |
| 5,806,181 A | 9/1998 | Khandros et al. |
| 5,820,014 A | 10/1998 | Dozier, II et al. |
| 5,821,763 A | 10/1998 | Meaman et al. |
| 5,828,226 A | 10/1998 | Higgins et al. |
| 5,829,128 A | 11/1998 | Eldridge et al. |
| 5,832,598 A | 11/1998 | Greenman et al. |
| 5,832,601 A | 11/1998 | Eldridge et al. |
| 5,847,572 A | 12/1998 | Iwasaki et al. |
| 5,848,685 A | 12/1998 | Smith et al. |
| 5,852,871 A | 12/1998 | Khandros |
| 5,864,946 A | 2/1999 | Eldridge et al. |
| 5,869,974 A | 2/1999 | Akram et al. |
| 5,878,486 A | 3/1999 | Eldridge et al. |
| 5,884,395 A | 3/1999 | Dabrowiecki et al. |
| 5,884,398 A | 3/1999 | Eldridge et al. |
| 5,886,535 A | 3/1999 | Budnatis et al. |
| 5,896,038 A | 4/1999 | Budnatis et al. |
| 5,897,326 A | 4/1999 | Eldridge et al. |
| 5,900,738 A | 5/1999 | Khandros et al. |
| 5,905,305 A | 5/1999 | Fogal et al. |
| 5,912,046 A | 6/1999 | Eldridge et al. |
| 5,914,218 A | 6/1999 | Smith et al. |
| 5,917,707 A | 6/1999 | Khandros et al. |
| 5,926,951 A | 7/1999 | Khandros et al. |
| 5,944,537 A | 8/1999 | Smith et al. |
| 5,974,662 A | 11/1999 | Eldridge et al. |
| 5,983,493 A | 11/1999 | Eldridge et al. |
| 5,994,152 A | 11/1999 | Khandros et al. |
| 5,994,222 A | 11/1999 | Smith et al. |
| 5,994,781 A | 11/1999 | Smith |
| 5,998,228 A | 12/1999 | Eldridge et al. |
| 5,998,864 A | 12/1999 | Khandros et al. |
| 6,001,671 A | 12/1999 | Fjelstad |
| 6,002,168 A | 12/1999 | Bellaar et al. |
| 6,007,349 A | 12/1999 | Distefano et al. |
| 6,012,224 A | 1/2000 | DiStefano et al. |
| 6,020,220 A | 2/2000 | Gilleo et al. |
| 6,023,103 A | 2/2000 | Chang et al. |
| 6,029,344 A | 2/2000 | Khandros et al. |
| 6,030,856 A | 2/2000 | DiStefano et al. |
| 6,032,356 A | 3/2000 | Eldridge et al. |
| 6,033,935 A | 3/2000 | Dozier, II et al. |
| 6,042,712 A | 3/2000 | Mathieu |
| 6,043,563 A | 3/2000 | Eldridge et al. |
| 6,044,548 A | 4/2000 | Distefano et al. |
| 6,045,396 A | 4/2000 | Tighe |
| 6,045,655 A | 4/2000 | DiStefano et al. |
| 6,046,076 A | 4/2000 | Mitchell et al. |
| 6,049,976 A | 4/2000 | Khandros |
| 6,050,829 A | 4/2000 | Eldrdge et al. |
| 6,054,337 A | 4/2000 | Solberg |
| 6,054,756 A | 4/2000 | DiStefano et al. |
| 6,063,648 A | 5/2000 | Beroz et al. |
| 6,064,213 A | 5/2000 | Khandros et al. |
| 6,075,289 A | 6/2000 | Distefano |
| 6,078,186 A | 6/2000 | Hembree et al. |
| 6,080,603 A | 6/2000 | Distefano et al. |
| 6,080,605 A | 6/2000 | Distefano et al. |
| 6,080,932 A | 6/2000 | Smith et al. |
| 6,081,035 A | 6/2000 | Warner et al. |
| 6,090,261 A | 7/2000 | Mathieu |
| 6,110,823 A | 8/2000 | Eldridge et al. |
| 6,183,267 B1 * | 2/2001 | Marcus et al. ................ 439/66 |
| 6,184,053 B1 | 2/2001 | Eldridge et al. |
| 6,184,065 B1 | 2/2001 | Smith et al. |
| 6,184,699 B1 | 2/2001 | Smith et al. |
| 6,192,982 B1 | 2/2001 | Divis et al. |
| 6,203,331 B1 * | 3/2001 | McHugh et al. .............. 439/71 |
| 6,213,789 B1 | 4/2001 | Chua et al. |
| 6,246,247 B1 | 6/2001 | Eldridge et al. |
| 6,255,126 B1 | 7/2001 | Mathieu et al. |
| 6,264,477 B1 | 7/2001 | Smith et al. |
| 6,265,888 B1 | 7/2001 | Hsu |
| 6,274,823 B1 | 8/2001 | Khandros et al. |
| 6,290,510 B1 * | 9/2001 | Fork et al. .................... 439/81 |
| 6,352,454 B1 | 3/2002 | Kim et al. |
| 6,361,331 B2 | 3/2002 | Fork et al. |
| 6,439,898 B2 | 8/2002 | Chua et al. |
| 6,525,555 B1 | 2/2003 | Khandros et al. |
| 6,528,350 B2 | 3/2003 | Fork |
| 6,528,984 B2 | 3/2003 | Beaman et al. |
| 6,534,856 B1 | 3/2003 | Dozier, II et al. |
| 6,544,814 B1 | 4/2003 | Yasunaga et al. |
| 6,684,499 B2 * | 2/2004 | Romano et al. .............. 29/874 |
| 6,827,584 B2 * | 12/2004 | Mathieu et al. ............... 439/66 |
| 6,844,214 B1 * | 1/2005 | Mei et al. ..................... 438/52 |
| 2002/0013070 A1 | 1/2002 | Fork et al. |
| 2002/0016095 A1 | 2/2002 | Fork et al. |
| 2003/0010615 A1 | 1/2003 | Fork et al. |
| 2003/0071348 A1 | 4/2003 | Eguchi et al. |
| 2003/0075795 A1 | 4/2003 | Hashimoto |

FOREIGN PATENT DOCUMENTS

| | | |
|---|---|---|
| AU | 6028796 A | 12/1996 |
| AU | 6377796 A | 12/1996 |
| AU | 6635296 A | 12/1996 |
| CN | 1171167 A | 1/1998 |
| CN | 1191500 A | 8/1998 |
| CN | 1208368 A | 2/1999 |
| EP | 0 681 186 | 11/1995 |
| EP | 0731369 A2 | 9/1996 |
| EP | 731369 | 5/1997 |
| EP | 0792462 A | 9/1997 |
| EP | 0792463 A | 9/1997 |
| EP | 0792519 A | 9/1997 |
| EP | 0795200 A | 9/1997 |
| EP | 0 802 419 A | 10/1997 |
| EP | 0828582 A | 3/1998 |
| EP | 0837750 | 4/1998 |
| EP | 0859686 | 8/1998 |
| EP | 0886894 | 12/1998 |
| EP | 0792517 | 9/1999 |
| EP | 792519 | 3/2003 |

| | | |
|---|---|---|
| EP | 792517 | 10/2003 |
| FR | 2 518 358 A | 10/1981 |
| FR | 2 518 358 A | 6/1983 |
| JP | 7301642 A | 11/1995 |
| JP | 9512139 T | 2/1997 |
| JP | 9508241 T | 8/1997 |
| JP | 9281144 A | 10/1997 |
| JP | 10506197 T | 6/1998 |
| JP | 10506238 T | 6/1998 |
| JP | 10510107 T | 9/1998 |
| JP | 2892505 B | 5/1999 |
| JP | 11126800 A | 5/1999 |
| JP | 11506829 T | 6/1999 |
| JP | 11508407 T | 7/1999 |
| JP | 2968051 B | 10/1999 |
| JP | 11514493 T | 12/1999 |
| JP | 3022312 B | 3/2000 |
| JP | 2000067953 A | 3/2000 |
| JP | 3058919 B | 7/2000 |
| JP | 2000513499 T | 10/2000 |
| KR | 252457 B | 4/2000 |
| SG | 55303 A | 12/1998 |
| WO | WO 94/25987 | 11/1994 |
| WO | WO 95/14314 | 5/1995 |
| WO | PCT/US96/08018 | 5/1996 |
| WO | WO 96/15458 | 5/1996 |
| WO | WO96/15458 | 5/1996 |
| WO | WO96/15459 | 5/1996 |
| WO | WO 96/15459 A | 5/1996 |
| WO | WO96/15551 | 5/1996 |
| WO | WO 96/15551 | 5/1996 |
| WO | WO 96/16440 | 5/1996 |
| WO | WO 96/17378 | 6/1996 |
| WO | WO 96/37331 A | 11/1996 |
| WO | WO 96/37332 | 11/1996 |
| WO | WO 96/38858 | 12/1996 |
| WO | WO 96/41506 A | 12/1996 |
| WO | WO 97/44676 | 11/1997 |
| WO | WO 98/01906 | 1/1998 |
| WO | WO 98/52224 | 11/1998 |
| WO | WO 99/14404 | 3/1999 |
| WO | WO 99/18445 | 4/1999 |
| WO | WO 01/09623 | 2/2001 |
| WO | WO 01/09952 | 2/2001 |
| WO | 01/48870 | 7/2001 |
| WO | WO 01/48818 | 7/2001 |
| WO | WO 01 48870 A2 | 7/2001 |
| WO | WO 01/98793 | 12/2001 |

OTHER PUBLICATIONS

Fundamentals of Contact Resistance, Part 1—Contact Theory; Advanced probing Systems, Inc. Technical Bulletin—May 1999.
Bergman, David; Forming Microvias; wwww.pcfab.com; vol. 24. No. 3, Mar. 2001.
Composite Beams 5.11, pp. 301-305.
Bell Labs Innovations; Lucent Technologies'Electroplating Chemicals & Services Venture Develops High-Performance Material For Connector Contacts; www.bell-labs.com/news/1998/October/23/1.html; Jan. 15, 2002.
Levy, Larry; WaferProbe System, Jun. 1997.
Cobra; Probe Cards; Array Probe Card Product; pp. 1-3, Nov. 9, 2001.
DuraProbe; DuraProbe Specifications; one page; 2001 Kulick & Soffa Industries, Inc.
Intel Develops Breakthrough Packaging Technology; Intel Labs; 2002.
Martinez, Steve TEA & John Pitts Motorola, Inc..: Wafer Level Tech & Burn In; Accomplishments Challenges.
Packard Hughes; Science Over Art, Our New IC Membrane Test Probe.
Phillips, M.A.; Stress and microstructure evolution during initial growth of Pt on amorphous substrates; J. Mater, Res., vol. 15, No. 11, Nov. 2000.
International Technology Roadmap for Semiconductors; Executive Summary; 2001 Edition.
International Technology Roadmap for Semiconductors; Assembly and Packaging; 2001 Edition.
Santer, Erich, et al.; Adhesion and Deformation on a Microscopic Scale; Federal Institute for Material Research and Testing (BAM); D-1200 Berlin, Germany.
Renard, Stephane, et al.; Expanding MEMS with low-cost SOI wafers; Sep. 23, 2002.
Kim, Bong-Hwan, et al.; A Novel MEM Silicon Probe Card; 0-7803-7158-2/02; IEEE2002.
Saha, Ranjana, et al.; Effects of the substrate on the determination of thin film mechanical properties by nanoindentation; Acta Materialia 50 (2002) 23-38.
Kataoka, Kenichi, et al.; low contact-force and compliant MEMS probe card utilizing fritting contact; 0-7803-7185-2/02; 2002 IEEE.
Bakir, Muhannad, et al.; Sol-Compliant Wafer-level Package Technologies; Semiconductor International Apr. 2002.
Schmelzer, H. Natter, Nanocrystalline nickel and nickel-copper alloys; J.Mater Res., vol. 13, No. 5, May 1998.
New Build-up HDI technique using copper bumps; Victory Circuit Co., Ltd. Sep. 2002.
Ho, M,-Y., et al. Morphology and Crystallization Kinetics in Hf02 Thin Films Grown by Atomic Layer Deposition; pp. 1-18; Jun. 1, 2002.
Ho, M.-y., et al.; Suppressed crystallization of Hf-gate dielectrics by controlled addition of Al2O3 using atomic layer deposition; pp. 4218-4220; Applied Physics Letters; American Institute of Physics 2002.
Kruger, C., et al.; Electroplated Micro-Springs for Demountable Chip Connections13th European Conf, Sep. 12-15, 1999.
Pena, David J.; et al. Electromechanical Synthesis of Multi Material . . . ; Mat. Res. Soc. Symp. vol. 636, 2001 Materials Research Society.
Myung, N.V., et al.; Electrodeposited Hard Magnetic Thin Films for MEMS . . . ; 6th Int'l Symp on Magnetic Materials, PV 2000-29; 2002.
Grosjean, Charles, et al.; A Practical Thermopneumatic Valve; Caltech EE 136-96; Pasadena, CA.
Pham, N.P., et al.; A Micromachining Post-Process Module for RF Silicon Technology; Feldmannweg 17, 2628 CT Delft; 2000 IEEE.
Strohm, K. M., et al.; Via hole technology for Microstrip Transmission . . . ; 1999 IEEE MTT-S Digest.
Ok, Seong, Joon, et al.; High Aspect Ratio, Through-Wafer Electrical . . . ; IPACK'01 proceedings; Jul. 8-13, 2001; Hawaii, USA.
Li, Xinghua, et al.; High Density Electrical Feedthrough Fabricated . . . ; 0-7803-5998-4/01 IEEE 2001.
Soh, Hyongsok T.; Ultra-Low Ressitance, Through-Wafer VIA (TWV) Technology . . . ; 1998 Int'l Conf. on Solid Sate Devices and Materials, Hiroshima, 1998, pp. 284-285.
Artisan plating.com; Characteristics of electroplated rhodium finishes.
Chow, Eugene, et al.; Electrical Through-Wafer Interconnects for Released Silicon Sensors . . . ; Ginzton Lab, Stanford, CA.
Cheng, Ching H., et. al.; An Efficient Electrical Addressign Method using Through-Wafer Vias . . . ; Ginzton Lab, Stanford, CA.
Anthony, T.R.; Diodes formed by laser drilling and diffusion; 1982 American Institute of Physics; J.Appl. Physics 53(12), Dec. 1982.
Ehrlich, Daniel J., et al.; Fabrication of Through-Wafer Via Conductors in Si by Laser . . . ; IEEE Transactions; 0148-6411/821200-0520, 1982 IEEE.
Wu, Joyce H., et al.; A High Aspect-Silicon Substrate-Via technology and Applications: Through-Wafer . . . ; 0-7803-6441-4/00; 2000 IEEE.
Anthony, T.R.; To fabricate electrical interconnections . . . ; 1981 American Institute of Physics; J.Appl. Physics 52(8), Aug. 1981.
Comtois, John H., et al.; Fabricating Micro-Instruments in Surface-Micromachined Polycrystalline Silicon; From the 43rd Intl Instrumentation Symp., 1997.

Liu, Chang; Through-Wafer Electrical Interconnects by Sidewall Photolithographic Pattering; IEEE Tech Conf.May 19-21, 1998.

Emery, R.; Novel Microelectronic Packaging Method for reduced Thermomechanica Stresses on Low Dielectric Constant Materials; Advanced Metabolism Conf; Montreal, Canada Oct. 9, 2001.

Ma, Lunyu, et al.; J-Springs-Innovative Compliant Interconnects for Next-Generation Packaging; PARC, Inc. ECTC02002.

Goldstein, Harry; Packages; Stacking different chips . . . ; IEEE Spectrum; Aug. 2001.

Cheng, C. H., et al.; Electrical Through-Wafer Interconnects with Sub-PicoFarad Parasitic Capacitance; Publication from Ginzton Labs, Stanford, CA.

Li, Xinghua, et al.; Fabrication of High-Density Electrical Feed-Throughs by Deep-Reactive-Ion Etching of Pyrex Glass; Journal of Microelectromechanical Systems, vol. 11, No. 6, Dec. 2002.

Chow, Eugene M.; Process Compatible Polysilicon-Based Electrical Through-Wafer Interconnection in Silicon Substrates; Journal of Microelectromechanical Systems, vol. 11, No. 6, Dec. 2002.

* cited by examiner

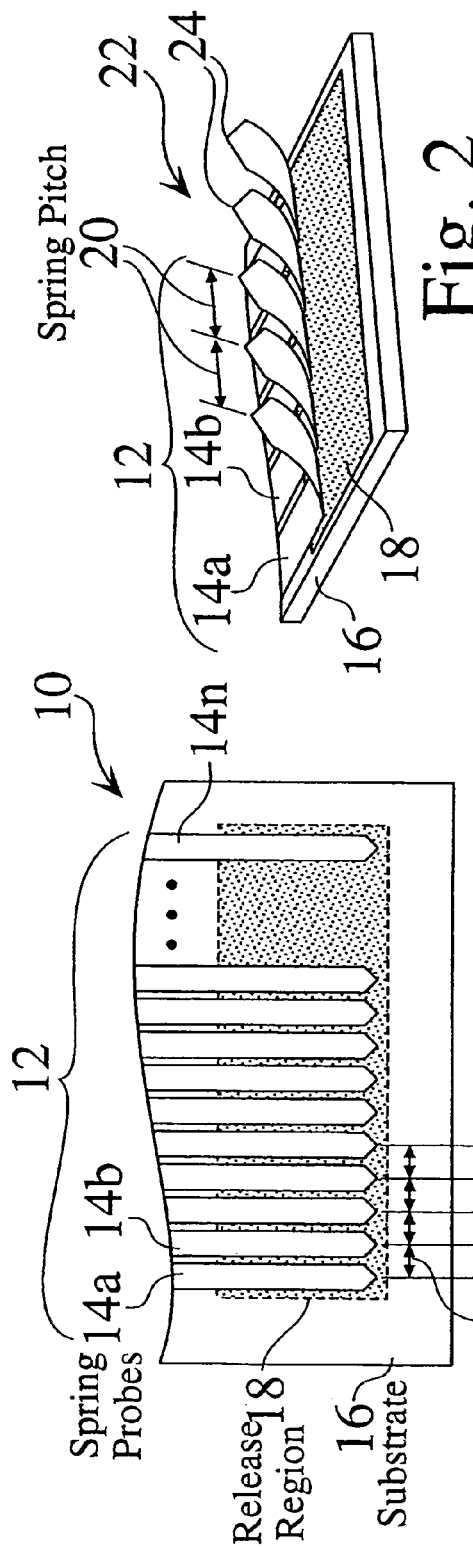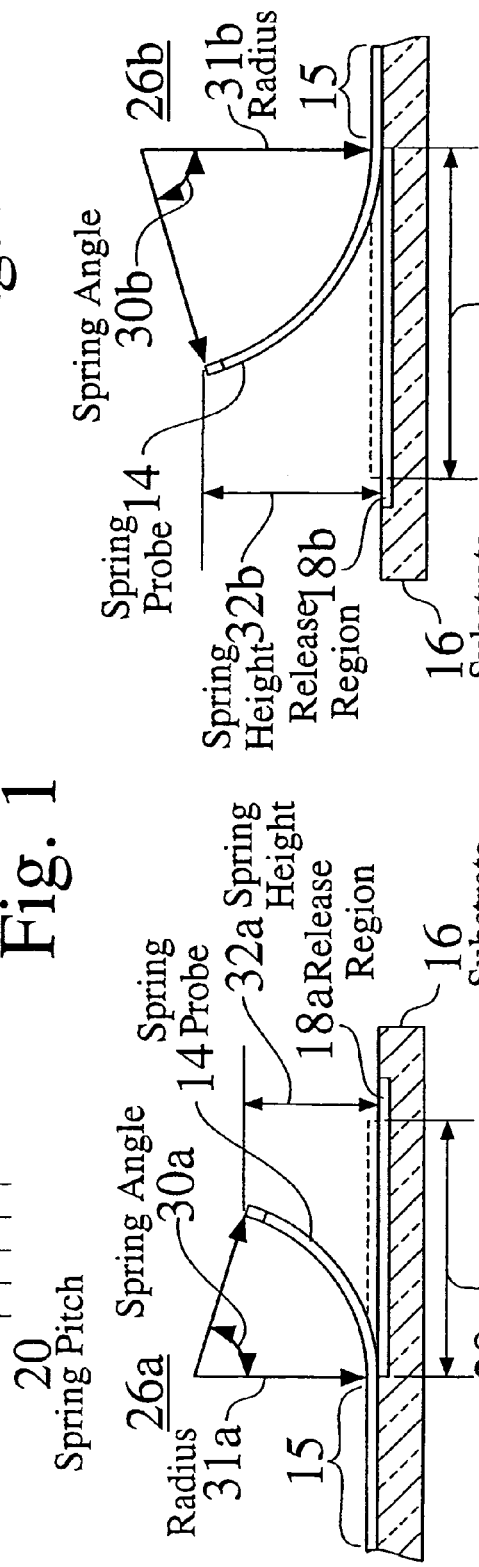

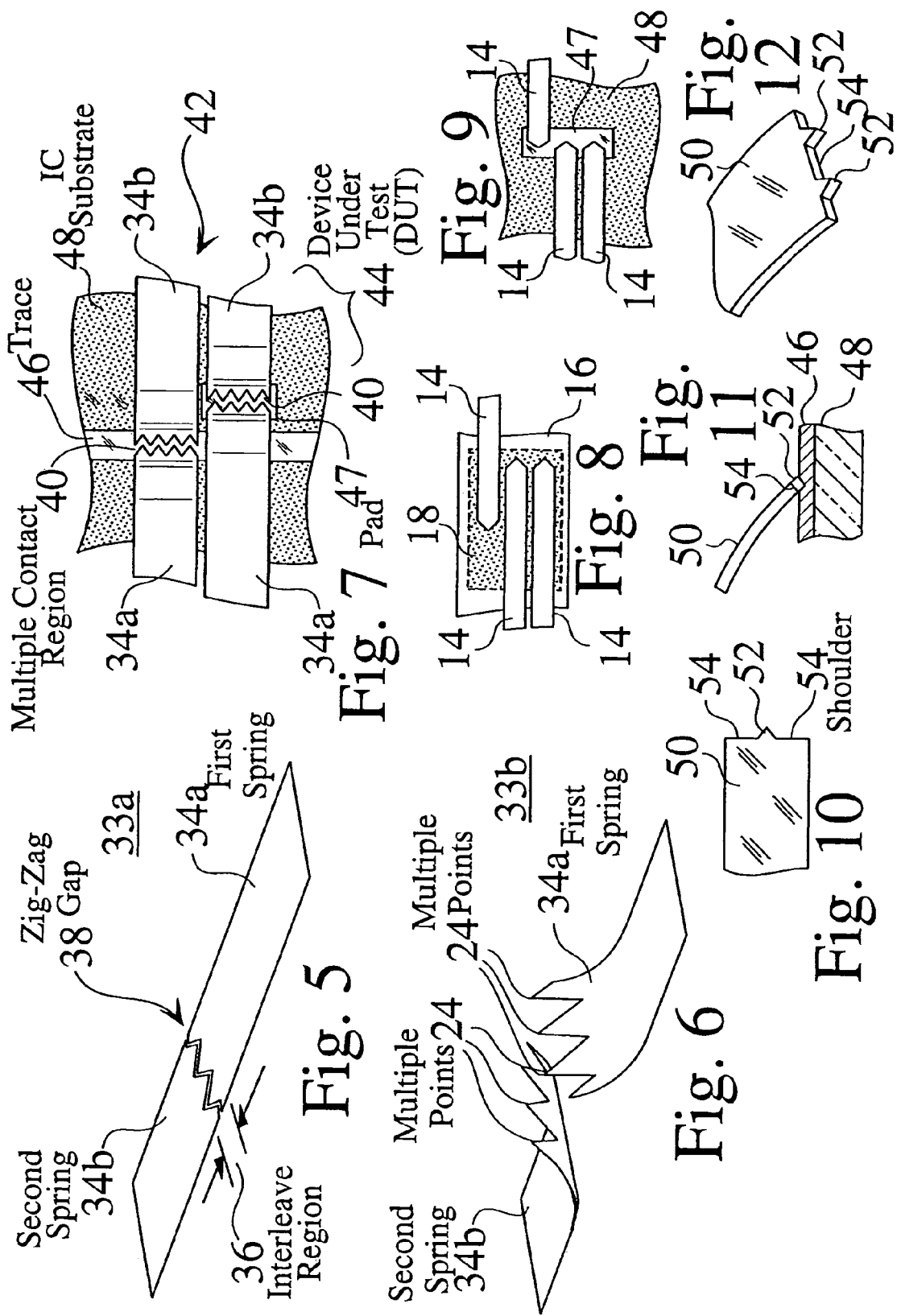

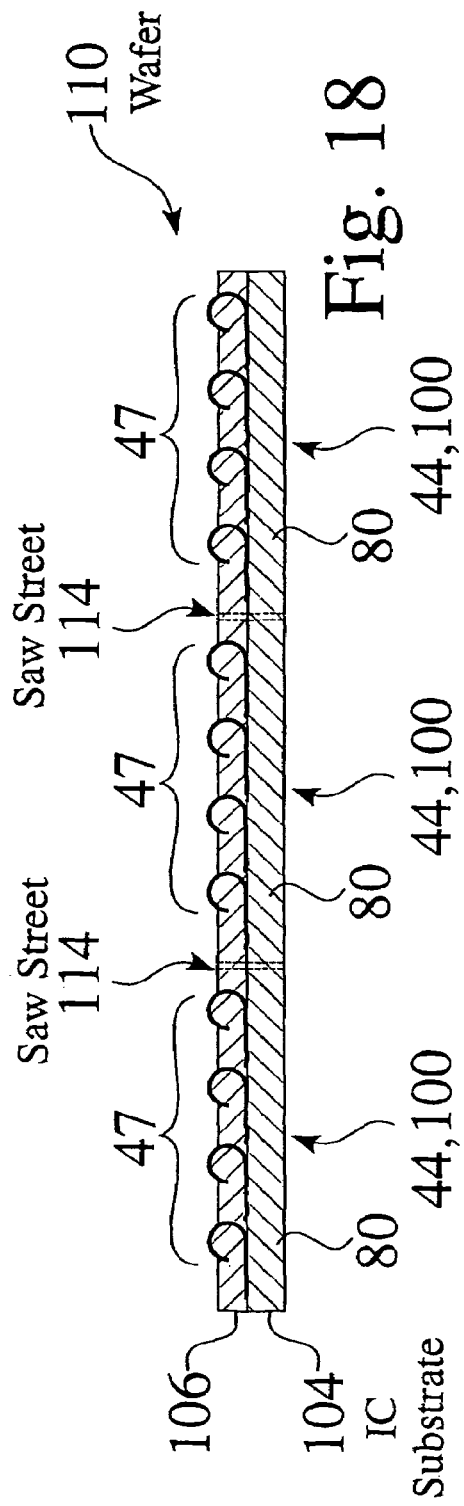
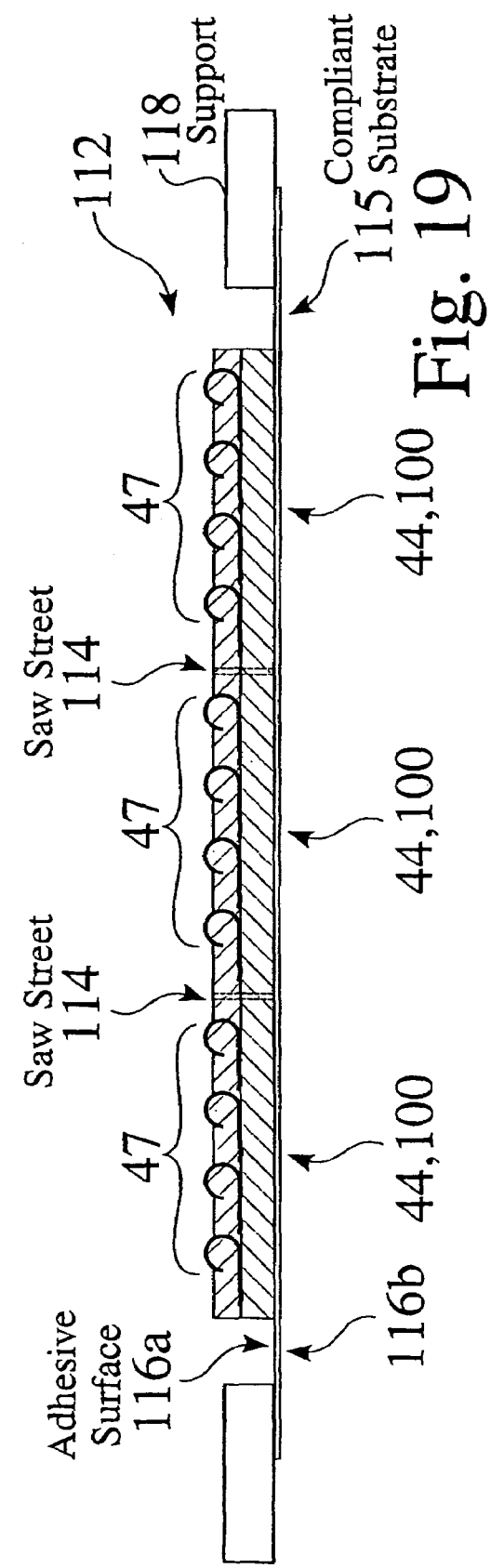

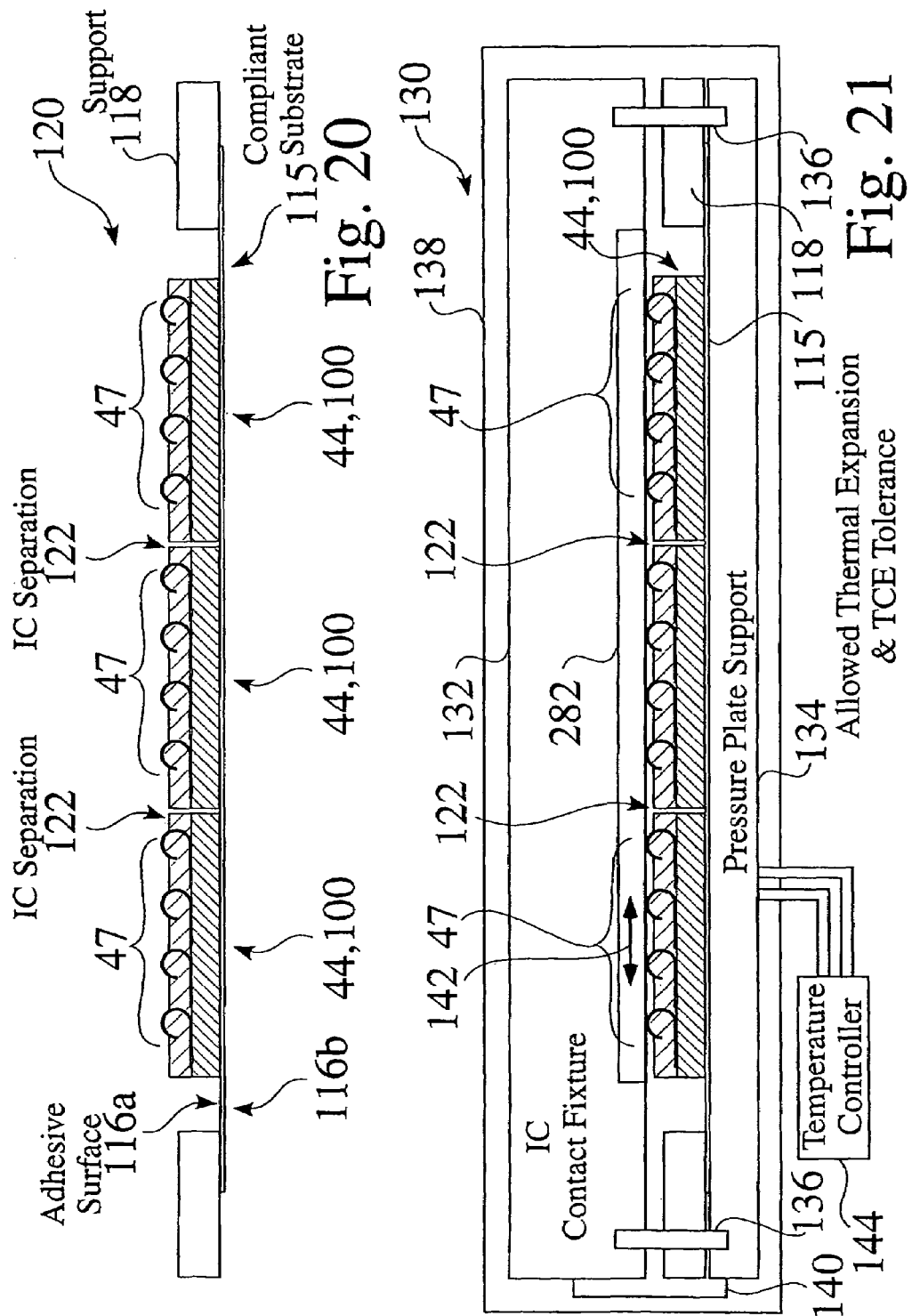

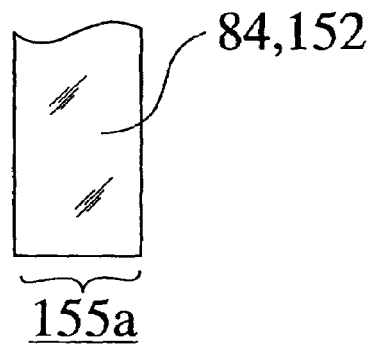
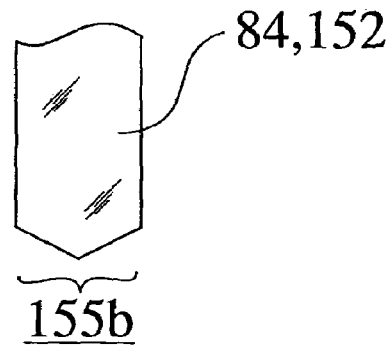
Fig. 28  Fig. 29
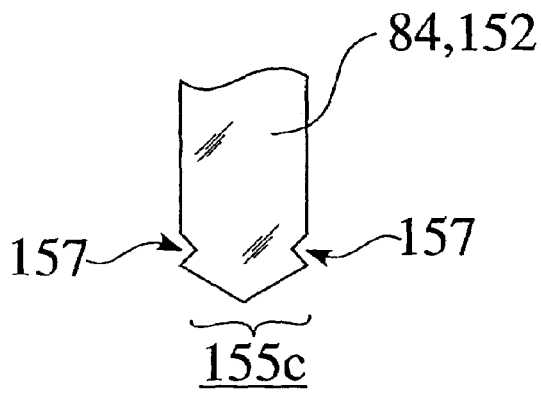
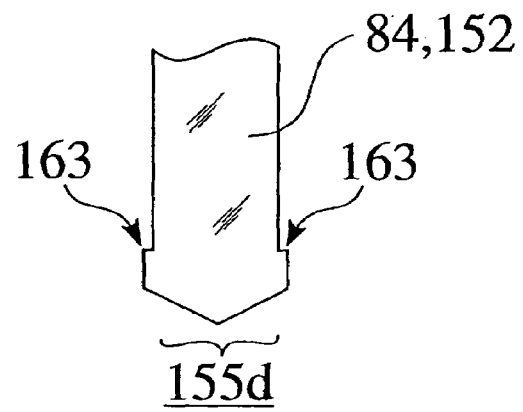
Fig. 30  Fig. 31

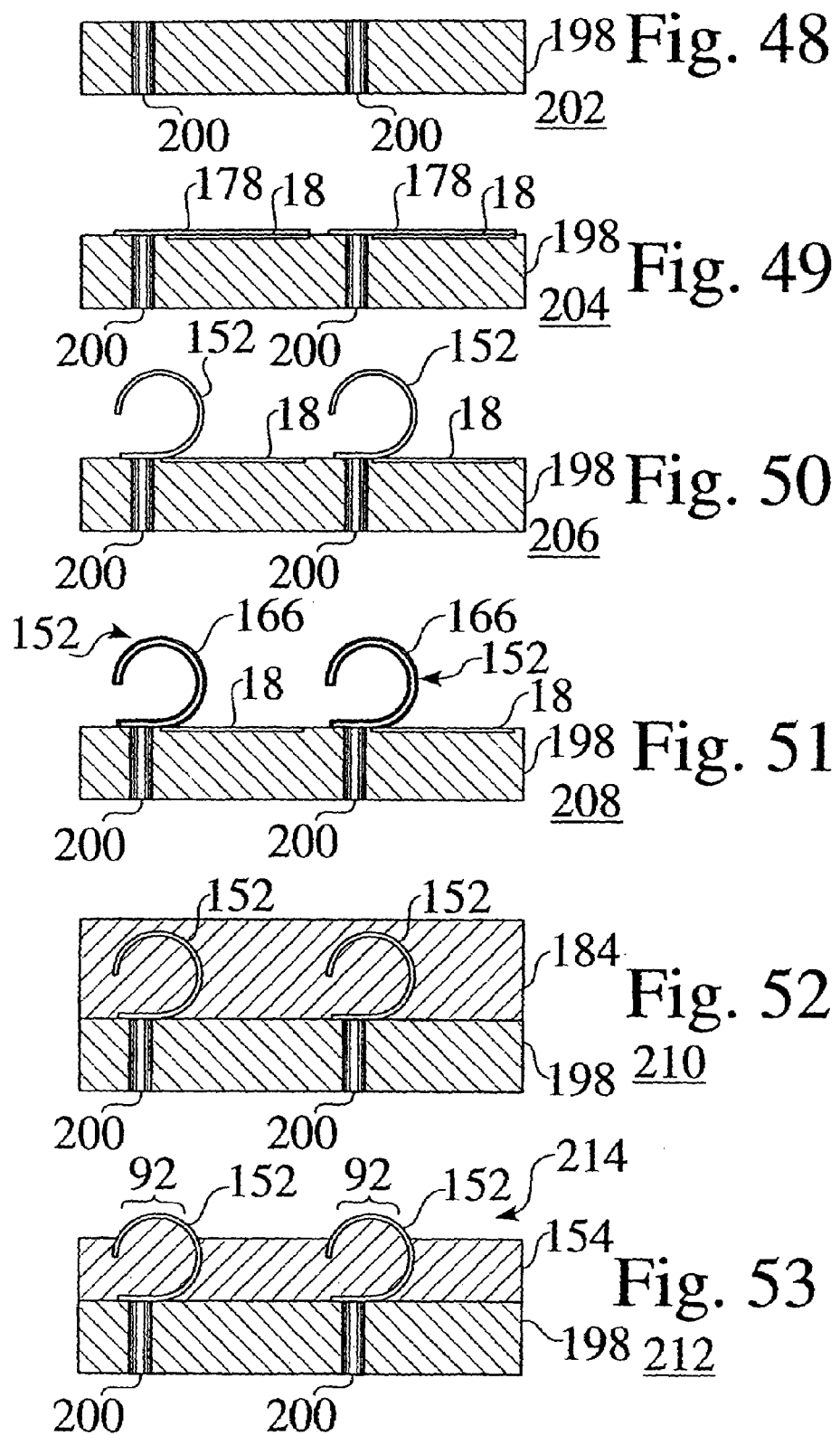

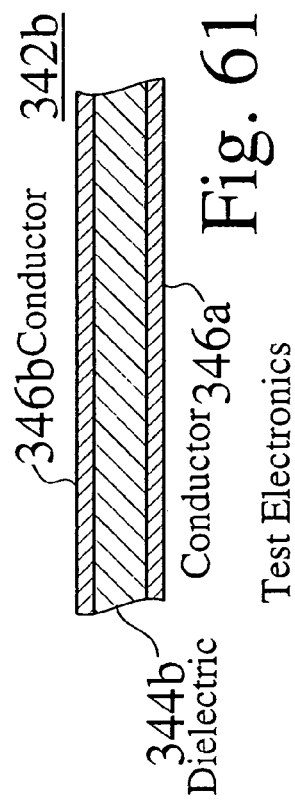
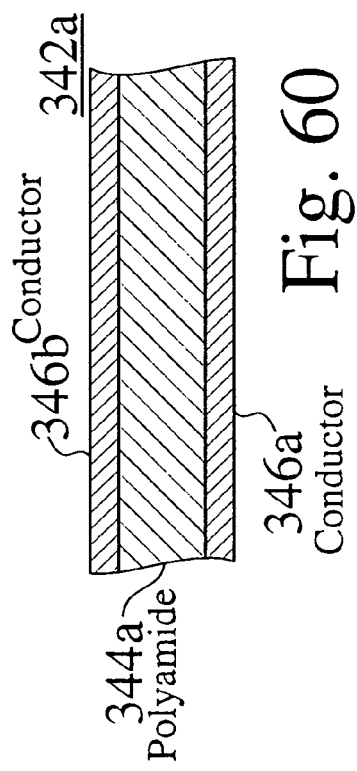
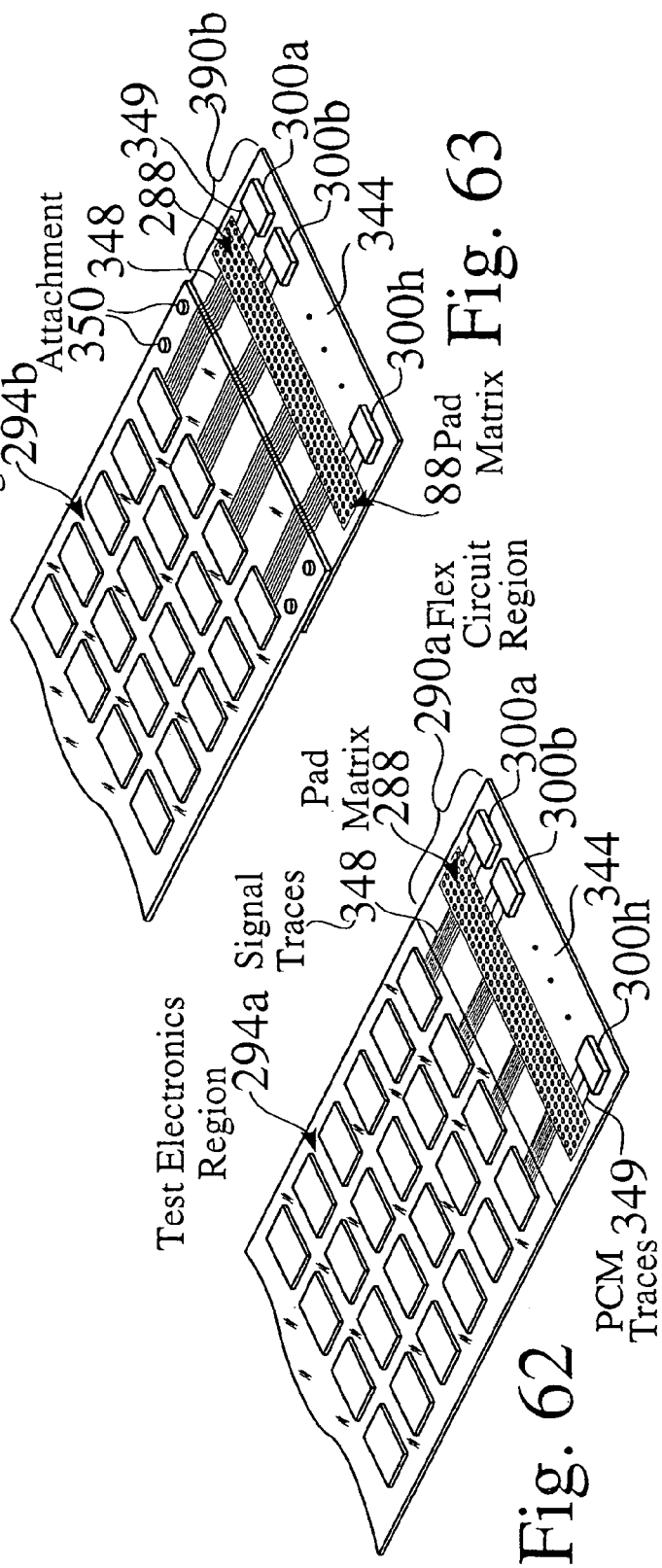

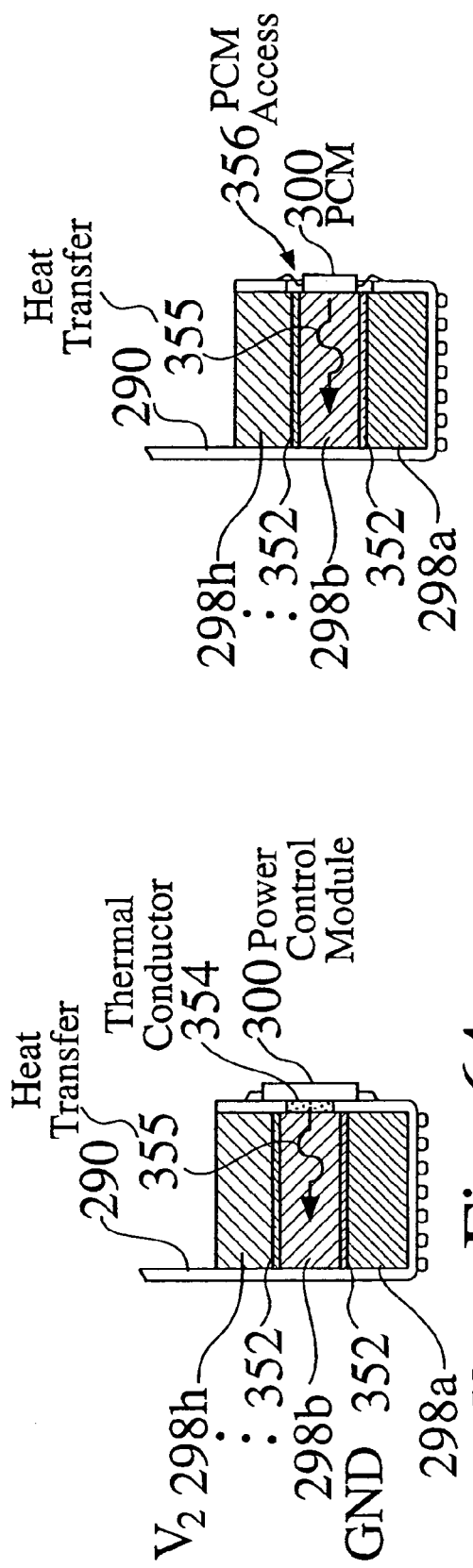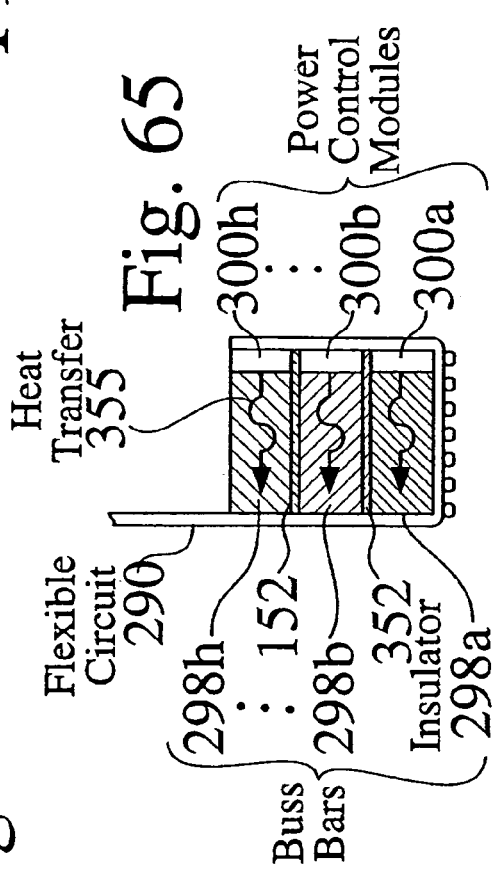

ENHANCED STRESS METAL SPRING CONTACTOR

CROSS-REFERENCE TO RELATED APPLICATIONS

This application is a Continuation-in-part of U.S. patent application Ser. No. 10/069,902, filed Jun. 28, 2002 now U.S. Pat. No. 6,791,171, which claims priority to International Patent Application No. PCT/US01/19792 filed Jun. 20, 2001, and claims priority of U.S. Provisional Patent Application Ser. No. 60/212,923 filed Jun. 20, 2000, and U.S. Provisional Patent Application Ser. No. 60/213,729 filed Jun. 22, 2000, and all of which are incorporated herein in their entirety by this reference thereto.

FIELD OF THE INVENTION

The invention relates to the field of integrated circuit (IC) package and wafer design, as well as to the fields of interconnection, testing and burn-in structures and processes. More particularly, the invention relates to improvements in photolithography-patterned spring contacts and enhanced system interconnect assemblies having photolithography-patterned spring contacts for use in the testing or burn-in of integrated circuits, and for interconnecting a large number of signals between electronic systems or subsystems.

BACKGROUND OF THE INVENTION

Integrated circuits are typically tested in wafer form (wafer sort) before they are packaged. During wafer sort, integrated circuits are tested one or few at a time, even though there may be hundreds or even thousands of the same integrated circuit located on a wafer. The packaged integrated circuits are then tested again, and burned-in, if necessary.

Prior to dicing the integrated circuits into individual dice on the wafer, the integrated circuits are placed (built) precisely on the wafer, but after dicing and separating the integrated circuits into individual dice for packaging and test, the packaged dices are handled individually, loosing the parallelism in handling.

Parallel testing on the wafer level has been limited in number and has so far been limited to low pin count devices, due to the difficulty in managing the large number of interconnects, and the limited amount of electronics which can conventionally be placed close to a wafer under test.

Attempts have also been made to burn-in ICs while in the wafer form. However, wafer-level burn-in is plagued with multiple problems, such as thermal expansion mismatch between the connector and the silicon wafer under test. Conventional structures, such as large area substrates having a large plurality of fanout traces which are electrically connected to pin or socket connectors, are typically implemented to manage connections between the IC under test, test electronics, and power management electronics.

The density of integrated circuits on semiconductor wafers continues to increase, due to semiconductor device scaling, with more gates and memory bits per unit area of silicon. As well, the use of larger semiconductor wafers (e.g. often having a nominal diameter of 8 inches or 12 inches) has become common. However, semiconductor test costs have increased on a cost per unit area of silicon basis. Therefore, semiconductor test costs have increased disproportionately over time, to become a greater percentage of the total manufacturing cost for each integrated circuit device.

Furthermore, advances in chip scale packaging (CSP) and other forms of small footprint packages have often made traditional packaged IC handlers obsolete for testing and burn-in.

In some conventional large surface area substrate integrated circuit (IC) test boards, electrical contacts between the test board and an integrated circuit wafer are typically provided by tungsten needle probes. However, tungsten needle probe technology is not able to meet the interconnect requirements of advanced semiconductors having higher pin counts, smaller pad pitches, and higher clock frequencies.

While emerging technologies have provided spring probes for different probing applications, most probes have inherent limitations, such as limited pitch, limited pin count, varying levels of flexibility, limited probe tip geometries, limitations of materials, and/or high costs of fabrication.

K. Banerji, A. Suppelsa, and W. Mullen III, Selectively Releasing Conductive Runner and Substrate Assembly Having Non-Planar Areas, U.S. Pat. No. 5,166,774 (24 Nov. 1992) disclose a runner and substrate assembly which comprises "a plurality of conductive runners adhered to a substrate, a portion of at least some of the conductive runners have non-planar areas with the substrate for selectively releasing the conductive runner from the substrate when subjected to a predetermined stress".

A. Suppelsa, W. Mullen II and G. Urbish, Selectively Releasing Conductive Runner and Substrate Assembly, U.S. Pat. No. 5,280,139 (18 Jan. 1994) disclose a runner and substrate assembly which comprises "a plurality of conductive runners adhered to a substrate, a portion of at least some of the conductive runners have a lower adhesion to the substrate for selectively releasing the conductive runner from the substrate when subjected to a predetermined stress".

D. Pedder, Bare Die Testing, U.S. Pat. No. 5,786,701 (28 Jul. 1998) disclose a testing apparatus for testing integrated circuits (ICs) at the bare die stage, which includes "a testing station at which microbumps of conductive material are located on interconnection trace terminations of a multilayer interconnection structure, these terminations being distributed in a pattern corresponding to the pattern of contact pads on the die to be tested. To facilitate testing of the die before separation from a wafer using the microbumps, the other connections provided to and from the interconnection structure have a low profile".

D. Grabbe, I. Korsunsky and R. Ringler, Surface Mount Electrical Connector, U.S. Pat. No. 5,152,695 (6 Oct. 1992) disclose a connector for electrically connecting a circuit between electronic devices, in which "the connector includes a platform with cantilevered spring arms extending obliquely outwardly therefrom. The spring arms include raised contact surfaces and in one embodiment, the geometry of the arms provide compound wipe during deflection".

H. Iwasaki, H. Matsunaga, and T. Ohkubo, Partly Replaceable Device for Testing a Multi-Contact Integrated Circuit Chip Package, U.S. Pat. No. 5,847,572 (8 Dec. 1998) disclose "a test device for testing an integrated circuit (IC) chip having side edge portions each provided with a set of lead pins. The test device comprises a socket base, contact units each including a contact support member and socket contact numbers, and anisotropic conductive sheet assemblies each including an elastic insulation sheet and conductive members. The anisotropic conductive sheet assemblies are arranged to hold each conductive member in contact with one of the socket contact members of the contact units.

The test device further comprises a contact retainer detachably mounted on the socket base to bring the socket contact members into contact with the anisotropic sheet assemblies to establish electrical communication between the socket contact members and the conductive members of the anisotropic conductive sheet assemblies. Each of the contact units can be replaced by a new contact unit if the socket contact members partly become fatigued, thereby making it possible to facilitate the maintenance of the test device. Furthermore, the lead pins of the IC chip can be electrically connected to a test circuit board with the shortest paths formed by part of the socket contact members and the conductive members of the anisotropic conductive sheet assemblies".

W. Berg, Method of Mounting a Substrate Structure to a Circuit Board, U.S. Pat. No. 4,758,9278 (19 Jul. 1988) discloses "a substrate structure having contact pads is mounted to a circuit board which has pads of conductive material exposed at one main face of the board and has registration features which are in predetermined positions relative to the contact pads of the circuit board. The substrate structure is provided with leads which are electrically connected to the contact pads of the substrate structure and project from the substrate structure in cantilever fashion. A registration element has a plate portion and also has registration features which are distributed about the plate portion and are engageable with the registration features of the circuit board, and when so engaged, maintain the registration element against movement parallel to the general plane of the circuit board. The substrate structure is attached to the plate portion of the registration element so that the leads are in predetermined position relative to the registration features of the circuit board, and in this position of the registration element the leads of the substrate structure overlie the contact pads of the circuit board. A clamp member maintains the leads in electrically conductive pressure contact with the contact pads of the circuit board".

D. Sarma, P. Palanisamy, J. Hearn and D. Schwarz, Controlled Adhesion Conductor, U.S. Pat. No. 5,121,298 (9 Jun. 1992) disclose "Compositions useful for printing controllable adhesion conductive patterns on a printed circuit board include finely divided copper powder, a screening agent and a binder. The binder is designed to provide controllable adhesion of the copper layer formed after sintering to the substrate, so that the layer can lift off the substrate in response to thermal stress. Additionally, the binder serves to promote good cohesion between the copper particles to provide good mechanical strength to the copper layer so that it can tolerate lift off without fracture".

R. Mueller, Thin-Film Electrothermal Device, U.S. Pat. No. 4,423,401 (27 Dec. 1983) discloses "A thin film multilayer technology is used to build micro miniature electromechanical switches having low resistance metal-to-metal contacts and distinct on-off characteristics. The switches, which are electrothermally activated, are fabricated on conventional hybrid circuit substrates using processes compatible with those employed to produce thin-film circuits. In a preferred form, such a switch includes a cantilever actuator member comprising a resiliently bendable strip of a hard insulating material (e.g. silicon nitride) to which a metal (e.g. nickel) heating element is bonded. The free end of the cantilever member carries a metal contact, which is moved onto (or out of) engagement with an underlying fixed contact by controlled bending of the member via electrical current applied to the heating element".

S. Ibrahim and J. Elsner, Multi-Layer Ceramic Package, U.S. Pat. No. 4,320,438 (16 Mar. 1982) disclose "In a multi-layer package, a plurality of ceramic lamina each has a conductive pattern, and there is an internal cavity of the package within which is bonded a chip or a plurality of chips interconnected to form a chip array. The chip or chip array is connected through short wire bonds at varying lamina levels to metallized conductive patterns thereon, each lamina level having a particular conductive pattern. The conductive patterns on the respective lamina layers are interconnected either by tunneled through openings filled with metallized material, or by edge formed metallizations so that the conductive patterns ultimately connect to a number of pads at the undersurface of the ceramic package mounted onto a metalized board. There is achieved a high component density; but because connecting leads are "staggered" or connected at alternating points with wholly different package levels, it is possible to maintain a 10 mil spacing and 10 mil size of the wire bond lands. As a result, there is even greater component density but without interference of wire bonds one with the other, this factor of interference being the previous limiting factor in achieving high component density networks in a multi layer ceramic package".

F. McQuade, and J. Lander, Probe Assembly for Testing Integrated Circuits, U.S. Pat. No. 5,416,429 (16 May 1995) disclose a probe assembly for testing an integrated circuit, which "includes a probe card of insulating material with a central opening, a rectangular frame with a smaller opening attached to the probe card, four separate probe wings each comprising a flexible laminated member having a conductive ground plane sheet, an adhesive dielectric film adhered to the ground plane, and probe wing traces of spring alloy copper on the dielectric film. Each probe wing has a cantilevered leaf spring portion extending into the central opening and terminates in a group of aligned individual probe fingers provided by respective terminating ends of said probe wing traces. The probe fingers have tips disposed substantially along a straight line and are spaced to correspond to the spacing of respective contact pads along the edge of an IC being tested. Four spring clamps each have a cantilevered portion which contact the leaf spring portion of a respective probe wing, so as to provide an adjustable restraint for one of the leaf spring portions. There are four separate spring clamp adjusting means for separately adjusting the pressure restraints exercised by each of the spring clamps on its respective probe wing. The separate spring clamp adjusting means comprise spring biased platforms each attached to the frame member by three screws and spring washers so that the spring clamps may be moved and oriented in any desired direction to achieve alignment of the position of the probe finger tips on each probe wing".

D. Pedder, Structure for Testing Bare Integrated Circuit Devices, European Patent Application No. EP 0 731 369 A2 (Filed 14 Feb. 1996), U.S. Pat. No. 5,764,070 (9 Jun. 1998) discloses a test probe structure for making connections to a bare IC or a wafer to be tested, which comprises "a multilayer printed circuit probe arm which carries at its tip an MCM-D type substrate having a row of microbumps on its underside to make the required connections. The probe arm is supported at a shallow angle to the surface of the device or wafer, and the MCM-D type substrate is formed with the necessary passive components to interface with the device under test. Four such probe arms may be provided, one on each side of the device under test".

B. Eldridge, G. Grube, I. Khandros, and G. Mathieu, Method of Mounting Resilient Contact Structure to Semiconductor Devices, U.S. Pat. No. 5,829,128 (3 Nov. 1998), Method of Making Temporary Connections Between Electronic Components, U.S. Pat. No. 5,832,601 (10 Nov. 1998), Method of Making Contact Tip Structures, U.S. Pat. No. 5,864,946 (2 Feb. 1999), Mounting Spring Elements on Semiconductor Devices, U.S. Pat. No. 5,884,398 (23 Mar. 1999), Method of Burning-In Semiconductor Devices, U.S. Pat. No. 5,878,486 (9 Mar. 1999), and Method of Exercising Semiconductor Devices, U.S. Pat. No. 5,897,326 (27 Apr. 1999), disclose "Resilient contact structures are mounted directly to bond pads on semiconductor dies, prior to the dies being singulated (separated) from a semiconductor wafer. This enables the semiconductor dies to be exercised (e.g. tested and/or burned-in) by connecting to the semiconductor dies with a circuit board or the like having a plurality of terminals disposed on a surface thereof. Subsequently, the semiconductor dies may be singulated from the semiconductor wafer, whereupon the same resilient contact structures can be used to effect interconnections between the semiconductor dies and other electronic components (such a wiring substrates, semiconductor packages, etc.). Using the all-metallic composite interconnection elements of the present invention as the resilient contact structures, burn-in can be performed at temperatures of at least 150° C., and can be completed in less than 60 minutes". While the contact tip structures disclosed by B. Eldridge et al. provide resilient contact structures, the structures are each individually mounted onto bond pads on semiconductor dies, requiring complex and costly fabrication. As well, the contact tip structures are fabricated from wire, which often limits the resulting geometry for the tips of the contacts. Furthermore, such contact tip structures have not been able to meet the needs of small pitch applications (e.g. typically on the order of 50 µm spacing for a peripheral probe card, or on the order of 75 µm spacing for an area array).

T. Dozier II, B. Eldridge, G. Grube, I. Khandros, and G. Mathieu, Sockets for Electronic Components and Methods of Connecting to Electronic Components, U.S. Pat. No. 5,772,451 (30 Jun. 1998) disclose "Surface-mount, solder-down sockets permit electronic components such as semiconductor packages to be releaseably mounted to a circuit board. Resilient contact structures extend from a top surface of a support substrate, and solder-ball (or other suitable) contact structures are disposed on a bottom surface of the support substrate. Composite interconnection elements are used as the resilient contact structures disposed atop the support substrate. In any suitable manner, selected ones of the resilient contact structures atop the support substrate are connected, via the support substrate, to corresponding ones of the contact structures on the bottom surface of the support substrate. In an embodiment intended to receive an LGA-type semiconductor package, pressure contact is made between the resilient contact structures and external connection points of the semiconductor package with a contact force which is generally normal to the top surface of the support substrate. In an embodiment intended to receive a BGA-type semiconductor package, pressure contact is made between the resilient contact structures and external connection points of the semiconductor package with a contact force which is generally parallel to the top surface of the support substrate".

Other emerging technologies have disclosed probe tips on springs which are fabricated in batch mode processes, such as by thin-film or micro-electronic mechanical system (MEMS) processes.

D. Smith and S. Alimonda, Photolithographically Patterned Spring Contact, U.S. Pat. No. 5,613,861 (25 Mar. 1997), U.S. Pat. No. 5,848,685 (15 Dec. 1998), and International Patent Application No. PCT/US 96/08018 (Filed 30 May 1996), disclose a photolithography patterned spring contact, which is "formed on a substrate and electrically connects contact pads on two devices. The spring contact also compensates for thermal and mechanical variations and other environmental factors. An inherent stress gradient in the spring contact causes a free portion of the spring to bend up and away from the substrate. An anchor portion remains fixed to the substrate and is electrically connected to a first contact pad on the substrate. The spring contact is made of an elastic material and the free portion compliantly contacts a second contact pad, thereby contacting the two contact pads". While the photolithography patterned springs, as disclosed by Smith et al., are capable of satisfying many IC probing needs, the springs are small, and provide little vertical compliance to handle the planarity compliance needed in the reliable operation of many current IC prober systems. Vertical compliance for many probing systems is typically on the order of 0.004"–0.010", which often requires the use of tungsten needle probes.

While interposers have been used as an interconnecting structure, conventional interposers have been limited by pitch density, as well as by long term reliability over elevated temperatures, such as commonly seen in test or burn-in environments.

While probe substrates have been used as an interconnecting structure, such as for probing solder bumped wafers, the conventional probe substrates are often expensive, and/or require long lead times. Vertical probes, such as the Cobra Probe™, are currently available from International Business Machines, of San Jose, Calif. A Microspring™ probe assembly is currently available from Form Factor, Inc., of Livermore Calif.

T. Distefano, J. Smith and A. Faraci, Fixtures and Methods for Lead Bonding and Deformation, U.S. Pat. No. 6,080,603 (27 Jun. 2000), disclose "In a method for mounting a sheet-like microelectronic element, the sheet-like element comprises a dielectric layer having a top surface and a bottom surface and is first bonded to an expansion ring. The expansion ring is then heated to stretch the sheet-like element. A frame ring, having an external diameter smaller than the internal diameter of the expansion ring, is then bonded to the sheet-like element. A plurality of leads are formed on the bottom surface of the sheet-like element, the leads including bonding pads. In other embodiments, a method is provided for bonding bond pads on a sheet-like microelectronic element to contacts on a microelectronic component."

T. Distefano and J. Smith, Methods of Making Connections to a Microelectronic Unit, U.S. Pat. No. 6,044,548 (4 Apr. 2000) disclose "A method of making connections to a microelectronic unit includes the steps of providing a connection component having a flexible dielectric top sheet, a plurality of terminals on the top sheet and a plurality of electrically conductive, elongated flexible leads connected to the terminals and extending side-by-side downwardly from the terminals away from the top sheet to bottom ends remote from the top sheet. The connection component is then engaged with a front surface of a microelectronic unit having an array of contacts thereon while subjecting the connection component and the microelectronic unit to heat and pressure so that bottom ends of the leads remote from the top sheet bond with the contacts on the microelectronic unit to form electrical connections therewith."

M. Beroz, B. Haba and C. Pickett, Lead Formation Using Grids, U.S. Pat. No. 6,063,648 (16 May 2000) disclose "A component for making microelectronic units includes a grid of interspersed leads with ends of the various leads being connected to one another by frangible elements. One end of each lead is bonded to a top element and the other end of each lead is bonded to a bottom element. The top and bottom elements are moved away from one another, thereby breaking the frangible elements and deforming the leads towards a vertically extensive disposition. A flowable composition such as dielectric material may be injected around the leads during or after the moving step. The resulting unit may be used to form permanent or temporary connections between microelectronic elements."

K. Gilleo, G. Grube and G. Mathieu, Compliant Semiconductor Chip Assemblies and Methods of Making Same, U.S. Pat. No. 6,020,220 (1 Feb. 2000) disclose "A semiconductor chip package assembly is mounted to contact pads on a die. A compliant interposer layer is disposed between the die and a dielectric substrate wiring layer. The contacts on the die are connected to terminals on the compliant interposer layer by means of a compliant, conductive polymer extending through apertures in the interposer layer. Compliancy in the interposer layer and in the conductive polymer permits relative movement of the terminals on the dielectric substrate wiring layer to the contacts on the die and hence relieves the shear forces caused by differential thermal expansion. The arrangement provides a compact packaged structure similar to that achieved through flip-chip bonding, but with markedly increased resistance to thermal cycling damage. Further, the packaged structure allows the standardization of the packages such that several companies can make competing chips that are packaged such that the resultant packaged structures are roughly the same as far as the end user is concerned."

T. DiStefano, Z. Kovac and J. Smith, Bondable Compliant Pads for Packaging of a Semiconductor Chip and Method Therefor, U.S. Pat. No. 6,030,856 (29 Feb. 2000) disclose "A method of making a microelectronic package includes providing first and second microelectronic elements having electrically conductive parts and disposing a resilient element having one or more intermediary layers capable of being wetted by an adhesive between the microelectronic elements. The resilient element includes fibrous material, a fibrous matrix and/or voids formed at the intermediary layers thereof. An adhesive is provided between the intermediary layers and the microelectronic elements. The adhesive is then cured while it remains in contact with the intermediary layers for bonding the resilient element and the microelectronic elements. The electrically conductive parts are then bonded together to form electrical interconnections. A microelectronic package comprising a resilient element including one or more intermediary layers capable of being wetted by an adhesive is also provided."

P. Bellaar, T. DiStefano, J. Fjelstad, C. Pickett and J. Smith, Microelectronic Component with Rigid Interposer, U.S. Pat. No. 6,002,168 (14 Dec. 1999) disclose "A microelectronic component for mounting a rigid substrate, such as a hybrid circuit to a rigid support substrate, such as a printed circuit board. The microelectronic component includes a rigid interposer which may have a chip mounted on its first surface; a pattern of contacts on the rigid interposer; a flexible interposer overlying the second surface of the rigid interposer; a pattern of terminals on the flexible interposer; flexible leads; and solder coated copper balls mounted on the flexible interposer. The microelectronic component may have a socket assembly mounted on the first surface of the rigid interposer. The microelectronic component may be mounted on a rigid support substrate."

B. Eldridge, G. Grube, I. Khandros and G. Mathieu, Method of Making Contact Tip Structures, U.S. Pat. No. 5,864,946 (2 Feb. 1999) disclose "Resilient contact structures are mounted directly to bond pads on semiconductor dies, prior to the dies being singulated (separated) from a semiconductor wafer. This enables the semiconductor dies to be exercised (e.g., tested and/or burned-in) by connecting to the semiconductor dies with a circuit board or the like having a plurality of terminals disposed on a surface thereof. Subsequently, the semiconductor dies may be singulated from the semiconductor wafer, whereupon the same resilient contact structures can be used to effect interconnections between the semiconductor dies and other electronic components (such as wiring substrates, semiconductor packages, etc.). Using the all-metallic composite interconnection elements of the present invention as the resilient contact structures, burn-in can be performed at temperatures of at least 150° C., and can be completed in less than 60 minutes."

B. Eldridge, G. Grube, I. Khandros and G. Mathieu, Wafer-Level Test and Burn-In, and Semiconductor Process, U.S. Pat. No. 6,032,356, disclose "Resilient contact structures are mounted directly to bond pads on semiconductor dies, prior to the dies being singulated (separated) from a semiconductor wafer. This enables the semiconductor dies to be exercised (e.g., tested and/or burned-in) in) by connecting to the semiconductor dies with a circuit board or the like having a plurality of terminals disposed on a surface thereof. Subsequently, the semiconductor dies may be singulated from the semiconductor wafer, whereupon the same resilient contact structures can be used to effect interconnections between the semiconductor dies and other electronic components (such as wiring substrates, semiconductor packages, etc.). Using the all-metallic composite interconnection elements of the present invention as the resilient contact structures, burn-in can be performed at temperatures of at least 150° C., and can be completed in less than 60 minutes."

D. Hembree, W. Farnworth and J. Wark, Force Applying Probe Card and Test System for Semiconductor Wafers, U.S. Pat. No. 6,078,186 (20 Jun. 2000) disclose "A probe card for testing a semiconductor wafer, a test method, and a test system employing the probe card are provided. The probe card includes: a substrate; an interconnect slidably mounted to the substrate; and a force applying mechanism for biasing contacts on the interconnect into electrical engagement with contacts on the wafer. The force applying mechanism includes spring loaded electrical connectors that provide electrical paths to the interconnect, and generate a biasing force. The biasing force is controlled by selecting a spring constant of the electrical connectors, and an amount of Z-direction overdrive between the probe card and wafer. The probe card also includes a leveling mechanism for leveling the interconnect with respect to the wafer."

It would be advantageous to provide a chip scale package structure which comprises compliant electrical interconnections which can be built directly on the integrated circuit wafer without additional packaging steps, and is compatible with current IC processing lines. It would also be advantageous to provide an interposer structure having compliant high density electrical interconnections which can be manufactured using batch processes. Furthermore, it would be advantageous to provide a probe contactor structure having compliant high density electrical interconnections at lower force than conventional interposer techniques, which can be manufactured using batch processes.

The round trip transit time between a device under test and conventional test equipment is often longer then the stimulus to response times of high speed electronic circuits. It would be advantageous to provide a test interface system which reduces this transit time, by placing high speed test electronics in close proximity of the device under test, while meeting space and cost constraints. Furthermore, it would be advantageous to provide a test interface system which minimizes the cost, complexity, tooling, and turn around time required to change the test structure for the testing of different devices. The development of such a system would constitute a major technological advance.

It would be advantageous to provide a test interface system which provides probe contact with many, hundreds, or even hundreds of thousands of pads for one or more separated devices which are mounted on a compliant wafer carrier, such as for massively parallel testing and/or burn-in applications, wherein the pads may be in close proximity of one another, with a minimum spacing approaching 1 mil or less, while providing a uniform force and minimizing pad damage over the entire wafer. It would also be advantageous to provide such a test interface system which organizes and manages the interconnections between the devices under test and the tester electronics, while maintaining signal integrity and power and ground stability, and assures that no two or more adjacent pads are contacted by a single test probe tip. Furthermore, it would be advantageous to provide such a test structure which preferably provides planarity compliance with the devices under test. The development of such a system would constitute a further technological advance.

In addition, it would be advantageous to provide such a test system which preferably provides continuous contact with many, hundreds, or even hundreds of thousands of pads for one or more devices on a compliant wafer carrier over a wide temperature range, while providing thermal isolation between the test electronics and the devices under test. As well, it would be advantageous to provide a system for separate thermal control of the test system and of the devices under test.

It would also be advantageous to provide a test interface system which may be used to detect power to ground shorts in any die quickly, and to isolate power from a die having a detected power to ground short, before damage is done to the test electronics. In addition, it would be advantageous to provide a test interface structure which can detect that the contacts to many, hundreds, or even hundreds of thousands of pads are reliably made and are each of the contacts are within the contact resistance specification, to assure that the self inductance and self capacitance of each signal line are below values that would adversely affect test signal integrity, and to assure that the mutual inductance and mutual capacitance between pairs of signal lines and between signal lines and power or ground lines are below values that would adversely affect test signal integrity. As well, it would also be advantageous to provide a test interface structure which provides stimulus and response detection and analysis to many, hundreds, or even thousands of die under test in parallel, and which preferably provides diagnostic tests to a failed die, in parallel with the continued testing of all other die.

Furthermore, it would be advantageous to provide a large array interface system which can reliably and repeatedly establish contact to many, hundreds, or even hundreds of thousands of pads, without the need to periodically stop and inspect and/or clean the probe interface structure.

It would also be advantageous to provide a system for massively parallel interconnections between electrical components, such as between computer systems, which utilize spring probes within the interconnection structure, to provide high pin counts, small pitches, cost-effective fabrication, and customizable spring tips. The development of such a method and apparatus would constitute a major technological advance.

SUMMARY OF THE INVENTION

Several embodiments of stress metal springs are disclosed, which typically comprise a plurality of stress metal layers that are established on a substrate, which are then controllably patterned and partially released from the substrate. An effective rotation angle is typically created in the formed stress metal springs, defining a looped spring structure. The formed springs provide high pitch compliant electrical contacts for a wide variety of interconnection structures, including chip scale semiconductor packages, high density interposer connectors, and probe contactors. Several embodiments of massively parallel interface integrated circuit test assemblies are also disclosed, comprising one or more substrates having stress metal spring contacts, to establish connections between one or more separated integrated circuits on a compliant wafer carrier, and use one or more test modules which are electrically connected to the integrated circuits on the compliant wafer carrier through the substrates. The massively parallel interface assemblies provide tight pad pitch and compliance, and preferably enable the parallel testing or burn-in of multiple ICs. In some preferred embodiments, the massively parallel interface assembly structures include separable standard electrical connector components, which reduces assembly manufacturing cost and manufacturing time. These massively parallel interface structures and assemblies enable high speed testing of separated integrated circuit devices affixed to a compliant carrier, and allow test electronics to be located in close proximity to the integrated circuit devices under test. Preferred embodiments of the massively parallel interface assemblies provide thermal expansion matching to the wafer under test, and provide a thermal path for system electronics. Alternate massively parallel interface structures provide massively parallel connection interfaces, which may be used in a wide variety of circuitry, such as for interconnecting computers in a network, or for interconnecting other electronic circuitry.

BRIEF DESCRIPTION OF THE DRAWINGS

FIG. 1 is a plan view of a linear array of photolithographically patterned springs, prior to release from a substrate;

FIG. 2 is a perspective view of a linear array of photolithographically patterned springs, after release from a substrate;

FIG. 3 is a side view of a first, short length photolithographically patterned spring, having a first effective radius and height after the short length spring is released from a substrate;

FIG. 4 is a side view of a second, long length photolithographically patterned spring, having a second large effective radius and height after the long length spring is released from a substrate;

FIG. 5 is a perspective view of opposing photolithographic springs, having an interleaved spring tip pattern, before the springs are released from a substrate;

FIG. 6 is a perspective view of opposing photolithographic springs, having an interleaved spring tip pattern, after the springs are released from a substrate;

FIG. 7 is a top view of a first opposing pair of interleaved multiple-point photolithographic spring probes, in contact with a single trace on an integrated circuit device, and a second opposing pair of interleaved multiple-point photolithographic spring probes, in contact with a single pad on the integrated circuit device;

FIG. 8 is a plan view of opposing single-point photolithographic spring probes, before the springs are released from a substrate;

FIG. 9 is a top view of parallel and opposing single-point photolithographic spring probes, after the springs are released from a substrate, in contact with a single pad on an integrated circuit device;

FIG. 10 is a front view of a shoulder-point photolithographic spring probe;

FIG. 11 is a partial cross-sectional side view of a shoulder-point photolithographic spring in contact with a trace on an integrated circuit device;

FIG. 12 is a perspective view of a multiple shoulder-point photolithographic spring probe;

FIG. 18 is a side view of integrated circuit devices on a semiconductor wafer;

FIG. 19 is a side view of a semiconductor wafer having integrated circuit devices, which is mounted to a compliant wafer carrier substrate;

FIG. 20 is a side view which shows the separation between integrated circuits for a semiconductor wafer which is mounted to a compliant wafer carrier substrate;

FIG. 21 is a side view showing separated integrated circuits on a compliant wafer carrier substrate which is mounted to a test fixture;

FIG. 28 is a partial view of a square leading end of a looped stress metal spring; FIG. 29 is a partial view of a pointed leading end of a looped stress metal spring;

FIG. 30 is a partial view of a pointed leading end of a looped stress metal spring, which further comprises retaining grooves;

FIG. 31 is a partial view of a pointed leading end of a looped stress metal spring, which further comprises retaining ledges;

FIG. 48 is a view of a first step of a stress metal spring contactor construction process, in which a contactor substrate having vias is provided;

FIG. 49 is a view of a second step of a stress metal spring contactor construction process, in which in which one or more stress metal spring layers are established on the contactor substrate;

FIG. 50 is a view of a third step of a stress metal spring contactor construction process, in which in which non-planar portions of the stress metal springs extending from the contactor substrate are controllably formed;

FIG. 51 is a view of a preferred fourth step of a stress metal spring contactor construction process, in which the formed non-planar portions of the stress metal springs extending from the contactor substrate are controllably plated;

FIG. 52 is a view of a fifth step of a stress metal spring contactor construction process, in which a secondary substrate is established over the formed non-planar portions of the stress metal springs extending from the contactor substrate;

FIG. 53 is a view of a sixth step of a stress metal spring contactor construction process, in which an outer portion of the applied secondary substrate is removed to access upper contact portions of the stress metal springs;

FIG. 60 is a partial cross-sectional view of one embodiment of the flexible circuit structure;

FIG. 61 is a partial cross-sectional view of an alternate embodiment of the flexible circuit, which comprises a flex circuit membrane structure;

FIG. 62 is a partial perspective view of a flexible membrane circuit structure, wherein a flexible region is defined as an extension of the electronic test card structure;

FIG. 63 is a partial perspective view of an alternate flexible circuit structure, wherein a flexible circuit is attached to an electronic test card structure;

FIG. 64 is a partial cross-sectional view of one embodiment of a preferred flex circuit region of a test electronics module, in which the flex circuit is wrapped around the power and ground buss structure, and which preferably includes a thermal path across the flex circuit between a power module and a buss bar;

FIG. 65 is a partial cross-sectional view of an alternate embodiment of the flex circuit region of a test electronics module, in which a plurality of power modules mounted on the inner surface of a flex circuit are positioned in thermal contact with a plurality of buss bars;

FIG. 66 is a partial cross-sectional view of a second alternate embodiment of the flex circuit region of a test electronics module, in which a power module is electrically connected to the outer surface of a flex circuit, and is positioned in thermal contact with a buss bar;

DETAILED DESCRIPTION OF PREFERRED EMBODIMENTS

Figure 13:
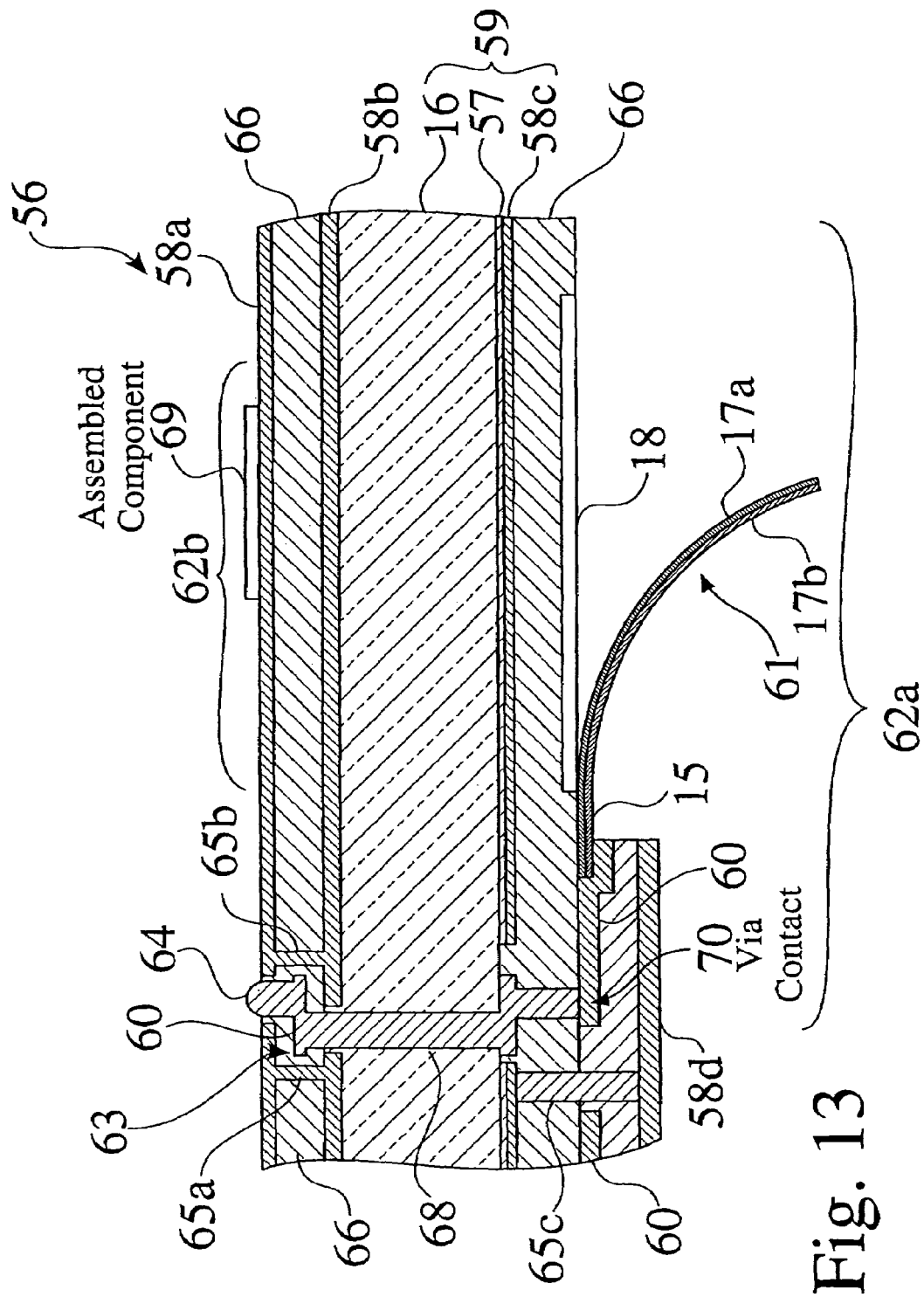
FIG. 13 is a partial cross-sectional view of a multi-layered spring probe substrate providing controlled impedance and integrated components.

FIG. 1 is a plan view 10 of a linear array 12 of photolithographically patterned springs 14a–14n, prior to release from a substrate 16. The conductive springs 14a 14n are typically formed on the substrate layer 16, by successive layers of deposited metal 17, e.g. such as layers 17a, 17b in FIG. 13, typically through low and high energy plasma and sputter deposition processes, followed by photolithographic patterning, as is widely known in the semiconductor industry. The successive layers 17 have different inherent levels of stress. The release regions 18 of the substrate 16 are then processed by undercut etching, whereby portions of the spring contacts 14a–14n, which are located over the release regions 18, are released from the substrate 16 and extend, i.e. bend, away from the substrate 16, as a result of the inherent stresses between the deposited metallic layers. Fixed regions 15 (FIG. 3, FIG. 4) of the deposited metal traces remain affixed to the substrate 16, and are typically used for routing (i.e. such as for redistribution or fan out) from the spring contacts 14a–14n. FIG. 2 is a perspective view 22 of a linear array 12 of photolithographically patterned springs 14a–14n, after release from a substrate 16. The spring contacts 14a–14n may be formed in high density arrays, with a fine pitch 20, currently on the order of 0.001 inch.

FIG. 3 is a side view 26a of a first photolithographically patterned spring 14 having a short length 28a, which is formed to define a first effective spring angle 30a (which can be from a few degrees to a full circle), spring radius 31a, and spring height 32a, after the patterned spring 14 is released from the release region 18a of the substrate 16, away from the planar anchor region 15. FIG. 4 is a side view 26b of a second photolithographically patterned spring 14, having a long spring length 28b, which is formed to define a second large effective spring angle 30b, spring radius 31b and spring height 32b, after the patterned spring 14 is released from the release region 18b of the substrate 16. The effective geometry of the formed spring tips 14 is highly customizable, based upon the intended application. As well, the spring tips are typically flexible, which allows them to be used for many applications.

Figure 58:
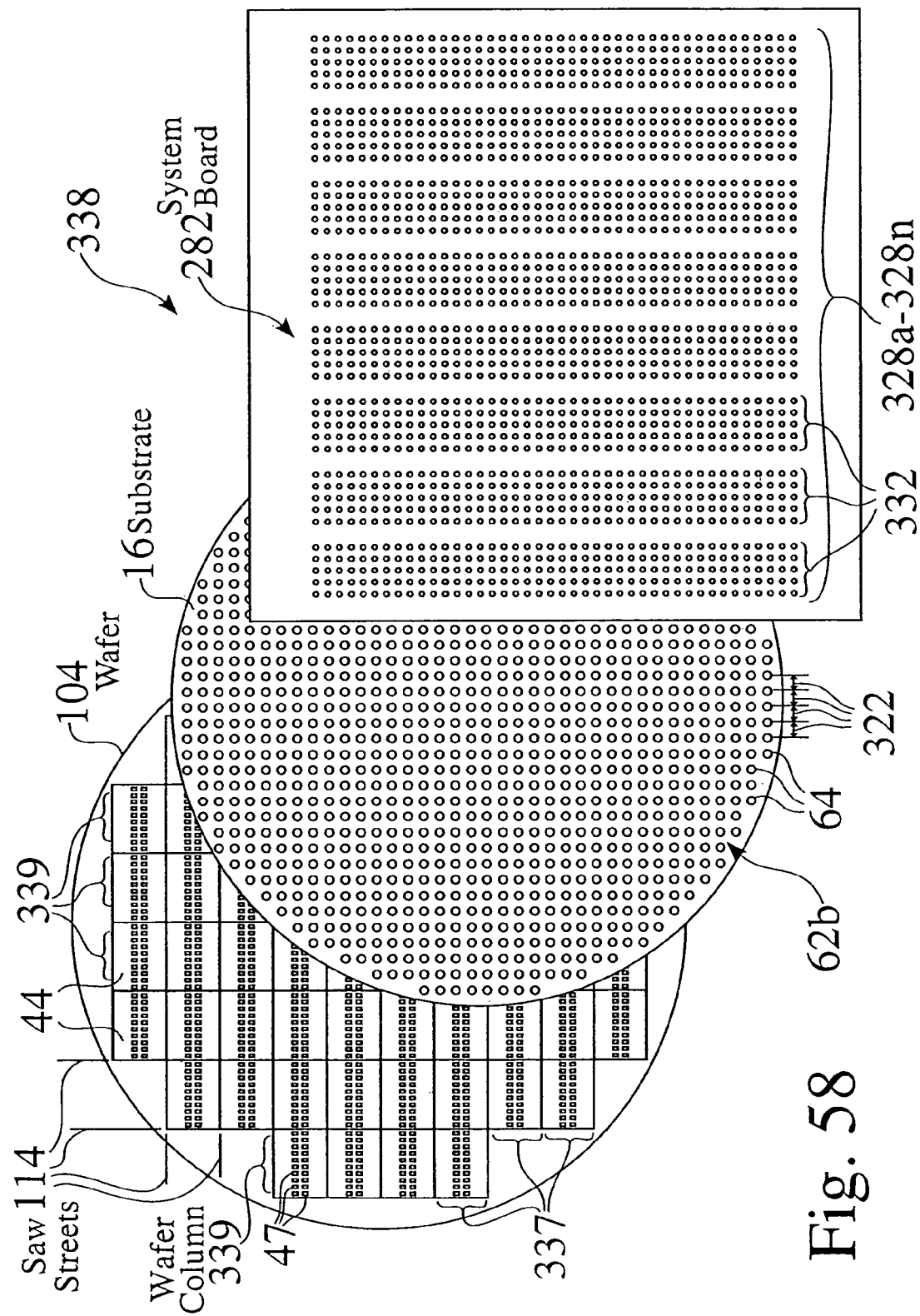
FIG. 58 is an expanded layer plan view of integrated circuit devices on a wafer, a circular substrate, and a system board.
Figure 59:
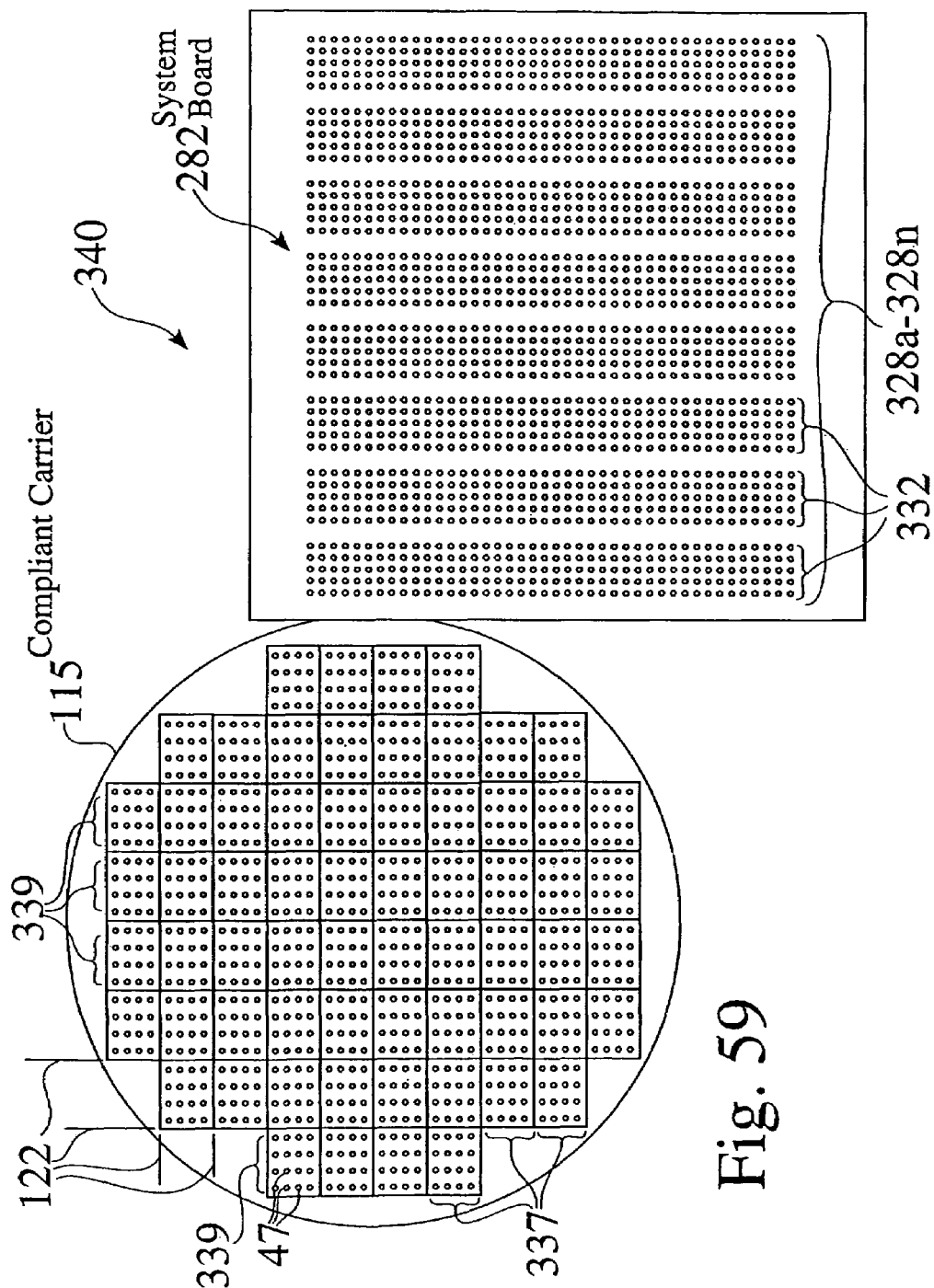
FIG. 59 is an expanded layer plan view of carrier-mounted integrated circuit devices which are directly connectable to a system board.

Patterned spring probes 14 are capable of very small spring to spring pitch 20, which allows multiple spring probes 14 to be used to contact power or ground pads on an integrated circuit device 44 (FIG. 58, FIG. 59), thereby improving current carrying capability. As well, for a massively parallel interconnect assembly 278 (e.g. 278a, FIG. 55) having an array 12 (FIG. 1) of spring probes 14, multiple spring probes 14 may be used to probe I/O pads 47 on an IC substrate 48 (FIG. 9), such as on an integrated circuit device under test (DUT) 44 (FIG. 58, FIG. 59). Every spring probe contact 14 to be verified for continuity after engagement of the spring contacts 14 to the integrated circuit devices 44 under test (FIG. 55), thereby ensuring complete electrical contact between a massively parallel interface assembly 78 and a devices 44 on a compliant carrier 115 (FIG. 55), before testing procedures begin.

Improved Structures for Miniature Springs

FIG. 5 is a first perspective view of opposing photolithographic springs 34a, 34b, having an interleaved spring tip pattern, before spring to substrate detachment. FIG. 6 is a perspective view of opposing interleaved photolithographic springs 34a, 34b, after spring to substrate detachment.

The interleaved photolithographic springs 34a, 34b each have a plurality of spring contact points 24. When spring contacts are used for connection to power or ground traces 46 or pads 47 of an integrated circuit device 44, the greatest electrical resistance occurs at the point of contact. Therefore, an interleaved spring contact 34, having a plurality of contact points 24, inherently lowers the resistance between the spring contact 34 and a trace 46 or pad 47. As described above, multiple interleaved spring probes 34 may be used for many applications, such as for high quality electrical connections for an integrated circuit device 44, or for a massively parallel interface assembly 78 (FIG. 15), such as for probing an integrated circuit device 44 during testing.

FIG. 7 is a top view 42 of opposing interleaved photolithographic spring pairs 34a,34b in contact with the same traces 46 or pads 47 on an integrated circuit device under test (DUT) 44. The interleaved spring contact pair 34a and 34b allows both springs 34a and 34b, each having a plurality of contact points 24, to contact the same trace 46 or pad 47. As shown in FIG. 5, when a zig-zag gap 38 is formed between the two springs 34a,34b on a substrate 16, multiple tips 24 are established on each spring 34a,34b. Before the interleaved spring probes 34a,34b are released from the substrate 16, the interleaved points 24 are located within an overlapping interleave region 36. When the interleaved spring probes 34a,34b are released from the substrate 16, the interleaved spring points 24 remain in close proximity to each other, within a contact region 40, which is defined between the springs 34a, 34b. The interleaved spring contact pair 34a and 34b may then be positioned, such that both interleaved spring probes 34a and 34b contact the same trace 46, such as for a device under test 44, providing increased reliability. As well, since each interleaved spring 34a,34b includes multiple spring points 24, contact with a trace 46 is increased, while the potential for either overheating or current arcing across the multiple contact points 24 is minimized.

FIG. 8 is a top view of parallel and opposing single-point photolithographic springs 14, before the springs 14 are released from a substrate 16. As described above for interleaved springs 34a, 34b, parallel springs 14 may also be placed such that the spring tips 24 of multiple springs contact a single trace 46 on a device 44. As well, opposing spring probes 14 may overlap each other on a substrate 16, such that upon release from the substrate 16 across a release region 18, the spring tips 24 are located in close proximity to each other. FIG. 9 is a top view of parallel and opposing parallel single-point photolithographic springs 14, after the springs 14 are released from the substrate 16, wherein the parallel and opposing parallel single-point photolithographic springs 14 contact a single pad 47 on an integrated circuit device 44.

FIG. 10 is a front view of a shoulder-point photolithographic spring 50, having a point 52 extending from a shoulder 54. FIG. 11 is a partial cross-sectional side view of a shoulder-point photolithographic spring 50, in contact with a trace 46 on an integrated circuit device. FIG. 12 is a perspective view of a multiple shoulder-point photolithographic spring 50. Single point spring probes 14 typically provide good physical contact with conductive traces 46 on an integrated circuit device 22, often by penetrating existing oxide layers on traces 46 or pads 47 by a single, sharp probe tip 24. However, for semiconductor wafers 104 or integrated circuit devices having thin or relatively soft traces 46 or pads 47, a single long probe tip 24 may penetrate beyond the depth of the trace 46, such as into the IC substrate 48, or into other circuitry.

Shoulder-point photolithographic springs 50 therefore include one or more extending points 52, as well as a shoulder 54, wherein the points 52 provide desired penetration to provide good electrical contact to traces 46, while the shoulder 54 prevents the spring 50 from penetrating too deep into a device 44 or wafer 104. Since the geometry of the spring probes 50 are highly controllable by photolithographic screening and etching processes, the detailed geometry of the shoulder-point photolithographic spring 50 is readily achieved.

FIG. 13 shows a partial cross-sectional view 56 of an ultra high frequency spring probe substrate 16. For embodiments wherein a spring probe 61 and related electrical conductors 60, 68, 64 on and through the substrate 16 are required to be impedance matched, one or more conductive reference surfaces 58a,58b,58c,58d and vias 65a,65b,65c may preferably be added, either within or on the substrate 16. The substrate 16 may also contain alternating ground reference traces

62a,62b, which are connected to reference planes 58a,58b, 58c, to effectively provide a shielded coaxial transmission line environment 63. As well, the impedance control surfaces 58a,58b,58c,58d are not limited to the planar surfaces shown in FIG. 13.

An insulating layer 66 may be deposited on a portion the probe spring 61, such as on the fixed region of the probe spring 61, up to but not enclosing the tip 24 (FIG. 2), as well as on the trace 60, which connects the spring probe 61 to the via 68. A conductive layer 58d may be deposited on top of the insulating layer 66, to provide a coaxial, controlled low impedance connection. Alternate layers of conductive materials 58 and dielectric materials 66 can preferably be integrated within the substrate 16, such as for embodiments which require decoupling capacitors in close proximity to a probe spring 61. For a substrate 16 which is a conductive material, such as silicon, a thin oxide layer 57 may preferably be deposited between the substrate 16 and a conductive reference plane 58c, thereby forming a high capacitance structure 59 between the spring probe 61 and the ground planes 58a and 58b. As well, one or more assembled components 69, such as passive components 69 (e.g. typically capacitors, resistors, and/or inductors), or active component devices 69, may be incorporated on either surface 62a,62b of the substrate.

The fixed portions 15 of the spring probes 61 typically extend a relatively short distance across the substrate 16. Traces 60 located on the surface of the substrate 16 are electrically connected to the fixed portions 15 of the spring probes 61, and electrically connect the probe springs 61 to the vias 68. The traces may be comprised of a different material than the spring probes 61, and are preferably comprised of metals having high electrical conductivity (e.g. such as copper or gold).

Figure 14:
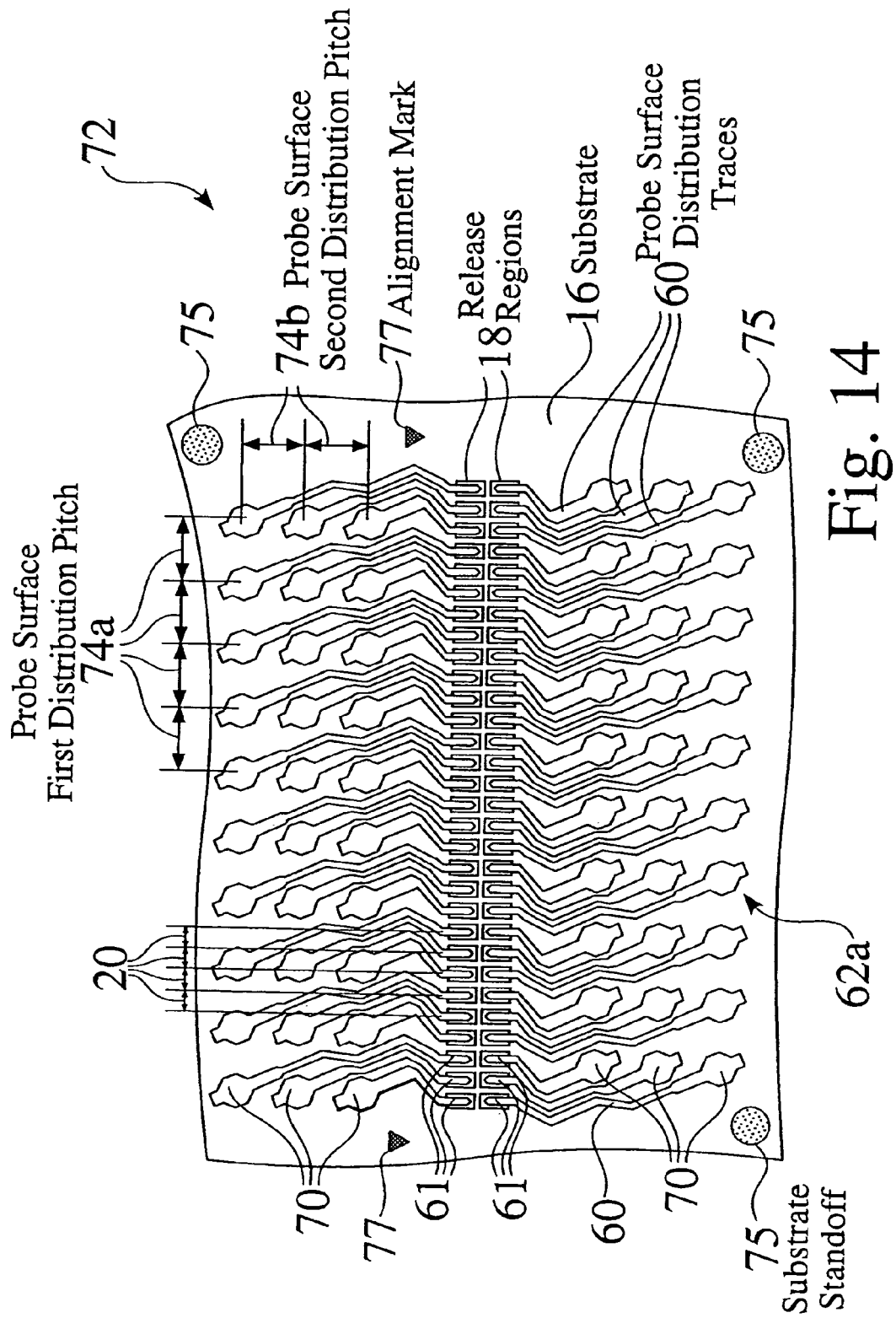
FIG. 14 is a partial plan view of a substrate, in which a plurality of trace distribution regions are defined on the probe surface of the substrate, between a plurality of spring probes and a plurality of via contacts.

FIG. 14 is a partial plan view 72 of a substrate 16, in which a plurality of distribution fanout traces 60 are defined on the probe surface 62a of the substrate 16, between a plurality of spring probes 61 and a plurality of via contacts 70. As described above, the spring probes 61, which are preferably photolithographically formed springs 61, may currently be formed with a pitch of approximately 0.001 inch. The traces 60 are preferably routed on the probe surface 62a, to connect to via contact areas 70, which are preferably laid out in a matrix across the surface of the substrate 16. In the substrate 16 shown in FIG. 14, the via contact areas 70 are positioned with a probe surface first distribution pitch 74a, and a probe surface second distribution pitch 74b.

As the size and design of integrated circuit devices 44 becomes increasingly small and complex, the fine pitch 20 (FIG. 2) provided by miniature spring probe tips 61 becomes increasingly important. Furthermore, with the miniaturization of both integrated circuits 44 and the required test assemblies, differences in planarity between one or more integrated circuits 44 located on a wafer 104 and a substrate 16 containing a large number of spring probes 61 becomes critical.

As seen in FIG. 14, lower standoffs 75 are preferably provided on the probe surface 62a of the substrate 16, such as to prevent the substrate 16 from damaging a wafer under test 104, or to set the spring probe tips 24 to operate at an optimal contact angle. The lower standoffs 75 are preferably made of a relatively soft material, such as polyamide, to avoid damage to the semiconductor wafer under test 104. In addition, to further avoid damage to active circuits 44 in the semiconductor wafer 104, the standoffs 75 are preferably placed, such that when the massively parallel interface assembly 78 is aligned with a device 44 on a semiconductor wafer 104, the standoffs 75 are aligned with the saw streets 136 (FIG. 18, FIG. 19) on the semiconductor wafer 104, where there are no active devices 44 or test structures. Furthermore, the height of the lower standoffs 75 are preferably chosen to limit the maximum compression of the spring probes 61a–61n, thus preventing damage to the spring probes 61a–61n.

The substrate 16 also typically includes one or more alignment marks 77 (FIG. 14), preferably on the probe surface 62a, such that the probe surface 62a of the substrate 16 may be precisely aligned with a wafer to be tested 104.

Chip Scale Semiconductor Package

Figure 15:
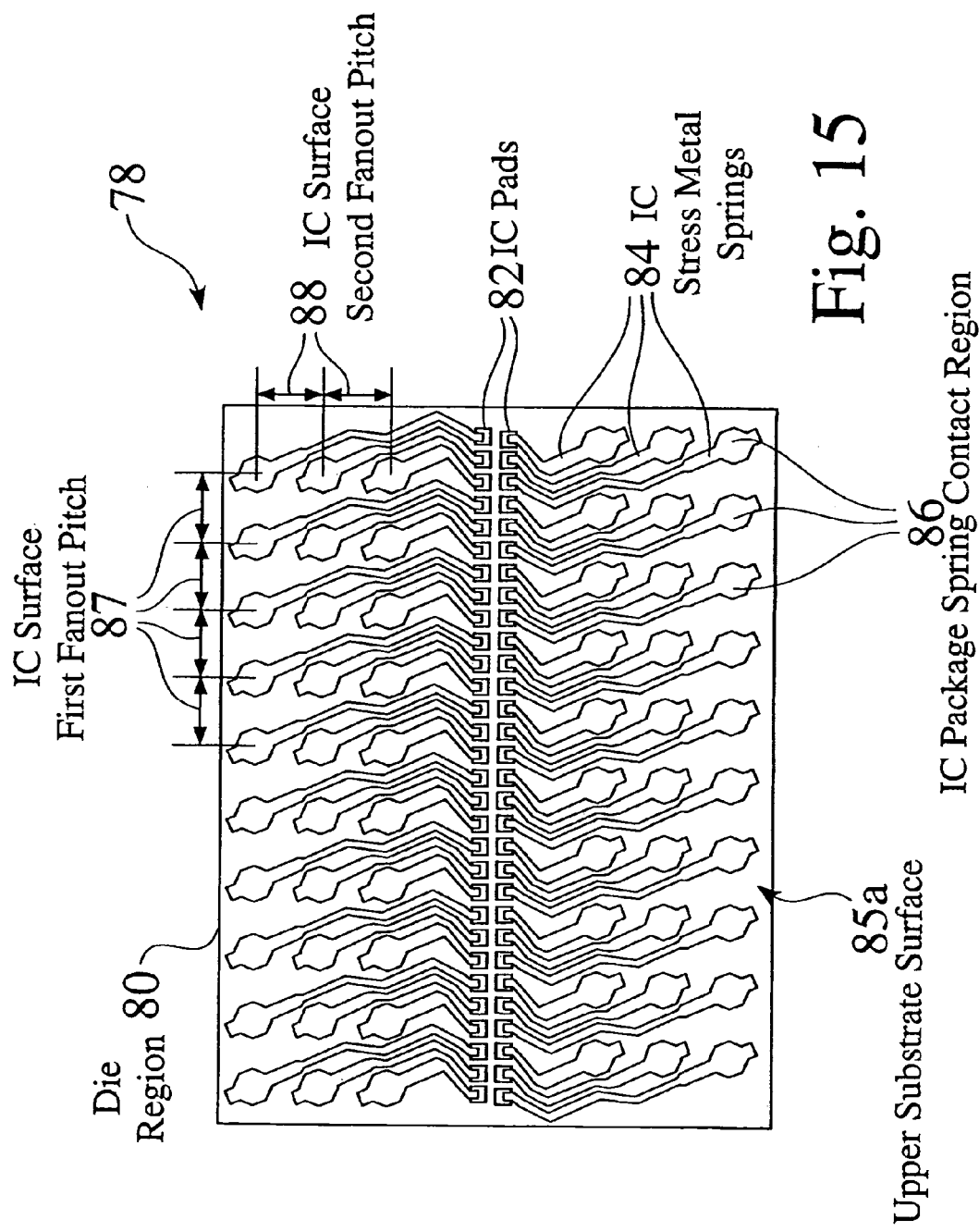
FIG. 15 is a plan layout view of an integrated circuit having stress metal springs connected to IC pads, as laid out on the IC substrate surface, before release from the substrate surface.
Figure 16:
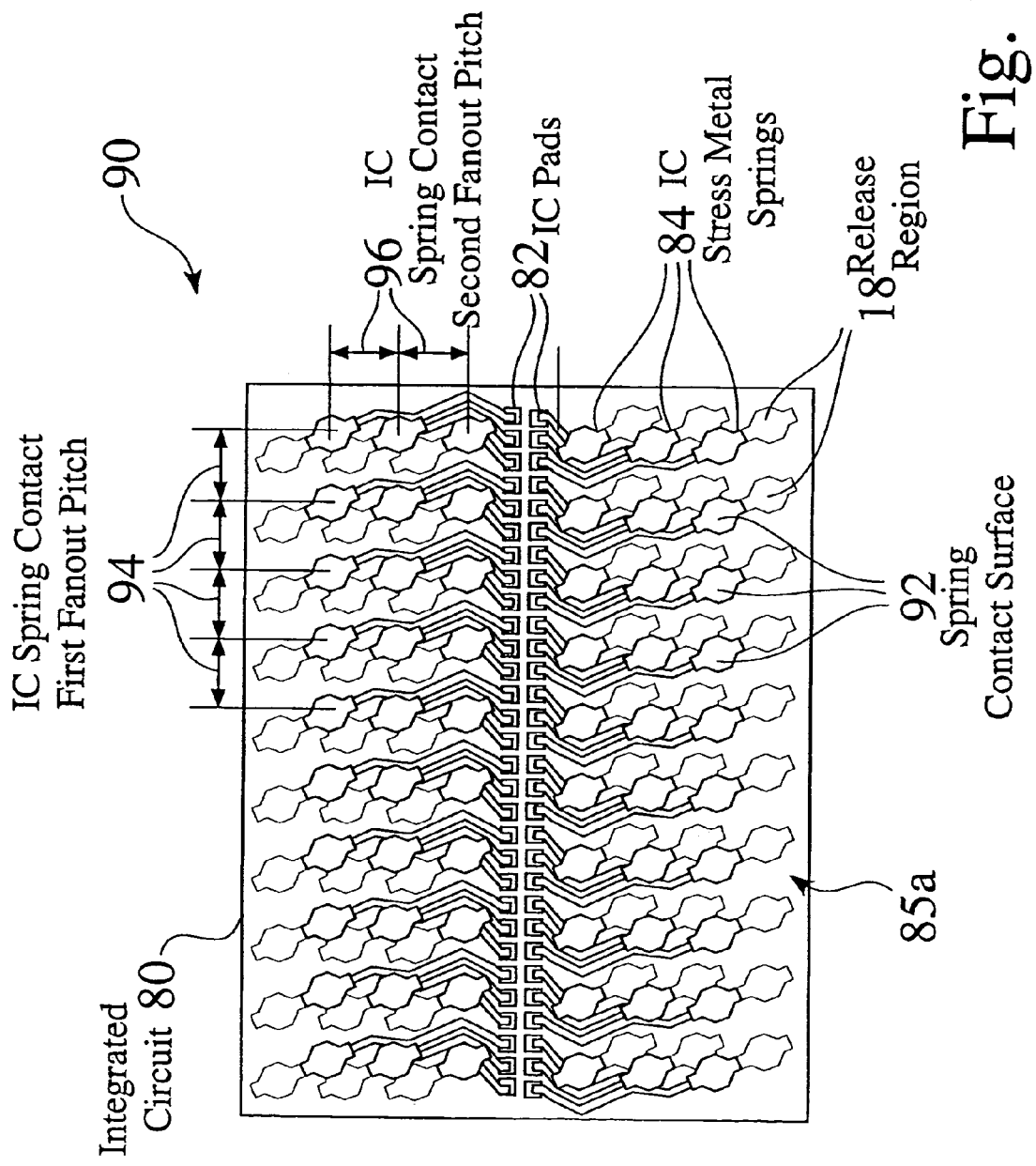
FIG. 16 is a plan layout view of an integrated circuit having stress metal springs connected to IC pads and extending from the substrate surface.

FIG. 15 is a plan layout view 78 of a chip scale integrated circuit package die region 80 having stress metal springs 84 connected to IC pads 82 and laid out on the upper substrate surface 85a, before release from the upper substrate surface 85a. In the plan layout view 78, the stress metal springs 84 each have a spring contact region 86, which before release are preferably laid out in an IC surface first fanout pitch 87 and an IC surface second fanout pitch 88. FIG. 16 is a plan layout view 90 of an integrated circuit die region 80 having stress metal springs 84 connected to IC pads 82 and extending from the substrate surface 85a, after release from the upper substrate surface 85a. During release from the upper substrate surface 85a, each of the stress metal springs 84 extend from respective release regions 18, whereby the contact regions 86 (FIG. 15) are rotated though an effective spring angle 30 (FIG. 3, FIG. 4), such that each stress metal spring 84 further preferably defines a spring contact surface 92. After release from the substrate surface 85a, each of the spring contact surfaces 92 are preferably laid out on a spring contact first fanout pitch 94 and on a spring contact second fanout pitch 96.

Figure 17:
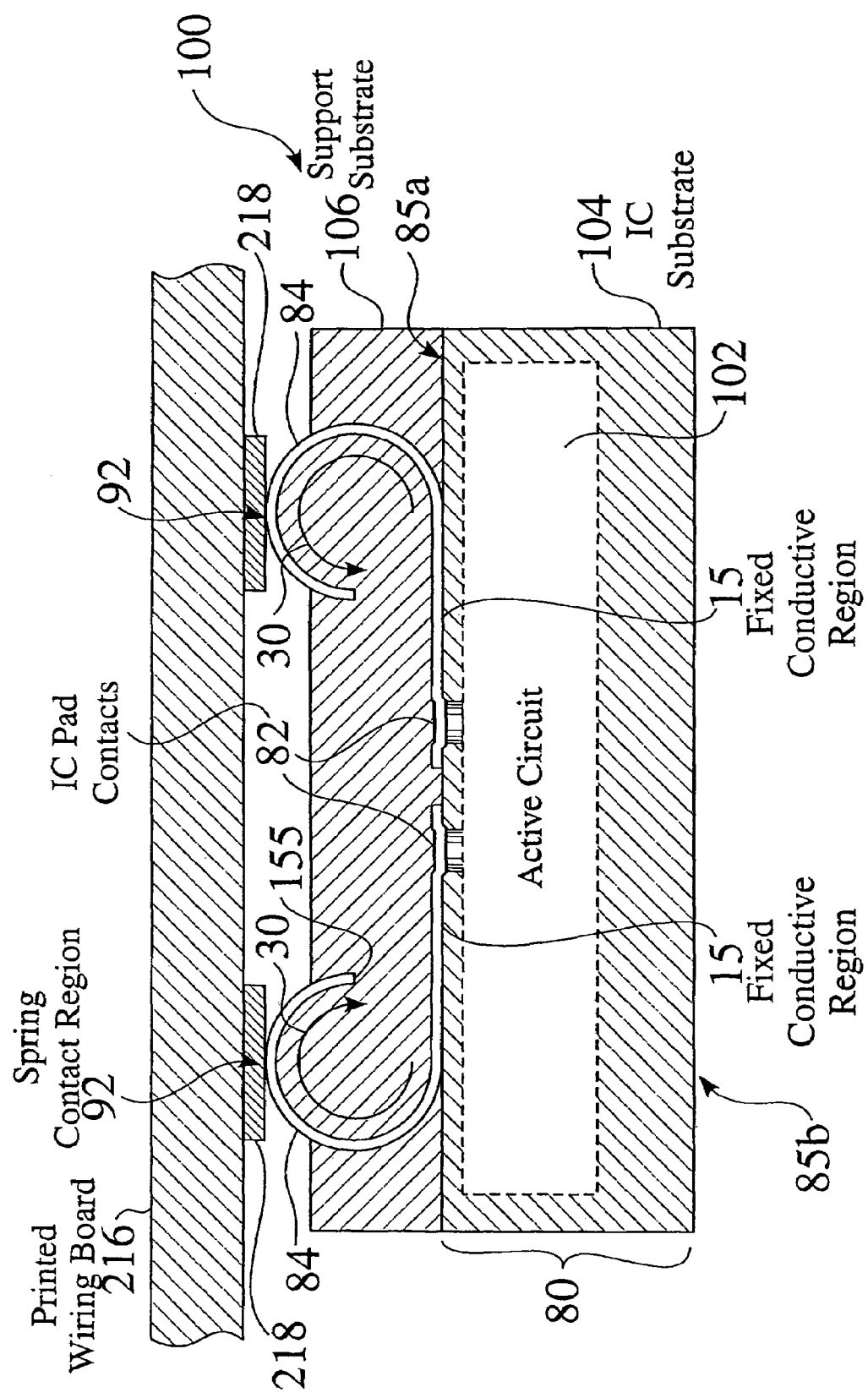
FIG. 17 is a partial cutaway view of an integrated circuit having looped stress metal springs connected to IC pads and extending from the substrate surface, wherein a portion of the stress metal springs are embedded within a support substrate.

FIG. 17 is a partial cutaway view of an chip scale integrated circuit package 100 having looped stress metal springs 84 connected to IC pads 82 and extending from the substrate spring surface 85a, wherein a portion of the stress metal springs 84 are embedded within a support substrate 106 comprised of an electrically insulative material. The support substrate 106 is typically comprised of a polymer substrate which provides support for each of the springs 84. In some preferred embodiments of the chip scale integrated circuit package 100, the support substrate 106 is a compliant polymer, i.e. an elastomer.

The support substrate 106 provides mechanical protection and adds mechanical support, i.e. strength, to the springs 84, provides passivation to the integrated circuit die regions 80, and adds mechanical strength to the assembly.

The combination of springs 84 and support substrate 106 constructed on the integrated circuit device, together form the integrated circuit package 100, which is attachable to a printed circuit board 216, typically using epoxy or solder. The support substrate 106 provides mechanical strength for chip attachment to the printed wiring board, and controls the amount of wetting for solder or epoxy on the springs 84. The compliant springs 84 provide the compliant connection to manage the thermal expansion mismatch between the die region 80 and a printed wiring board 216.

While the springs 84 shown in FIG. 17 are preferably stress metal springs 84, the support substrate 106 can alternately be used to provide support for a wide variety of chip scale contacts 84. The support substrate 106 adds strength to the springs 84, and typically improves the robustness of the springs 84 to handling and use, that could otherwise result in breakage.

As seen in FIG. 17, the springs 84 provide a conductive path between the integrated circuit 102 and the loop spring contact regions 92, which extend beyond the outer surface of the support substrate 106. As seen in FIG. 15, FIG. 16, FIG. 32, FIG. 33, and FIG. 34, the loop spring contact regions 92 may preferably have an enhanced contact area geometry, such as to provide dimensional tolerance for electrical connections for testing, burn-in, or for subsequent device operation.

As seen in FIG. 17, FIG. 24, FIG. 43, and FIG. 51, stress metal springs 84, 152 may preferably also comprise one or more metal or metal alloy coatings 166. These coatings may be applied using eletro or electroless plating, sputtering, evaporation, or equivalent processes.

Specific metals or alloys for spring coatings are selected to provide a high integrity physical mounting between the IC package 100 and its mounting substrate (e.g., printed wiring board 216), a low resistance electrical path between IC contact pads 82 and spring contact region 92, as well as a surface compatible with either a solder or pressure connection to solder ball 220 (FIG. 54) or spring contact region 92 (FIG. 17), respectively.

Desirable metals for stress metal spring body and tip coatings include nickel or nickel alloys such as, nickel iron, nickel cobalt, nickel cobalt iron, nickel molly, nickel tungsten, nickel iron tungsten, nickel cobalt tungsten, nickel rhodium, nickel cobalt manganese, nickel iron rhodium, nickel iron manganese, and silver, rhodium, palladium or palladium alloys such as palladium cobalt, cobalt, silver, gold or gold alloys, tin and tin alloys, copper and copper alloys, and lead containing and lead free solder materials.

Metal coatings can be applied to exemplary stress metal springs 14a–14n in FIG. 2 either before or after release from substrate 16 or to those of springs 84,152 either before or after release from the die region 80. Metallic coatings, such as exemplary coating 166 in FIG. 24, can also be used to increase the strength of exemplary springs 84 of FIG. 17 or 152 of FIGS. 22–27 to improve the robustness of the springs to handling and use. Metallic coating 166 can also be used to reduce the overall electrical resistance of exemplary springs 84, 152.

In some embodiments, harder metals such as rhodium, palladium or a palladium alloy such as palladium cobalt, or other alloys may be used to provide improved contact performance by increasing resistance to mechanical wear and debris pickup from printed circuit board pads. These metals may be plated as primary, secondary, or subsequent plating metal layers to serve as stress metal spring contact regions, such as in region 92 in FIG. 17, or other exemplary contact regions including 92 and 158 of FIG. 22, 158 and 162 of FIG. 23, 92 and 158 of FIG. 24–27.

Figure 25:
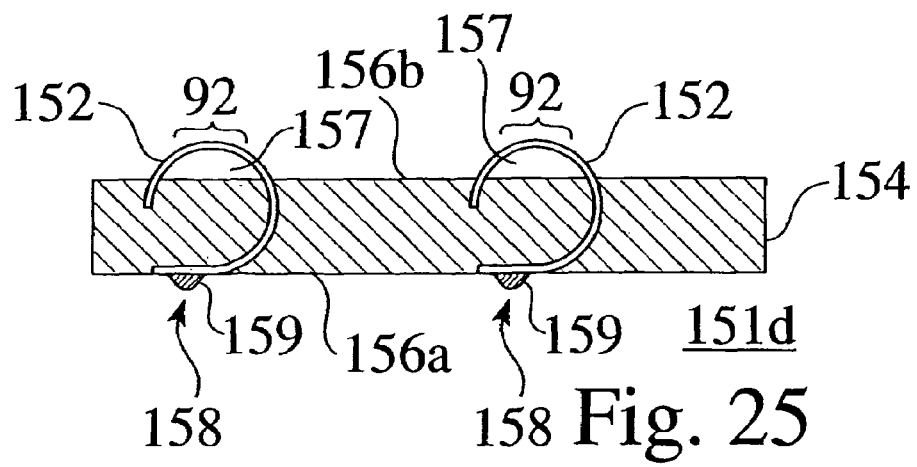
FIG. 25 is a side cross-sectional view of a stress metal spring interposer having filled bumps on a first surface contact region, and looped stress metal springs which partially extend beyond a polymer interposer layer.
Figure 26:
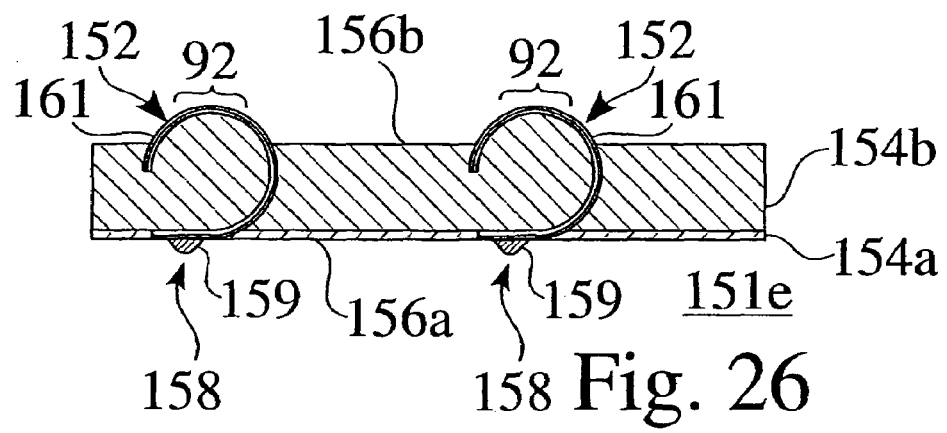
FIG. 26 is a side cross-sectional view of a stress metal spring interposer in which the interposer layer comprises a plurality of polymer layers.
Figure 27:
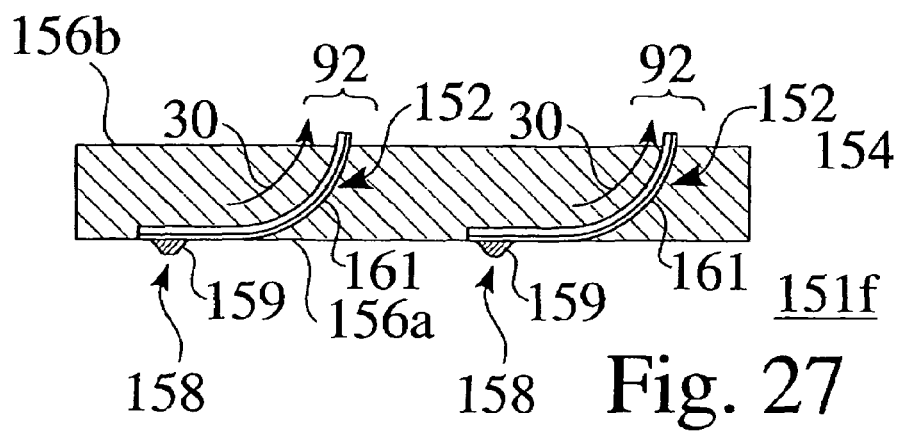
FIG. 27 is a side cross-sectional view of a stress metal spring interposer in which the stress metal springs have an effective spring angle less than 90 degrees.

Exemplary contact bumps 159 in FIGS. 25–27 can be filled or plated on the stress metal tips 158 in FIG. 26 either before or after lifting the springs from the substrate. The bumps can be fabricated using selected metals and alloys such as nickel or nickel alloys, rhodium, palladium, or palladium alloys, copper or copper alloys, gold or gold alloys, and solders such as mentioned above.

Additional plating layers or buttons can be applied before or after lifting the springs from the substrate and can be selectively applied to the spring tips 92 in FIG. 27 using photolithographic methods. As well, the use of a plated metallic coating 166 creates a higher contact force between spring 84 and the pad on a circuit board, to reduce the electrical contact resistance.

In some preferred embodiments of the stress metal springs 84,152, a metal plating layer 166, such as a nickel alloy, is then followed by subsequent plating layers 166, such as gold or rhodium, to provide increased spring strength and, lowered spring resistance, as well as improved contact performance.

For stress springs 84,152 which preferably comprise a plated metal coating 166, a large portion of the required strength for the springs 84, 152 can be provided by the plating 166, such that the stress metal layers 17a–17n (FIG. 13) are not required to provide as much strength, such as compared to an unplated spring 84,152. Therefore, in some plated stress spring embodiments, the stress metal layers 17a–17n (FIG. 13) may only be used to define the structural shape before plating, thereby relaxing the process, i.e. metallurgical, parameters needed for the stress metal layers 17a–17n.

Figure 54:
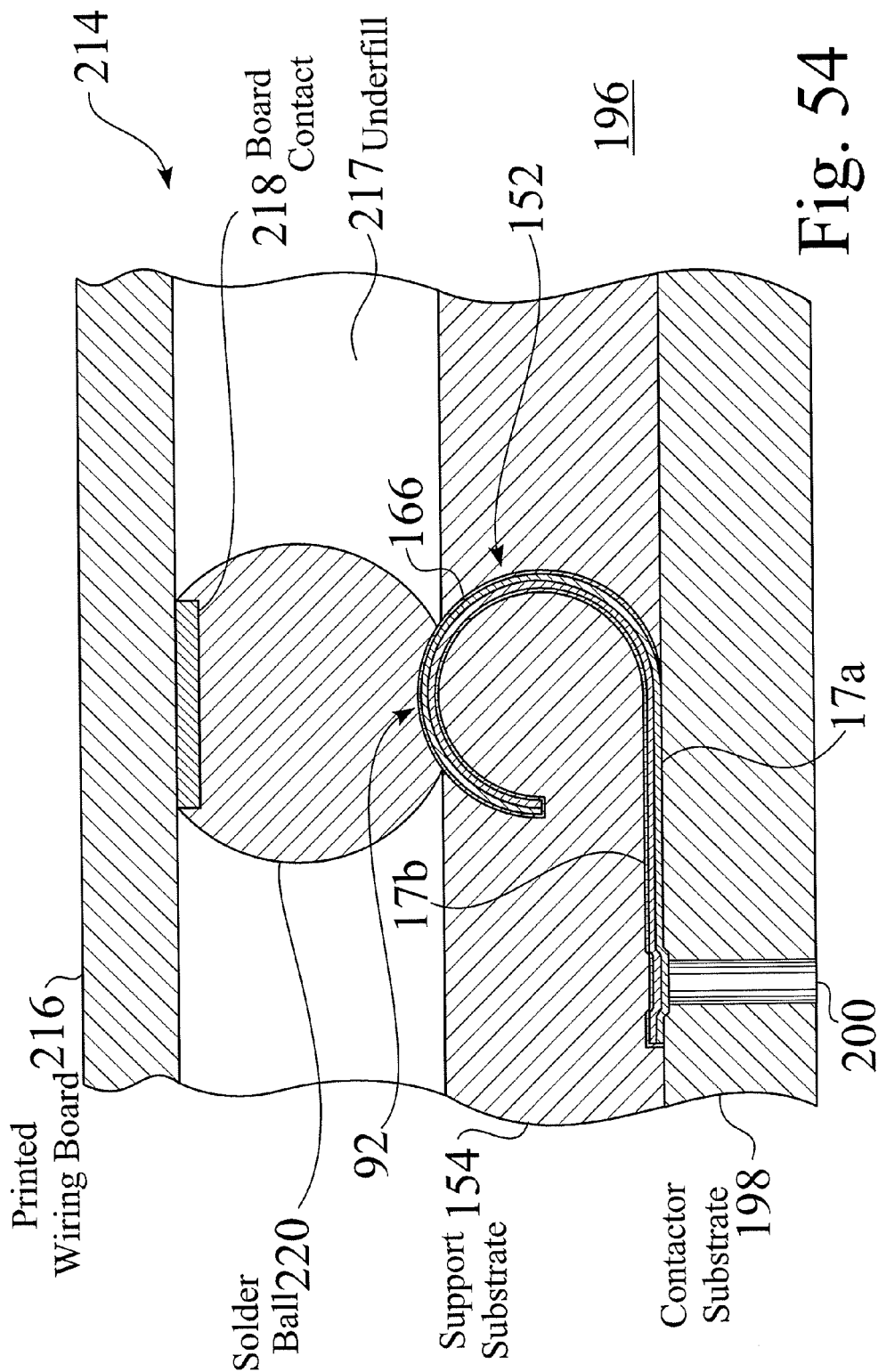
FIG. 54 is a side cross-sectional view of a stress metal spring contactor having a spring probe contact area extending from the contactor substrate, in which a connection is established between the stress metal spring contactor and a printed wiring board though a solder ball contact.

For embodiments of stress springs 84, 152 in which the plated metal coating 166 significantly strengthens the spring, support substrate 106 can alternately be comprised of a relatively hard polymer material 106, such as polyimide or a conventional molding material, such as to create a rigid IC package for direct surface mount applications to printed circuit boards 216. Chip-scale package integrated circuit devices 100 for use in harsh environments may also preferably further comprise plated metal spring coatings 166 combined with a polymer underfill 217 (FIG. 54).

As well, a boundary layer 161 (FIG. 26, FIG. 46) can preferably be used on the stress metal springs 84, 152, in which the boundary layer 161 is initially established as the first layer, i.e. the layer in contact with the release region 18. After release from the substrate surface 85a, the stress metal springs 84 loop through an effective angle 30, such that the boundary layer 161 becomes the outer layer of the contact region 92, for springs 84,152 having an effective angle greater than 180 degrees. The boundary layer 161 is preferably comprised of a highly conductive and non-corrosive metal, such as gold, rhodium, or palladium. In some embodiments, the boundary layer 161 is preferably be patterned on the substrate surface 85a, such as to be selectively applied to portions of the springs 84, e.g. such as to control the wetting of solder on a contact area 92 of a spring 84.

As seen in FIG. 17, the stress metal springs 84 preferably have a effective angle 30 which is typically larger than 180 degrees, such that the leading edges 155 of the springs 84 preferably extend back into the support substrate 106, defining a loop spring contact region 92 along the convex arch of the spring 84. While the chip scale package semiconductor 100 shown in FIG. 16 shows a large effective spring angle 30, a wide variety of chip scale package contact springs 84 can be enhanced by the use of support substrates 106 and one or more plating layers 166. Some springs 84,152 which require higher force or which need to contact smaller pads on a printed circuit board 216 preferably have an effective angle 30 which is typically less than 90 degrees.

Chip Scale Semiconductor Package Fabrication

The chip scale semiconductor package 100 can be efficiently fabricated using batch processing methods. A release layer 18, such as titanium or silicon oxinitride, is typically initially fabricated on the wafer die region 80. Next, one or more metal layers 17 with controlled stress, such as layers 17a,17b in FIG. 13, are deposited on top of the release layer 18. In some embodiments of the chip scale semiconductor package 100, the stress metal layers 17 are comprised of the same or similar deposited metal, which have an initial stress gradient.

In some embodiments of the chip scale semiconductor package 100, the stress metal springs are built in compliance to photolithographic springs, such as described above, or as disclosed in U.S. Pat. No. 5,848,685, U.S. Pat. No. 5,613,861, or U.S. Pat. No. 3,842,189, which are incorporated herein by reference.

The stress metal layers 17 are then typically patterned, to form spring and interconnect traces, using conventional photolithography and etch processes. A dielectric release window, such as polyimide, oxide, or nitride is defined, after the stress metal layers 17 are controllably etched. The release window defines the areas 18 where the spring metal is released from the substrate surface 58a, forming springs 84. After the stress metal springs 84 are controllably released from the substrate die region 80, the springs 84 are preferably plated 166, to adjust the spring constant, or to increase the strength of the stress metal springs 84. As described above, the exposed contact portions 92 of the stress metal springs 84 are preferably coated with gold or other material, such as for ease of soldering during a subsequent IC circuit assembly process. As well, a barrier metal 161 can also be formed on the stress metal spring 84, before stress metal deposition.

The support substrate layer 106 is then typically applied on the wafer 104, after the springs 84 are released and are preferably plated. The support substrate 106, typically comprising a polymer, functions as a protective layer for the integrated circuit device. In some embodiments of the chip scale semiconductor package 100, the support substrate 106 is controllably applied to a desired depth, such that the contact portions 92 of the stress metal springs 84 are exposed. In other embodiments of the chip scale semiconductor package 100, wherein the support substrate 106 is initially applied to cover the entire spring structures 84, the support substrate 106 is subsequently etched back, to expose the top contact region 92 of the springs 84. A photomask is preferably used for an etched support substrate 106, to controllably define the precise location and shape of the exposed region of the contact portions 92 of the stress metal springs 84.

Advantages of Chip Scale Semiconductor Package

The chip scale integrated circuit package 100 simplifies the process and reduces the number of processing steps in the fabrication of chip scale packages. A chip scale integrated circuit package 100 can be easily fabricated through batch processing techniques, similar to batch process manufacturing methods for semiconductor assemblies, such as integrated circuit devices.

The chip scale integrated circuit package 100 thus eliminates the serial process of bonding device leads to an integrated circuit one at a time. As well, the chip scale integrated circuit package 100 enables tight pitch packages with high electrical performance.

Furthermore, chip scale integrated circuit packages 100 can also provide a direct temporary contact to a board, such as to a printed circuit board 216, by pressure, which can eliminate the need for a socket or interposer connection. This temporary contact can also function as a probe contact, thus allowing the probe contact to be reduced to a simple pad array on a printed circuit board 216.

Compliant Wafer Chip Carrier

FIG. 18 is a side view 110 of integrated circuit die regions 80 on a semiconductor wafer 104. Each of the integrated circuit die regions 80 have contacts 47, such as contact pads or stress metal springs 84. Saw streets 114 are defined between the integrated circuit die regions 80. In a preferred embodiment, the integrated circuit die regions 80 are chip scale semiconductor packages 100, having stress metal spring contacts 84 and a support substrate 106, as described above.

FIG. 19 is a side view 112 of a semiconductor wafer 104, having integrated circuit die regions 80, in which the wafer 104 is adhesively mounted to a compliant wafer carrier substrate 115. The compliant substrate 115 has a first surface 116a and a second surface opposite the first surface 116b. The first surface 116a includes an adhesive layer, such that a wafer 104 may readily be mounted for subsequent IC separation and processing. A support 118 is also typically attached to the compliant substrate 115.

FIG. 20 is a side view 120 which shows of the separation 122 of integrated circuits on a semiconductor wafer 104, which is mounted to a compliant carrier substrate 115. As known in the semiconductor processing industry, a saw is typically used to form separations 122 between integrated circuits 44 and die regions 80, along the saw streets 114.

The compliant wafer carrier 115 is typically comprised of a compliant polymer material, such as RISTON™, Part Number 1004R-9.0, from Nitto-Danko, Japan, or Ultron Systems, of Moore Park, Calif. As described below, some preferred embodiments of the compliant wafer carrier 115 are thermally conductive and/or electrically conductive.

FIG. 21 is a side view 130 which shows separated integrated circuits 44,100 on a compliant wafer carrier 115. The compliant wafer carrier 115 holds the integrated circuit dice 44,100 together in position after wafer separation 122, e.g. such as after saw and break, making it possible to handle all the separated dice 44,100 from a wafer 104 as a group, through back end assembly, test and burn in.

The use of a compliant wafer carrier 115 integrates assembly and wafer level testing and burn-in processes, and offers the speed advantage of parallel testing and simplicity in handling.

In conventional wafer level testing and burn in, the integrated circuit dice 44 are sometimes burned-in and tested before packaging and singulation from the wafer. However, a common difficulty encountered in a conventional wafer-level pre-singulation approach is the complexity in managing the thermal expansion mismatch between the silicon wafer and the connector systems, which are required to make connections between the integrated circuit dies on the wafer and the system electronics. As well, defects induced by the packaging, singulation, and handling are not screened out by such a process.

The preferred use of a stress metal spring chip scale package 100, in conjunction with a compliant carrier 115, as described above, allows the use of low cost printed wiring board material 282, whose material coefficient of expansion can be different from the carrier mounted devices under test 100, to contact the dice during test and burn-in. As well, as described below, various embodiments of a massively parallel interface assembly 278, e.g. such as massively parallel interface assembly 278a shown in FIG. 55, allow connection to a wide variety of carrier-mounted integrated circuits 44,100.

Therefore, the preferred use of chip scale package 100 and/or a massively parallel interface assembly 278 allow the test and burn of integrated circuit dice 44,100 after packaging and singulation 122, making it possible to detect assembly, saw and handling caused defects, while keeping the die in position for precision handling with massive parallelism.

In embodiments using a preferred chip scale package 100, the semiconductor wafer 104, having stress metal springs 84 which are processed onto the active surface 85a and are preferably partially encapsulated 106, is attached to a compliant decal wafer carrier 115. In some embodiments of the compliant carrier 115, the carrier 115 is similar to a conventional "blue" tape carrier which is commonly used for wafer sawing in the semiconductor processing industry.

The mounted wafer 104 is then sawed 122 into separate die 44,100, typically using a standard IC dicing and break process, without cutting through the carrier 115. The carrier tape 115 holds the packaged dice 100 in their relative position, as they were on the wafer 104. A contact fixture 132, such as the massively parallel test assembly 278 (FIG. 55, FIG. 57, FIG. 68, FIG. 70, FIG. 71), typically including a printed wiring board 282, comprises connections and associated electronics for connecting to and for testing the integrated circuits 44,100. The contact fixture 132 connections are designed to match the connections 47, such as spring leads 84, on the devices under test 44,100, when the contact fixture 132 is pressed onto the DUT devices 44,100 on the compliant carrier 115.

As seen in FIG. 21, a pressure plate support 134, preferably constructed of a material having a similar thermal coefficient of expansion (TCE) to the TCE of the printed wiring board 282, supports the back surface 116b of the compliant carrier 115. During testing and/or burn-in operations, the IC contact fixture 132 is fixedly attached 136 in relation to the pressure plate support 134, forming a sandwich structure 130, in which the mounted integrated circuit die 44,100 and the compliant carrier 115 are held in place. The pressure plate support 134 may also be preferably comprised of a compliant material, whereby the pressure plate support 134 and the carrier-mounted die 44,100 can readily conform to the system board 282.

When the temperature of this sandwich structure 130 is raised to the test and burn-in temperature, the printed wiring board 282, having a higher coefficient of expansion than the silicon die regions 80, expands faster than the silicon die regions 80. However, friction between the integrated circuit die 44,100 and the printed wiring board 282 and the pressure plate support 134 acts to drag the integrated circuit die 44,100, along with the printed wiring board 282, since the integrated circuit die 44,100 are separated 122 from each other, and are only connected through the compliant flexible carrier 115. Therefore, the relatively independent movement of each of the separated integrated circuit die 44,100 maintains pad to lead alignment between the integrated circuits 44,100 and the printed wiring board 282.

The separated integrated circuit die 44,100 which are mounted to the compliant carrier 115, are able to move relative to each other, while holding their positions on the compliant carrier 115. Therefore, the separated integrated circuit die 44,100 can be handled and processed as a "wafer" assembly, while maintaining sufficient connections to the IC contact fixture 132.

Therefore, the printed wiring board 282 and the pressure plate support 134 are not required to be comprised of a material having a similar coefficient of expansion TCE to the IC substrate 104. The compliant carrier-mounted dice 44,100 are able to move with the system board 282 and the support structure 134, such that the dice 44,100 remain in electrical contact with the system board 282 within the IC contact fixture 132. Furthermore, since the dice 44,100 are tested after packaging and singulation, the burn in and test applied to the dice will detect assembly induced defects in the dice 44,100.

As seen in FIG. 21, a temperature controller 144 is preferably attached to the sandwich structure 130, such as to provide heating or cooling during testing and/or burn-in processes. In some embodiments of the compliant wafer carrier 115, the carrier 115 is comprised of a thermally conductive material, which functions as a thermal control plane during testing or burn-in, wherein the back side of the integrated circuits are in thermal contact to temperature control 144, such as for cooling and/or heating, through the compliant tape layer 115.

As well, the carrier 115 may preferably be comprised of electrically conductive material, whereby the carrier 115 may provide an electrical connection 140 to the back surface of the separated and mounted integrated circuit dice 80.

Stress Metal Spring Interposer

Figure 22:
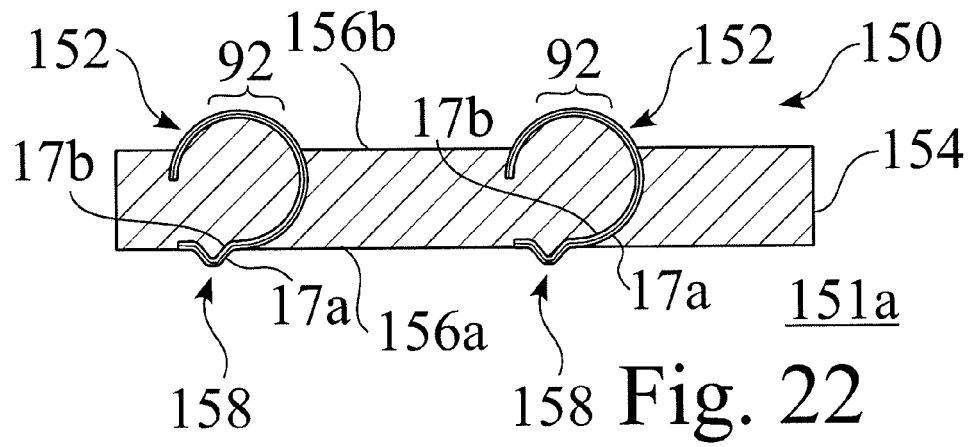
FIG. 22 is a side cross-sectional view of a stress metal spring interposer.

FIG. 22 is a partial cross-sectional view 150 of a stress metal spring interposer 151a, comprising one or more springs 152 which extend from a first surface 156a to a second surface of an interposer substrate 154. The springs 152 also typically comprise contact pads 158 which extend from the first surface of the interposer substrate 154. Stress metal spring interposers 151 provide ultra-high density, compliant through connections, and provide high density connections over extreme temperature ranges.

Conventional interposers, such as pogo pins, springs, or wires which are fabricated by mechanical construction methods are limited in pitch, which limits the connection density and requires high connection force.

Stress metal spring interposers 151 use thin film stress metal to form a tight array of thin film springs, held together by a substrate 154 comprises of a polymer material. Electrical connections are made from one side 156a of the polymer sheet to the other side 156b by the conductive springs 152.

A high density connection between the two surfaces 156a,156b can therefore be made by having each of the surfaces pressing against one side of the polymer sheet with stress springs embedded. Different tip shapes can be engineered on each end of the spring 152, such as for different contact materials.

In some embodiments of the stress metal spring interposers 151, the stress metal springs are built in accordance to U.S. Pat. No. 3,842,189 and/or U.S. Pat. No. 3,842,189, which are incorporated herein by reference.

Figure 23:
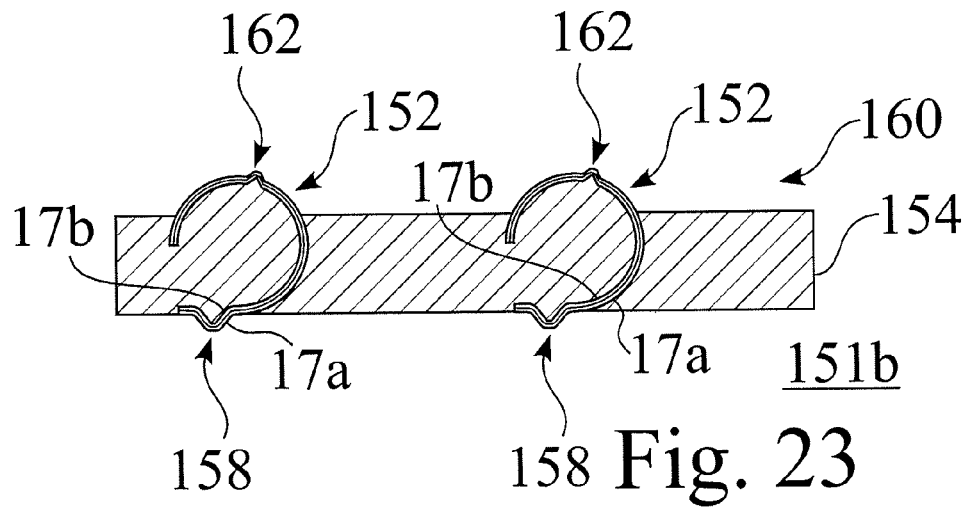
FIG. 23 is a side cross-sectional view of a stress metal spring interposer having formed bumps on second surface contact region.
Figure 24:
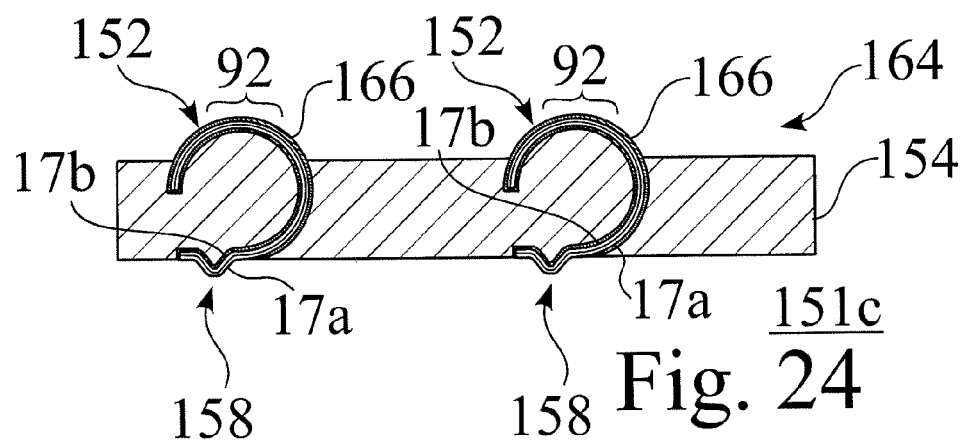
FIG. 24 is a side cross-sectional view of a plated stress metal spring interposer.

A wide variety of geometries and materials may be used for the construction of the spring interposer 152. For example, FIG. 23 is a side cross-sectional view 160 of a stress metal spring interposer 151b having formed bumps 162 on the second surface contact region 158. FIG. 24 is a side cross-sectional view 64 of a plated stress metal spring interposer 151c.The springs 152, as well as stress springs 84, are preferably comprised of layers of metal having 17 (FIG. 13) having different initial levels of stress, such that the springs form an effective spring angle 30 (FIG. 3) during fabrication.

FIG. 25 is a side cross-sectional view of a stress metal spring interposer 151d having filled bumps 159 on a first surface contact region, and looped stress metal springs 152 which partially extend beyond a polymer interposer layer 154, defining a hollow contact region 157 between the contact area 92 of the looped stress metal springs and the top surface 156b of the polymer layer 154.

FIG. 26 is a side cross-sectional view of a stress metal spring interposer 151e, in which the interposer layer comprises a plurality of polymer layers 154a,154b.As well, the looped stress metal springs further comprise a boundary layer 161. In some embodiments of the stress metal springs 84,152, the boundary layer 161 comprises a metal having high electrical conductivity and/or corrosion resistance. The boundary layer 161 may also be used for increased stress spring strength.

FIG. 27 is a side cross-sectional view of a stress metal spring interposer 151f, in which the stress metal springs 152 have an effective spring angle less than 90 degrees, and in which the interposer substrate 154 adds strength and/or protection for the stress metal springs 152.

Leading Edge and Contact Geometries for Loop Stress Metal Springs

Figure 41:
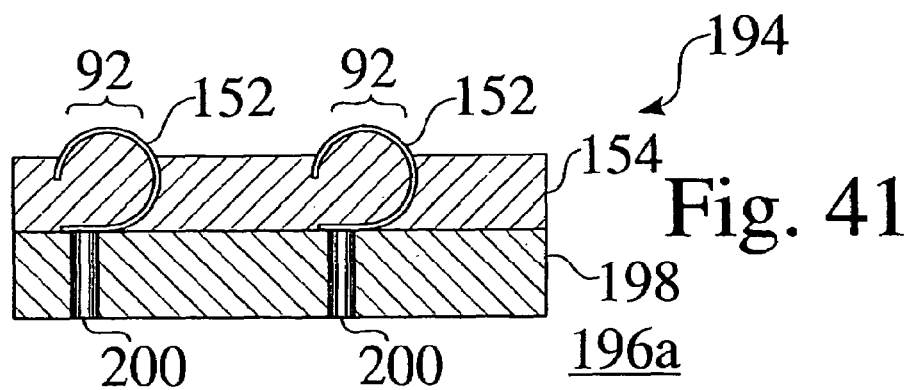
FIG. 41 is a side cross-sectional view of a stress metal spring contactor having contact areas extending from an elastomeric substrate.

Loop stress metal springs 152, such as used for the stress metal chip scale package 100, the stress metal interposer 151, or for the stress metal contactor 196, such as contactor 196a in FIG. 41, can have a wide variety of leading edge and contact area geometries.

Looped Stress Metal Spring Leading End Detail

FIG. 28 is a partial view of a square leading end 155a of a looped stress metal spring 84,152. FIG. 29 is a partial view of a pointed leading end 155b of a looped stress metal spring 84,152. FIG. 30 is a partial view of a pointed leading end 155c of a looped stress metal spring 84,152, which further comprises retaining grooves 157. FIG. 31 is a partial view of a pointed leading end 155d of a looped stress metal spring 84,152, which further comprises retaining ledges 163.

The leading end 155 of high effective angle looped stress metal springs 84,152 can have a variety of leading end geometries 155, since the leading ends 155 are typically not used for contacting. The desired geometry of the leading end 155 is typically chosen to control the formation of the non-planar springs 152, during lift-off from a substrate, i.e. the spring tip geometry helps the stress metal spring 152 to lift in the correct direction. In some embodiments, the geometry of the leading end 155 is chosen to anchor the loop spring probe within a supporting substrate 154, such as with grooves 157 or ledges 163.

Contact Area Structures

Figures 32, 33:
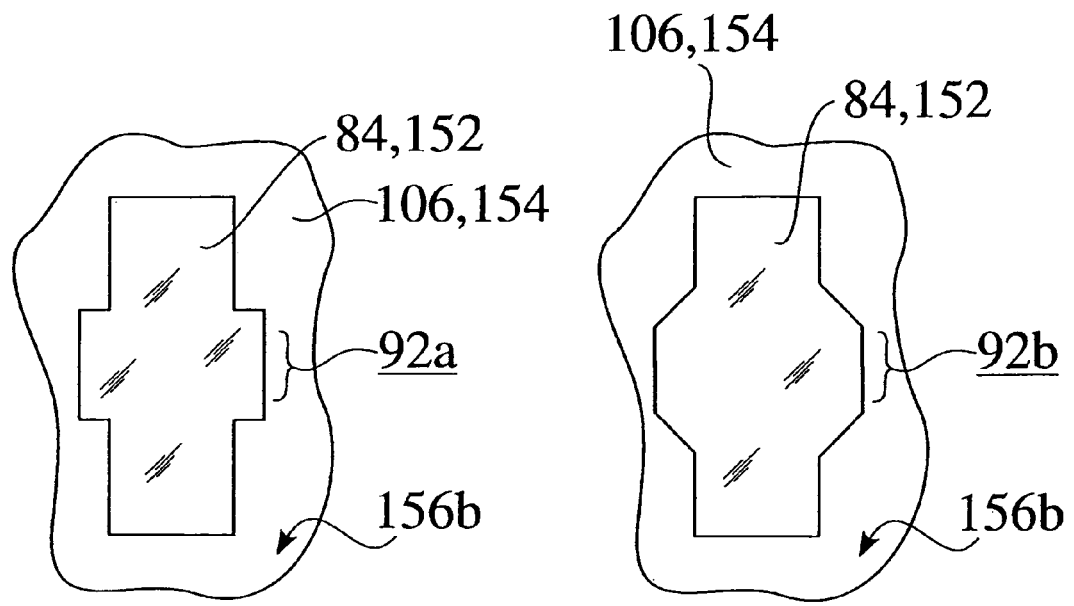
FIG. 32 is a plan view of a contact area of a looped stress metal spring, in which the contact area comprises an expanded rectangular contact region.
FIG. 33 is a plan view of a contact area of a looped stress metal spring, in which the contact area comprises an expanded octagonal contact region.
Figure 34:
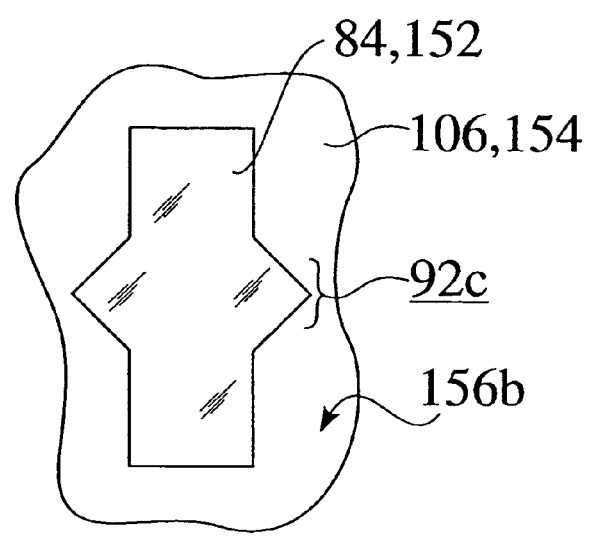
FIG. 34 is a plan view of a contact area of a looped stress metal spring, in which the contact area comprises an expanded diamond-shaped contact region.

FIG. 32 is a plan view of a contact area of a looped stress metal spring 152, in which the contact area 92 which extends beyond the outer surface 156b of the polymer layer 106,154 comprises an expanded rectangular contact region 92a. FIG. 33 is a plan view of a contact area 92b of a looped stress metal spring 152, in which the contact area 92b which extends beyond the outer surface 156b of the polymer layer 106,154 comprises an expanded octagonal contact region 92b.FIG. 34 is a plan view of a contact area 96c of a looped stress metal spring, in which the contact area 92c comprises an expanded diamond-shaped contact region 92c.As the stress metal springs 84,152 are typically comprised of photolithographically formed layers 17, e.g. such as 17a,17b in FIG. 13, the defined contact area 92 can have a variety of geometries, such as to provide dimensional tolerance for the interconnection structure.

Stress Metal Spring Interposer Construction Process

Figure 35:
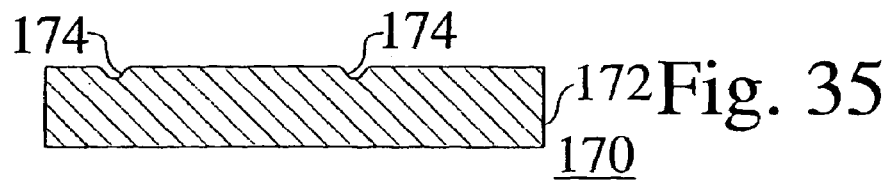
FIG. 35 is view of a first step of a stress metal spring interposer construction process, in which a sacrificial substrate is provided.

FIG. 35 is view of a first step 170 of a stress metal spring interposer construction process, in which a sacrificial substrate 172 is provided. For embodiments of the stress metal spring interposer 151 in which the springs 152 include contact pads 158, 159, the sacrificial substrate 172 includes a pad formation structure 174. The sacrificial substrate 172 can be fabricated from a wide variety of etchable materials, such aluminum or silicon. As described below, the sacrificial substrate 172 is used as a temporary substrate in the fabrication of a spring interposer 151, and is eventually removed, typically by an etching process.

Figure 36:
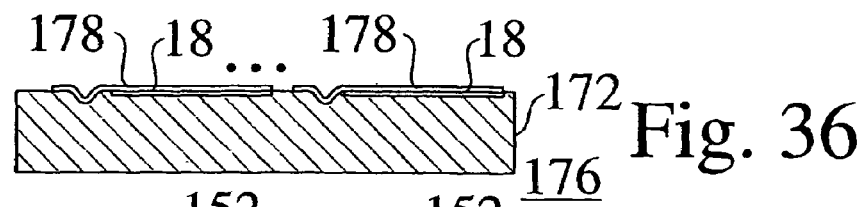
FIG. 36 is a view of a second step of a stress metal spring interposer construction process, in which one or more stress metal spring layers are established on the sacrificial substrate.

FIG. 36 is a view of a second step 176 of a stress metal spring interposer construction process, in which one or more stress metal spring layers 178, such as stress metal layers 17, are established on the sacrificial substrate 172, and in which spring release regions 18 are controllably defined. For some embodiments of the stress metal spring interposer 151 in which the springs 152 include contact pads 158, the successive layers 17 of the spring 152 are formed directly into pad formation structures 174. In alternate embodiments of the stress metal spring interposer 151 in which the springs 152 include contact pads 158, discrete contact pads 159 (FIG. 26, FIG. 27) are formed within pad formation structures 174, such as by a fill and polish process, in which the successive layers 17 of the spring 152 are formed over the discrete contact pads 158.

Figure 37:
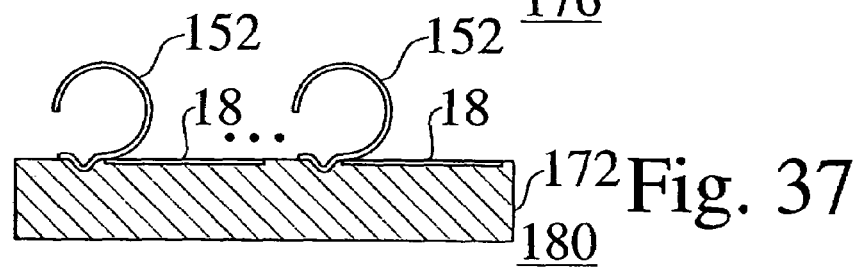
FIG. 37 is a view of a third step of a stress metal spring interposer construction process, in which non-planar portions of the stress metal springs extending from the sacrificial substrate are controllably formed.
Figure 39:
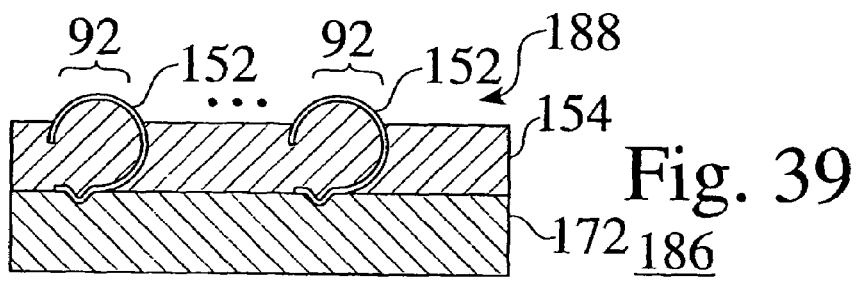
FIG. 39 is a view of a fifth step of a stress metal spring interposer construction process, in which an outer portion of the applied interposer substrate is removed to access upper contact portions of the stress metal springs.

FIG. 37 is a view of a third step 180 of a stress metal spring interposer construction process, in which non-planar portions of the stress metal springs 152 extending from the sacrificial substrate 172 are controllably formed, upon release from the release regions 18. The inherent stress of the metal layers 17 forms a spring having an effective spring angle 30. In the embodiment shown in FIG. 37, the effective spring angle is greater than 180 degrees, e.g. such as 270 degrees, such that the spring 152 has a convex contact surface 92 (FIG. 39).

Various spring shapes and lift can be used, including springs 152 with sharp contact tips 24, which point towards the contact pad surface at various angles 30. The springs 152 provide ultra high-density connectivity between the two different surfaces, while maintaining compliance. Different contact shapes can be fabricated on the contact surfaces, by first defining the desired contact shapes on the substrate material 172.

The stress metal springs 152 shown in FIG. 37 also preferably comprise a plating layer 166 (FIG. 24), which is typically applied to the formed non-planar springs 152, before the formation of the support substrate 154, such as an elastomer 154, such that the plating 166 is applied to the non-planar portions of the stress metal springs 152. Plating 166 can be used for spring strengthening, enhanced conductivity, and/or for corrosion protection.

Figure 38:
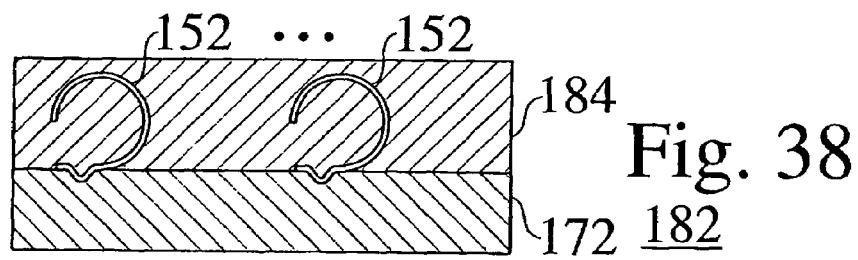
FIG. 38 is a view of a fourth step of a stress metal spring interposer construction process, in which an interposer substrate is applied on the sacrificial substrate and over the stress metal springs.

FIG. 38 is a view of a fourth step 182 of a stress metal spring interposer construction process, in which an interposer substrate 184 is applied on the sacrificial substrate 172 and typically over the stress metal springs 152.

FIG. 39 is a view of a fifth step 186 of a stress metal spring interposer construction process, in which an outer portion of the applied interposer substrate 184 is removed 188 to form a contoured interposer substrate 154, such as by etching, to access upper contact portions 92 of the stress metal springs 152.

Figure 40:
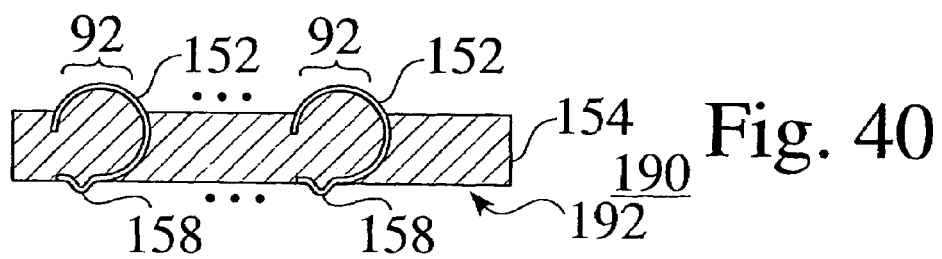
FIG. 40 is a view of a sixth step of a stress metal spring interposer construction process, in which the sacrificial substrate is removed from the interposer substrate, exposing the lower contact portions of the stress metal springs.

FIG. 40 is a view of a sixth step 190 of a stress metal spring interposer construction process, in which the sacrificial substrate 172 is removed 192, such as by etching from the interposer substrate 154, exposing the lower contact portions 158 of the stress metal springs 152.

The spring interposer 151 can be configured for a wide variety of applications, and can be used to provide a high density interface, e.g. such as 50–100 microns. The spring interposer 151 can be fabricated to have a variety of contact area geometries 92 as well, such as a square, rectangle, or circular configurations, based on the desired application.

As well, some embodiments of the spring interposer 151 have an effective spring angle 30 less than 180 degrees, whereby the springs include a contact tip 24 to establish electrical connections. As well, some embodiments of the spring interposer 151 preferably have a planar lower contact region 158. As described above, a boundary layer 161, such as a metal having enhanced conductivity, corrosion resistance, or solderability characteristics (e.g. such as gold, rhodium, or palladium), may also preferably be established as the lowest layer of stress metal layers, such that the boundary layer 161 provides the contact surface 92.

In alternate embodiments of the spring interposer 151, the interposer substrate 154, 184 comprises a plurality of interposer layers 154a,154b (FIG. 26). A first thin layer 154a, comprising a relatively rigid electrically insulative material, such as polyimide, provides increased dimensional control, handleability, and mountability for the interposer 151, while the second interposer layer 154b, typically comprising a relatively non-rigid electrically insulative elastomer, provides enhanced support and compliance for the springs 152. In embodiments of the spring interposer 151 having a composite interposer structure 154, the thin semi-rigid layer 154a may also preferably comprise one or more openings.

Stress Metal Spring Contactor

Figure 42:
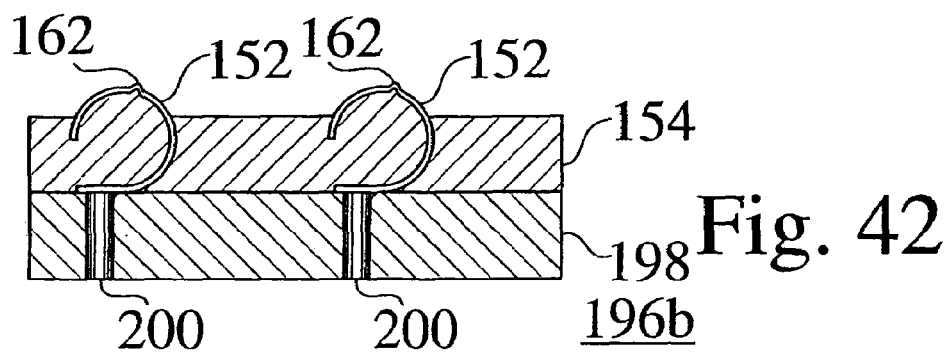
FIG. 42 is a side cross-sectional view of a stress metal spring contactor having bumped contact areas extending from an elastomeric substrate.
Figure 43:
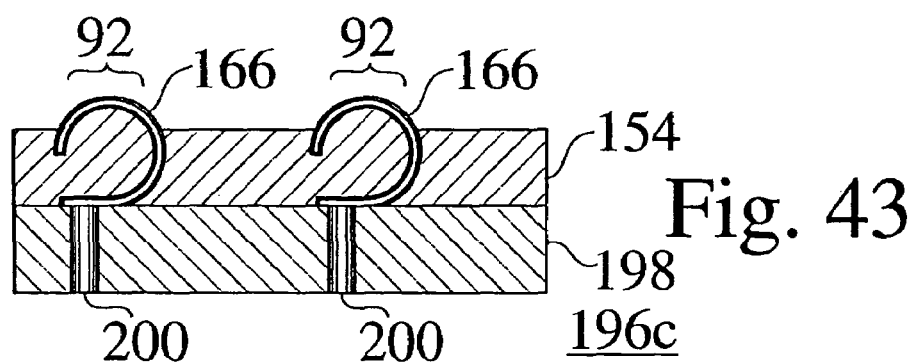
FIG. 43 is a side cross-sectional view of a plated stress metal spring contactor having contact areas extending from an elastomeric substrate.
Figure 44:
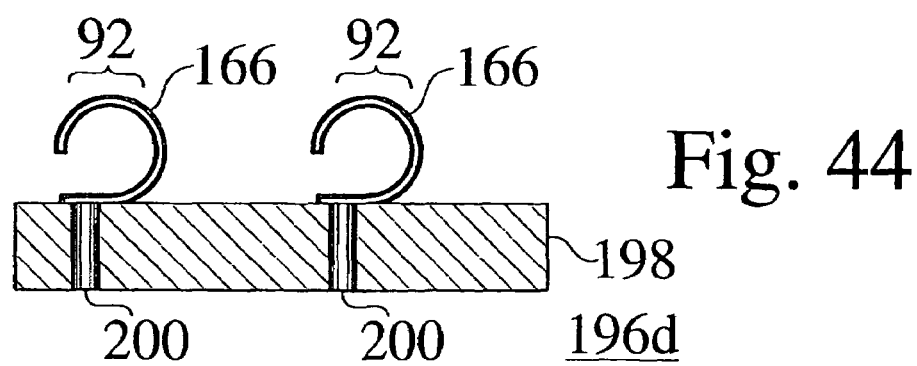
FIG. 44 is a side cross-sectional view of a plated stress metal spring contactor having contact areas extending from the contactor substrate.

FIG. 41 is a side cross-sectional view 194 of a stress metal spring contactor 196a having contact areas 92 extending from an elastomeric support substrate 154, which are electrically connected to vias 200 that extend through a wafer substrate 198. FIG. 42 is a side cross-sectional view of a stress metal spring contactor 196b having bumped contact areas 162 extending from a support substrate 154. FIG. 43 is a side cross-sectional view of a plated stress metal spring contactor 196c having plated contact areas 92 extending from a support substrate 154. FIG. 44 is a side cross-sectional view of a plated stress metal spring contactor 196d having contact areas 92 extending from the contactor substrate 198.

Figure 45:
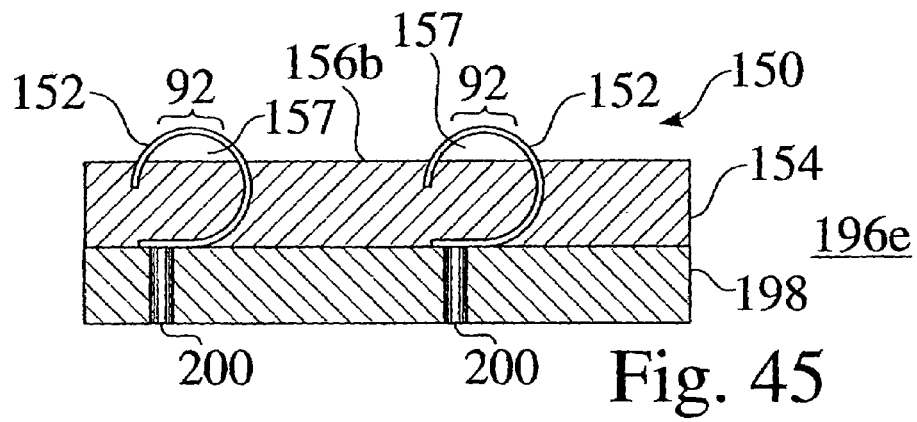
FIG. 45 is a side cross-sectional view of a stress metal spring contactor having looped stress metal springs which partially extend beyond a polymer layer.
Figure 46:
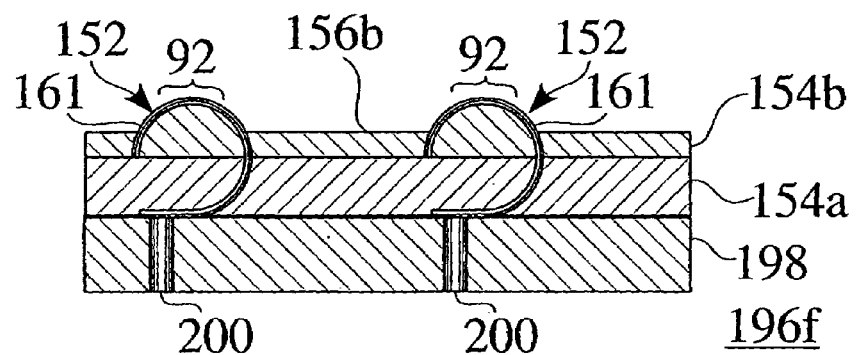
FIG. 46 is a side cross-sectional view of a stress metal spring contactor in which the support layer comprises a plurality of polymer layers.
Figure 47:
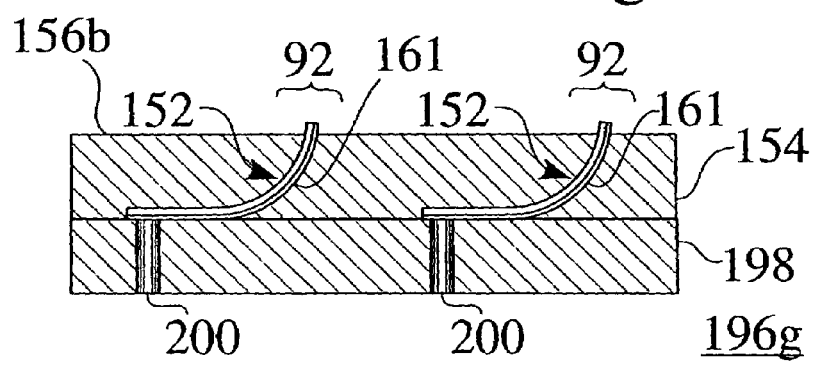
FIG. 47 is a side cross-sectional view of a stress metal spring contactor in which the stress metal springs have an effective spring angle less than 90 degrees.

FIG. 45 is a side cross-sectional view of a stress metal spring contactor 196e having looped stress metal springs 152 which partially extend beyond a polymer layer, defining hollow regions 157 between the contact area 92 of the stress metal springs 152 and the upper surface 156b of the support substrate 154. FIG. 46 is a side cross-sectional view of a stress metal spring contactor 196f in which the support layer comprises a plurality of polymer layers 154a,154b. FIG. 47 is a side cross-sectional view of a stress metal spring contactor 196g in which the stress metal springs 152 further comprise a boundary layer 161, such as gold, rhodium, or palladium, and have an effective spring angle 30 less than 90 degrees.

As seen in FIG. 54, the stress metal spring contactor 196 spring structure can be used for probing solder balls 220 on a bumped wafer, such as to provide a temporary contact to solder bumps on flip chip devices.

Traditional vertical probes, such as the Cobra Probe™ from IBM and the Microspring™ from Form Factor are expensive, and have a long lead time. The stress metal spring contactor 196 can be fabricated using batch processing methods, which decreases the cost of the contactor, and provides a short turnaround time.

Stress Metal Spring Contactor Construction Process

FIG. 48 is a view of a first step 202 of a stress metal spring contactor construction process, in which a spring probe contactor substrate 198 having vias 200 is provided.

FIG. 49 is a view of a second step 204 of a stress metal spring contactor construction process, in which in which one or more stress metal springs 178 are established on the spring probe contactor substrate 198, wherein each of the springs 178 comprise a plurality of layers 17 having different levels of inherent stress. FIG. 50 is a view of a third step 206 of a stress metal spring contactor construction process, in which in which non-planar portions 152 of the stress metal layers extending from the contactor substrate are controllably formed.

FIG. 51 is a view of a fourth step 208 of a stress metal spring contactor construction process, in which the formed non-planar portions of the probe springs 152 extending from the contactor substrate are preferably plated 166. The plating layer 166 is typically applied to the formed springs 152, before the formation of an elastomer support layer 154,184, such that the plating 166 is applied to the non-planar portions of the stress metal 152. Plating 166 is preferably used for contactor embodiments which require spring strengthening, enhanced conductivity, and/or corrosion protection.

FIG. 52 is a view of a fifth step 210 of a stress metal spring contactor construction process, in which a secondary substrate 184 is established over the formed non-planar portions of the probe springs 152 extending from the contactor 198. FIG. 53 is a view of a sixth step 212 of a stress metal spring contactor construction process, in which an outer portion of the applied secondary substrate 184 is removed 214 to established a contoured substrate 154, to access upper contact portions 92 of the stress metal springs 152.

FIG. 54 is a side cross-sectional view 214 of a probe spring contactor 196 having a spring probe contact area 92 extending from the support substrate 154, in which a connection is established between the compliant stress metal spring contactor lead 152 and a printed wiring board (PWB) 216, though a solder ball contact 220 and a board contact 218.

Figure 55:
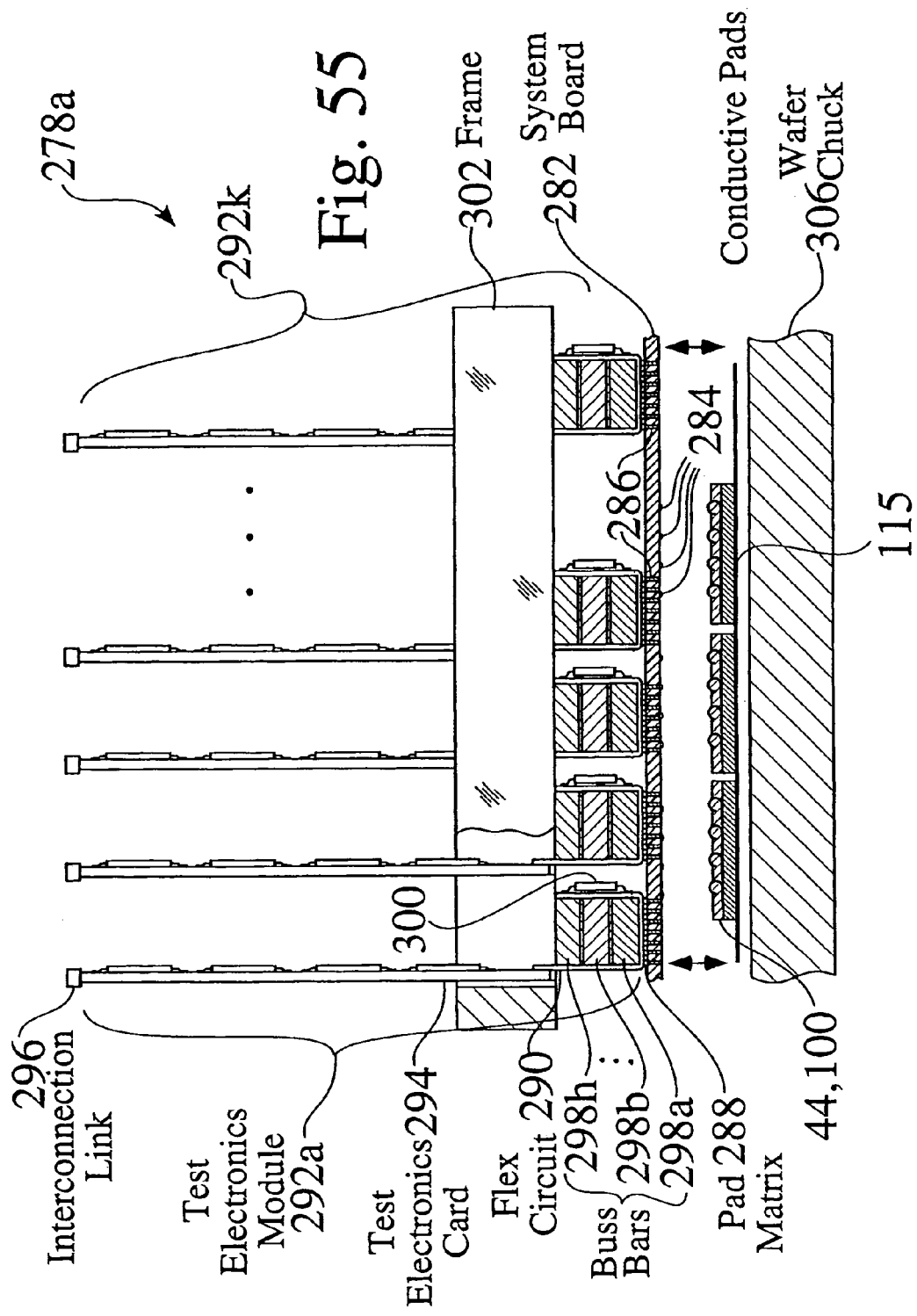
FIG. 55 is a partial cutaway assembly view of a massively parallel test assembly having test electronics located in close proximity to the carrier-mounted integrated circuit devices under test.
Figure 56:
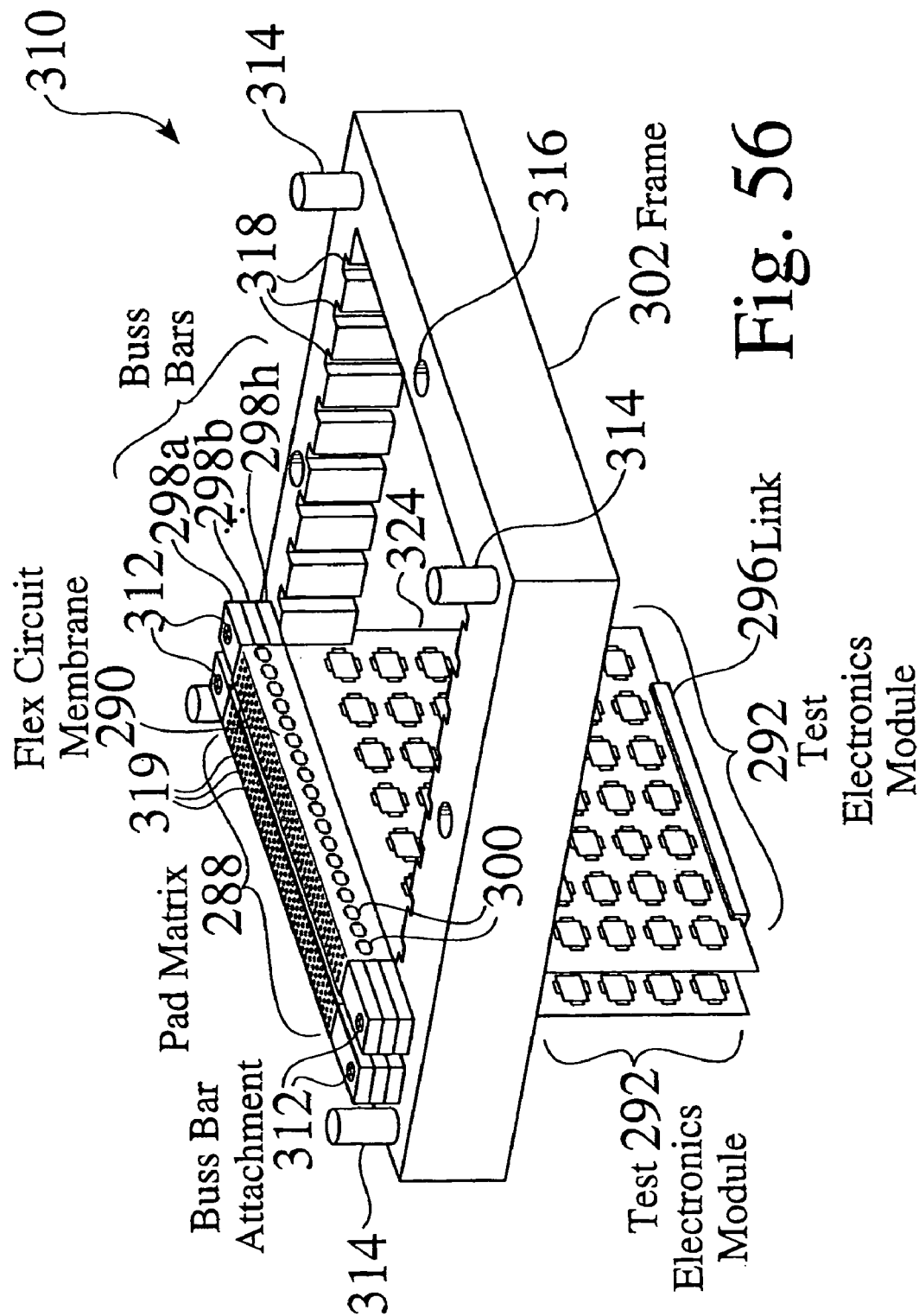
FIG. 56 is a partial perspective view of a massively parallel interconnection assembly.
Figure 57:
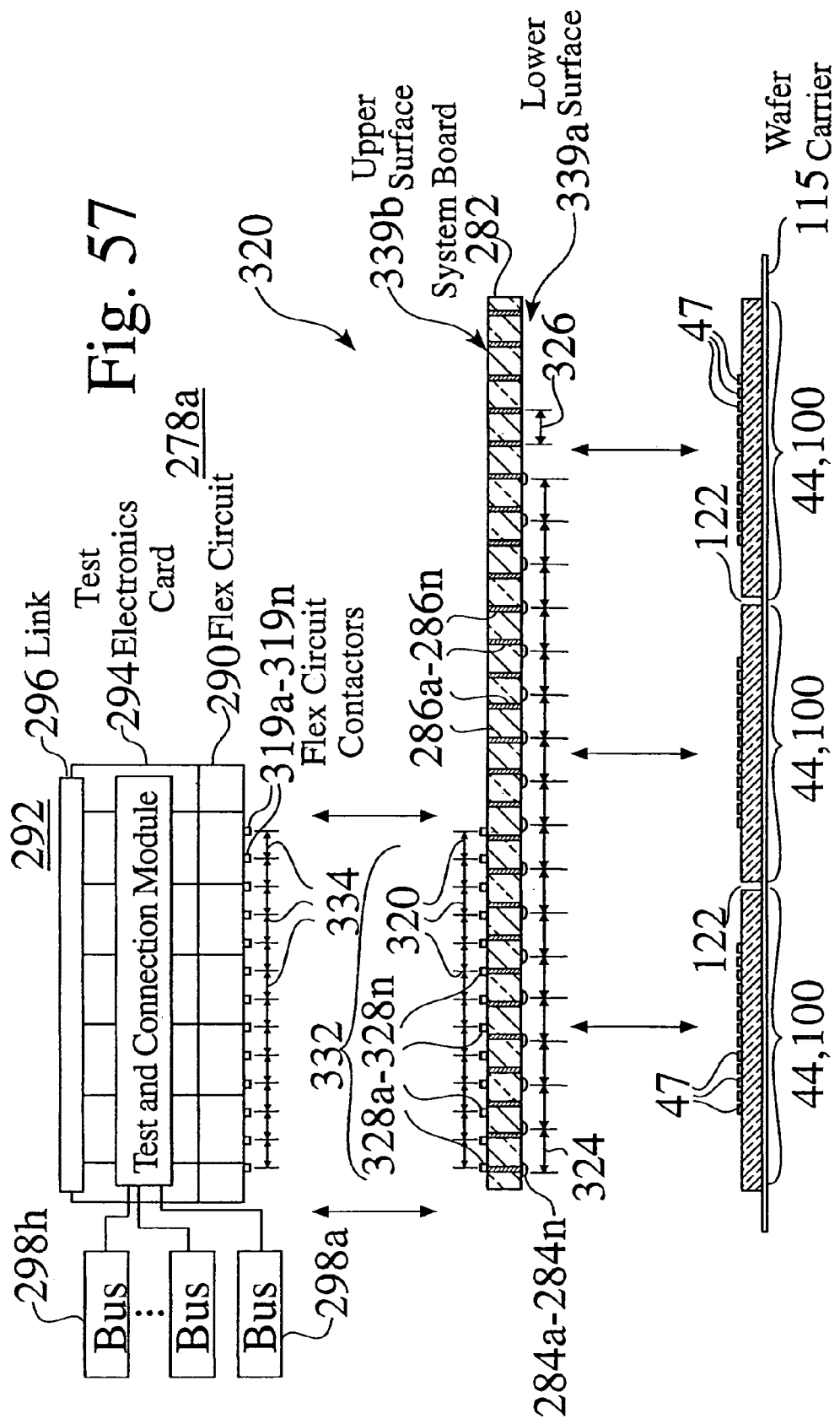
FIG. 57 is a partial expanded cross-sectional view of a massively parallel test assembly having an intermediate system board, which shows staged pitch and distribution across integrated circuit dies on a compliant carrier, a system board, and a flex circuit having a pad matrix.

Massively Parallel Interface Assemblies for Testing and Burn-In of Compliant Wafer Carrier FIG. 55 is a partial expanded cross-sectional view of a massively parallel test assembly 278a having an intermediate system board 282 for connection to separated integrated circuit devices 44,100 on a compliant carrier 115. FIG. 56 is a partial perspective view 310 of a massively parallel interface assembly 278a. FIG. 57 is a partial expanded cross-sectional view 320 of a massively parallel test assembly 278a having an intermediate system board 282, which shows staged pitch and distribution across a system board 282, and a flex circuit 290 having a pad matrix 288 (FIG. 55) of electrical connectors 319a–319n. As shown in FIG. 55 and FIG. 57, the interface assembly 278a is positioned in relation to a compliant wafer carrier 115, having one or more integrated circuits 44, which are separated by IC separation 122 (FIG. 20, FIG. 21). The test structures shown in FIG. 21 and FIG. 55 allow parallel testing and burn-in for separated integrated circuit devices 44,100 which are mounted on a compliant carrier 115. The chip scale packaged devices 44,100 are loosely held together by the compliant carrier 115, and make contact to the system transformer board 282. These devices can be connected as shown to a standard tester, or through a set of electronics, to minimize the number of connections between the separated integrated circuit devices 44,100 and the tester.

The massively parallel interface assembly 278a provides electrical interconnections to each of the integrated circuit devices 44,100 located on the compliant carrier 115, to work effectively in a typical integrated circuit testing environment. The interface assembly 278a is readily used for applications requiring very high pin counts, for tight pitches, or for high frequencies. As well, the interface assembly 278a is easily adapted to provide electrical contact for all traces 46 (FIG. 7) and input and output pads 47 (FIG. 7, FIG. 9) for one or more integrated circuit devices under test 44 on the compliant carrier 115.

The conductive pads 284a–284n on the lower surface of the system board 282 are typically arranged with a pad pitch 324 (FIG. 57), such that the conductive pads 284a 284n are aligned with the electrical contacts 47, such as the contact regions 92 of stress metal springs 84, on the carrier-mounted integrated circuit devices 44,100. The conductive pads 284a–284n on the lower surface of the system board 282 are then routed to conductive paths 286a–286n, which are typically arranged with a system board pitch 326. The electrically conductive connections 328a–328n, which may be arranged within one or more connection regions 332, are located on the upper surface of the system board 282, and are routed to the conductive paths 286a–286n.The electrically conductive connections 328a–328n are typically arranged within the connection region 332, with a system board pad matrix pitch 320, which is typically aligned with the flex circuit pad matrix pitch 334 for each of the test electronics modules 292a–292k (FIG. 55).

The system board matrix pitch 320 is typically chosen such that the electrically conductive connections 328a–328n are aligned with the flex circuit electrical connectors 319a–319n located on the flex circuits 290, which are typically arranged in a plurality of pad matrices 288 (FIG. 56), having a flex circuit pad matrix pitch 334.

The test electronics modules 292a–292k are a basic building block for most of the embodiments of the massively parallel interface test assemblies 278a–278d.The test electronics modules 292a–292k are mounted in parallel (e.g. as seen in FIG. 55), to form an array of modules 292a–292k, which each provide electronics support to one or more columns 339 (FIG. 58, FIG. 59) of integrated circuit devices 44,100 on a compliant carrier 115 or in a wafer form 104, or to a portion of a column 339 or die 44, along which the test electronics modules 292a–292k are mounted.

FIG. 56 is a partial perspective view 310 of a massively parallel interface assembly 278a, wherein test electronics modules 292 are mounted on a frame 302. Each of the test electronics modules 292 shown includes a preferred flex circuit 290, having a pad matrix 288 of electrical contactors 319, and one or more power control modules 300. The flex circuit 290 for each of the test electronics modules 292 is mounted on one or more buss bars 298a–298h, and extends downwardly through the frame 302. The buss bars 298a–298h are attached to the frame 302, such as by electrically isolated fasteners 312, thereby providing a substantially rigid structure. The frame 302 preferably includes test module alignment guides 318, as well as frame to system alignment pins 314 and means 316 for fastening the frame 302 to a wafer chuck 306 (FIG. 55) or to a pressure plate support 134 (FIG. 21). The assembly 310 may also preferably include other means for holding the test electronics modules 292a–292k, such as a card cage (not shown) located below the frame 302.

The separated carrier-mounted integrated circuit devices 44,100 interface to a system board 282, which provides a standard interface to the tester electronics, at a coarser pitch than the contact pitch of the integrated circuit devices 44,100. The system board 282 can be comprised a wide variety of materials, such as ceramic, high density printed wiring board, silicon, glass, or glass epoxy. Each of the tester electronics modules 292a–292n are attached to the system board 282, via a membrane or flex circuit 290.

Contacts 319,328 between test electronics modules 292a–292k and the system board 282 are achieved using solder, pressure contact, or spring probes. For embodiments which use spring probes 319,328, the spring probes may have a variety of tip geometries, such as single point springs 14, interleaved springs 34, or shoulder point springs 50, and are typically fabricated using thin-film or MEMS processing methods, to achieve low manufacturing cost, well controlled uniformity, very fine pad pitches 20, and large pin counts. In some embodiments, the connections 319,328 are built in compliance to photolithographic springs, such as described above, or as disclosed in either U.S. Pat. No. 5,848,685 or U.S. Pat. No. 5,613,861, which are incorporated herein by reference.

The configuration shown in FIG. 55 brings power through the switchable power modules 300, and input/output signal traces 348 (FIG. 62, FIG. 63) from the pin electronics card 294 to the system board 282. This configuration has the advantage of reducing routing congestion in the flex circuit or membrane 290.

The structure of the interface assembly 278a provides very short electrical distances between the carrier-mounted integrated circuit devices 44,100 and the controlled impedance environment in the system board 282, which allows the interface assembly 278a to be used for high frequency applications.

FIG. 58 is an expanded layer plan view of a integrated circuit dies 44 on a wafer 104, a circular substrate 16, and a rectangular system board 282, wherein the intermediate substrate 16 is typically used in test system embodiments wherein an interface assembly 278 is required to be connected to an entire wafer 104, i.e. for integrated circuits which are not separated and mounted to a compliant carrier 115. For substrates 16 which are preferably comprised of silicon (which may be preferably chosen to match the thermal coefficient of expansion (TCE) of a integrated circuit dies 44 under test), the silicon substrate 16 may preferably be fabricated by a similar process to that of a wafer 104, such that the substrate 16 may be fabricated from a circular wafer substrate 16.

As seen in FIG. 58, devices 44, each having a plurality of pads 47, are formed on a wafer 104, and are typically populated across the wafer 104 by a series of rows 337 and columns 339, wherein saw streets 114 are located between the rows 337 and columns 339. For substrates 16 which are preferably comprised of ceramic materials, the silicon substrate 16 may preferably be fabricated from one or more rectangular ceramic substrates 16. The substrate 16 may include a travel limit mechanism, such as one or more upper standoffs located on the connector surface of the substrate 16, such as to limit perpendicular travel of the substrate in relation to the system board 282.

FIG. 59 is an expanded layer plan view of separated integrated circuit dies 44,100 on a compliant carrier 115, which can be directly connected to a system board 282. As described above, the carrier-mounted separated integrated circuit dies 44,100 are typically mounted between the system board 282 and a pressure plate support 134 (FIG. 21).

As can be seen in the system board 282 in FIG. 58 and FIG. 59, the electrically conductive connections 328a–328n, which are located on the upper surface of the system board 282, are typically arranged within one or more connection regions 332, to connect to flex circuit contactors 319 (FIG. 57), which are preferably arranged within a similar number of one or more pad matrices 288 (FIG. 56).

In some preferred embodiments of the massively parallel interface assembly 278, each of the test electronics modules 292 (e.g. 292a) is identical to the other test electronics modules (e.g. 292b–292k), thereby having an identical number of test componentry (thereby having an identical test capacity). In some embodiments of the massively parallel interface assembly 278, a similar number of devices 44 is routed to each test electronics modules 292a–292k.

Figure 75:
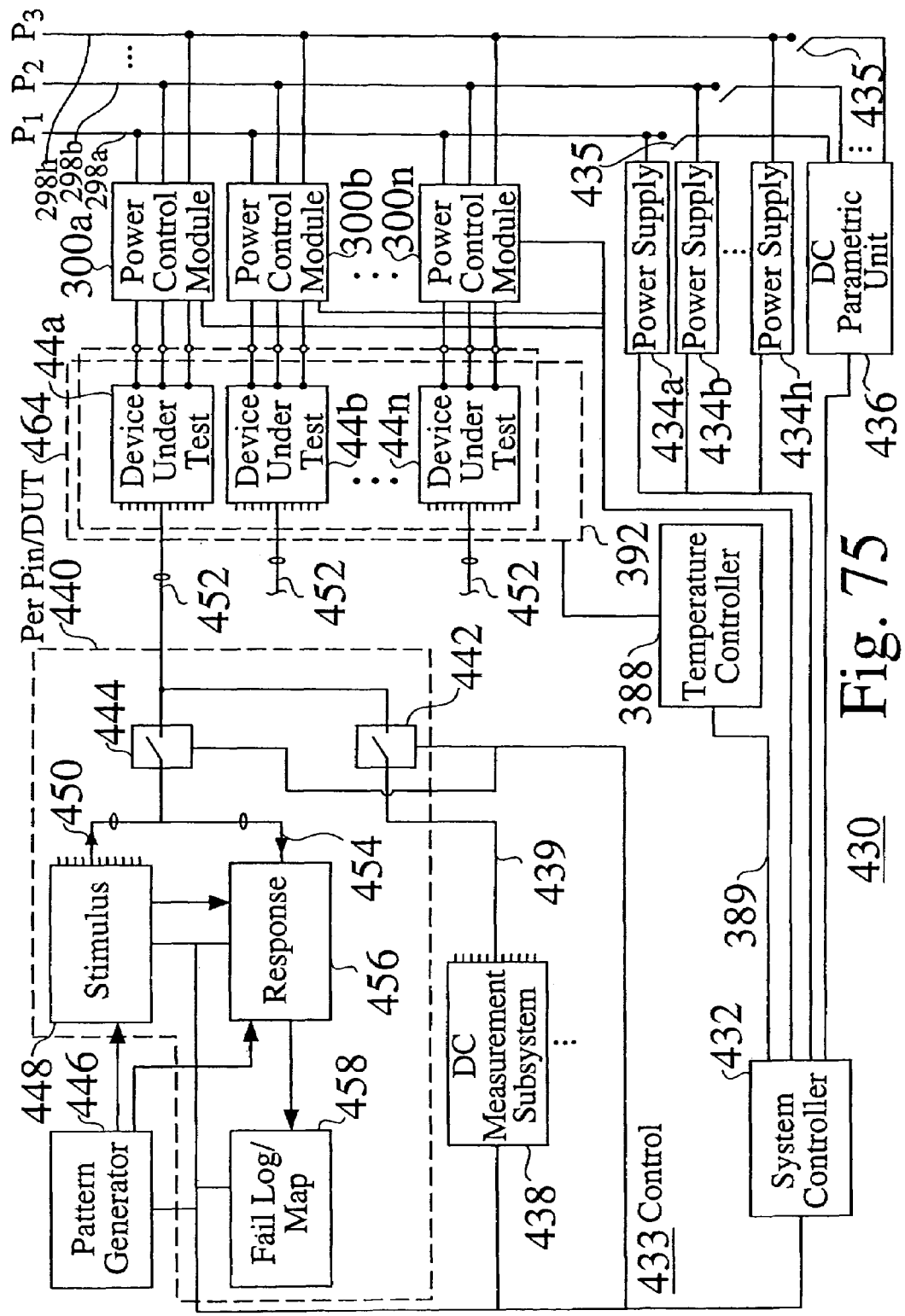
FIG. 75 is a partial schematic block diagram of test circuitry for the massively parallel test system.

In alternate embodiments of the massively parallel interface assembly 278, a different number of devices 44 may routed to a test electronics module 292 (e.g. 292a), such as for outer columns 339 of devices under test 44 on a wafer carrier 115. For a plurality of standardized test electronics modules 292a–292k having an identical number of test componentry, a test electronics module 292 which has a greater capacity than the number of devices 44 which are connected may still be used, typically through programming the test electronics module 292 to bypass testing for unused test circuitry 294, or through system control 430 (FIG. 75).

FIG. 60 is a partial cross-sectional view of one embodiment of the flexible circuit structure 342a, having a polyamide layer 344a, and opposing conductive layers 346a and 346b.FIG. 61 is a partial cross-sectional view of an alternate embodiment of the flexible circuit 290, which comprises a dielectric flex circuit membrane structure 342b, and opposing conductive layers 346a and 346b.In some embodiments of the flex circuit 290, the flex circuit membrane structure 342 is inherently flexible. In alternate embodiments of the flex circuit 290, the flex circuit structure 342 is rigid in regions where one or both conductive layers are substantially located. The controlled removal of the conductive layers 346a,346b produces controlled flexibility for the flex circuit 290, while providing regions of formed conductive paths.

FIG. 62 is a partial perspective view of a flexible membrane circuit structure, wherein a flexible region 290a is defined on the test card structure 294a.FIG. 63 is a partial perspective view of an alternate flexible circuit structure, wherein a flexible circuit 390b is attached to a test card structure 294b by attachments 350 (e.g. such as but not limited to fasteners, heat staking, microwelding, or adhesives).

The test electronics 294a,294b populated on each of the test electronics modules 292a–292k provide stimulus and response detection for one or more devices under test 44. The test electronics 294a,294b are built on a high density interconnect (HDI) substrate 342a,342b, or on a standard printed wiring board 294a, which is connected to the flexible circuit 290. The test electronic card 294a,94b is populated with control and response electronics (e.g. such as test electronics 440 in FIG. 75). Each test electronics module 292 (e.g. 292a) is connected to the backend electronics and computer interface links 296 (e.g. typically by parallel or serial links). Alternatively, the signal pins in the tester electronics modules 292a–292k can be connected serially, on a daisy chain, to simplify the electrical connections, such as to external test hardware. Test vector and setup information is sent to the pin electronics, from a system computer and control electronics (e.g. such as external pattern generator 446 in FIG. 75), through the links 296.

Within each of the test electronics modules 292a–292k, a test electronics card 294 is connected to the flex circuit/membrane 290. Test electronics cards 294 may preferably be fabricated as an integral structure with the flexible circuit 290, such as on an etched thin film substrate, whereby portions of the substrate are etched, to create the flexible membrane circuit 290. In an alternate embodiment of the test electronics module, a separate test electronics card substrate 294 is connected to a flex circuit, typically by solder, wire bond or connectors.

FIG. 64 is a partial cross-sectional view of one embodiment of the flex circuit region 290 of a test electronic module 292, which preferably includes a thermally conductive pathway 354 across a flex circuit 290 between a power control module 300 and one or more buss bars 298. Each of the buss bars 298a–298h, which are typically separately electrically connected to a plurality of external power supplies 434a–434h (FIG. 75), are typically electrically isolated from each other by insulators 352. The insulators 352 may be a separate layer from the buss bars 298a–298h, or may alternately be an electrically insulative layer 352 on the buss bars 298a–298h.

FIG. 65 is a partial cross-sectional view of an alternate embodiment of the flex circuit region 290 of a test electronic module 292, in which one or more power control modules 300a–300h are mounted on the inner surface of the flex circuit 290, and are positioned in thermal contact with a plurality of buss bars 298a–298h.

FIG. 66 is a partial cross-sectional view of a second alternate embodiment of the flex circuit region 290 of a test electronic module 292, in which a power control module 300 is electrically connected to the outer surface of a flex circuit 300. A power control access region 356 is preferably defined through the flex circuit region 290, whereby the power control module 300 positioned in intimate thermal contact with a buss bar 298 (e.g. such as buss bar 298b).

One or more power and ground bus bars 298a–298h are used to distribute power to all the devices under test 44. Power control modules 300, typically comprising decoupling capacitors, switching control circuits and regulators for each device under test 44, are preferably mounted on the flex circuit 290, as shown in FIG. 64, FIG. 65, or FIG. 66.

Figure 67:
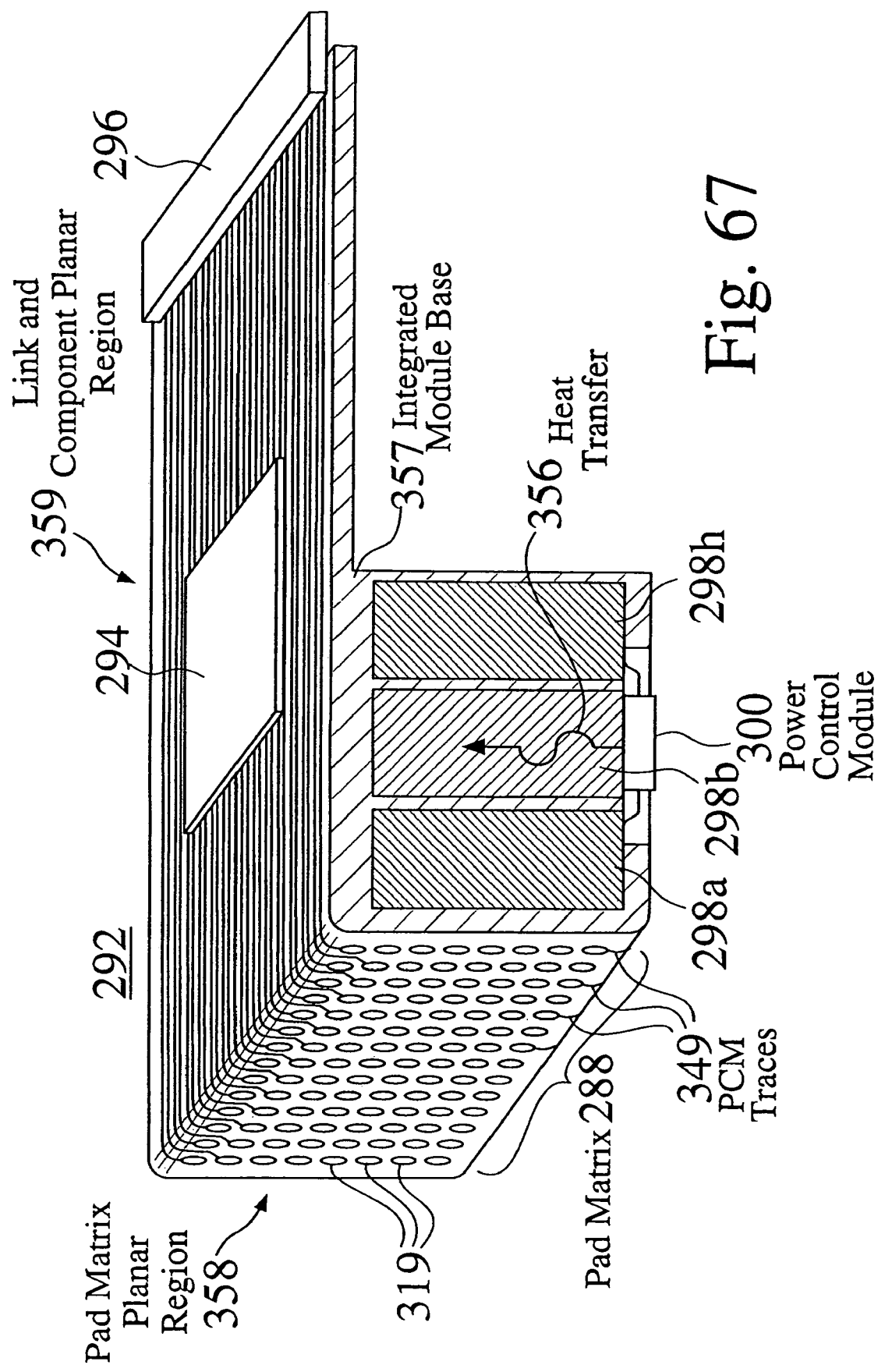
FIG. 67 is a perspective view of an alternate embodiment of a test electronics module, in which an integrated module base provides a pad matrix on a first planar region, and in which a power module is electrically connected to the pad matrix and to one or more buss bars, and is positioned in thermal contact with a buss bar.

While some preferred embodiments of the test electronics modules 292a–292k include flex circuit structures 290, the unique interface structure provided by the flex circuit structure 290 may alternately be achieved by other suitable interface designs. FIG. 67 is a perspective view of one alternate embodiment of a test electronics module 292, in which an integrated module base 357 provides a pad matrix 288 of electrical contacts 319 on a pad matrix planar region 358. One or more power control modules 300 are electrically connected to electrical contacts 319 located on the pad matrix 288, through power control module (PCM) traces 349, and to one or more buss bars 298a–298h.The power control modules 300 are also preferably positioned in thermal contact with one or more buss bars 298a–298h.Signal traces 348 (FIG. 62, FIG. 63) are also connected to electrical contacts 319 located the pad matrix 288. The signal traces 348 extend across a link and component planar region 359, and are either connected to test electronics 294, or extend to link 296.

In the various embodiments of the test electronics modules 292, one or more bus bars 298 provide the power and heat sink paths for the power control modules 300. Power for devices under test 44 is typically provided through separate rail buss bars 298, or may alternately share the same rail buss bars 298 with the power control modules 300. The power rail buss bars 298 also preferably provide mechanical support for the flex circuit 290 and the system board 282 and/or the test electronics cards 294a–294k.In some embodiments of the test electronics modules 292a–292k, the power control module circuits 300 are connected in the serial scan path, to provide individual power and ground control to the devices under test 44.

Alternate Massively Parallel Test Assemblies

Figure 68:
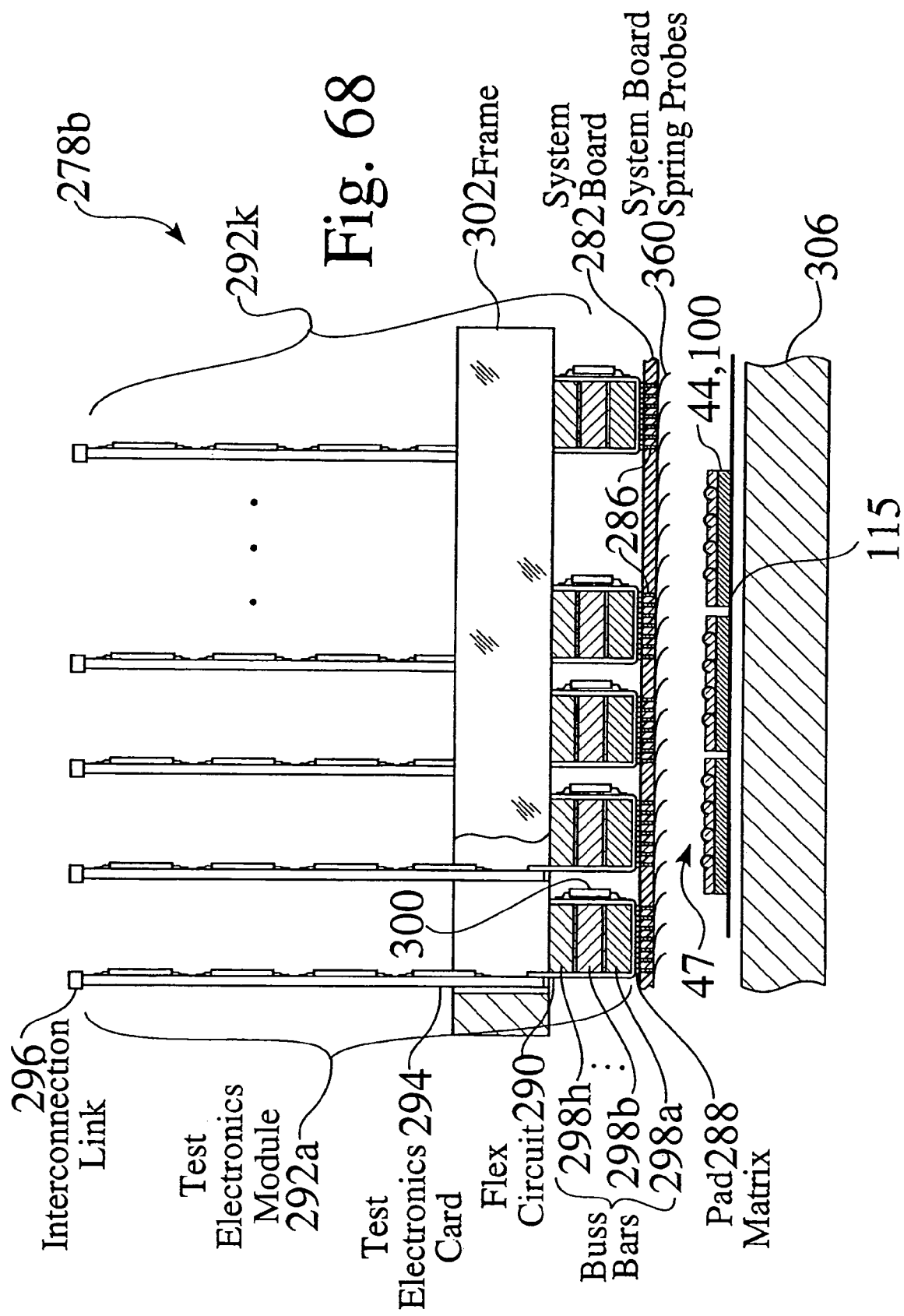
FIG. 68 is a partial cutaway assembly view of an alternate massively parallel test assembly having an intermediate system board, in which flexible spring probes are located on the lower surface of the system board.

FIG. 68 is a partial cutaway assembly view of an alternate massively parallel test assembly 278b having an intermediate system board 282, in which flexible spring probes 360 are located on the lower surface 339a (FIG. 57) of the system board 282. The structure and features of the massively parallel test assembly 278b are otherwise identical to the massively parallel test assembly 278a shown in FIG. 55. The system board spring probes 360 can be used to provide planarity compliance between the system board 282 and the carrier-mounted integrated circuit devices 44,100, and provide high quality electrical connections, over a wide range of temperatures.

Figure 69:
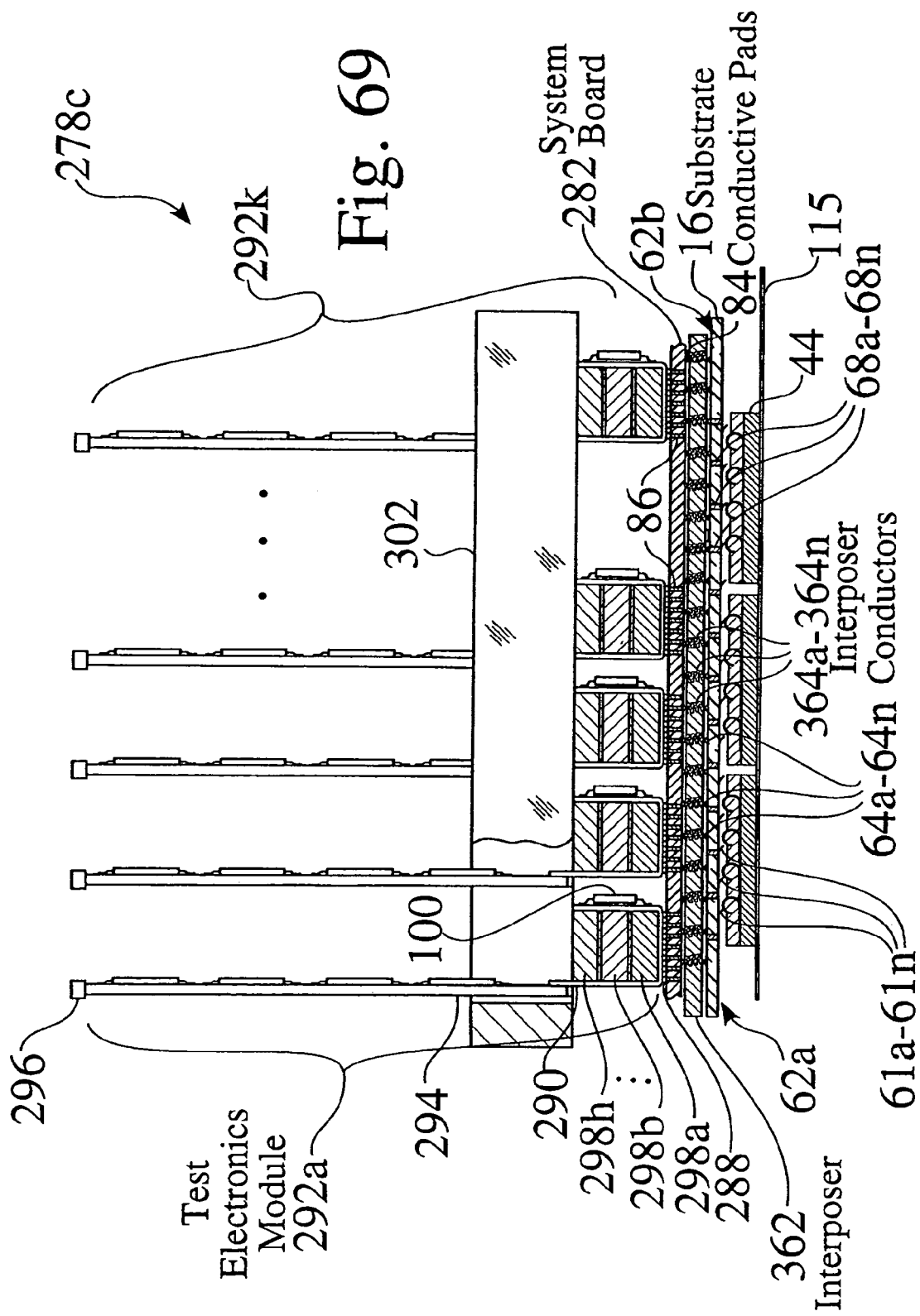
FIG. 69 is a partial cutaway assembly view of another alternate massively parallel test assembly having an intermediate system board, in which an interposer structure provides electrical connections between the substrate and the system board.

FIG. 69 is a partial cross-sectional view of an alternate interface assembly 278c, wherein a large grid array (LGA)

interposer connector 362 is located between a substrate 16 and the system board 282. The LGA interposer connector 362 provides a plurality of conductors 164a–164n between the electrical connections 64a–64n on the substrate 16 and plurality of conductive pads 284a–284n on the lower surface of the system board 282. In one embodiment, the LGA interposer connector 362 is an AMPIFLEX™ connector, manufactured by AMP, Inc., of Harrisburg Pa. In another embodiment, the interposer connector 362 is a GORE-MATE™ connector, manufactured by W. L. Gore and Associates, Inc., of Eau Clare, Wis. In another alternate embodiment, a pogo pin interposer 362 is used to connect opposing conductive pads 284a–284n on the system board 282 to electrical connections 64a–64n on the substrate 16.

Figure 70:
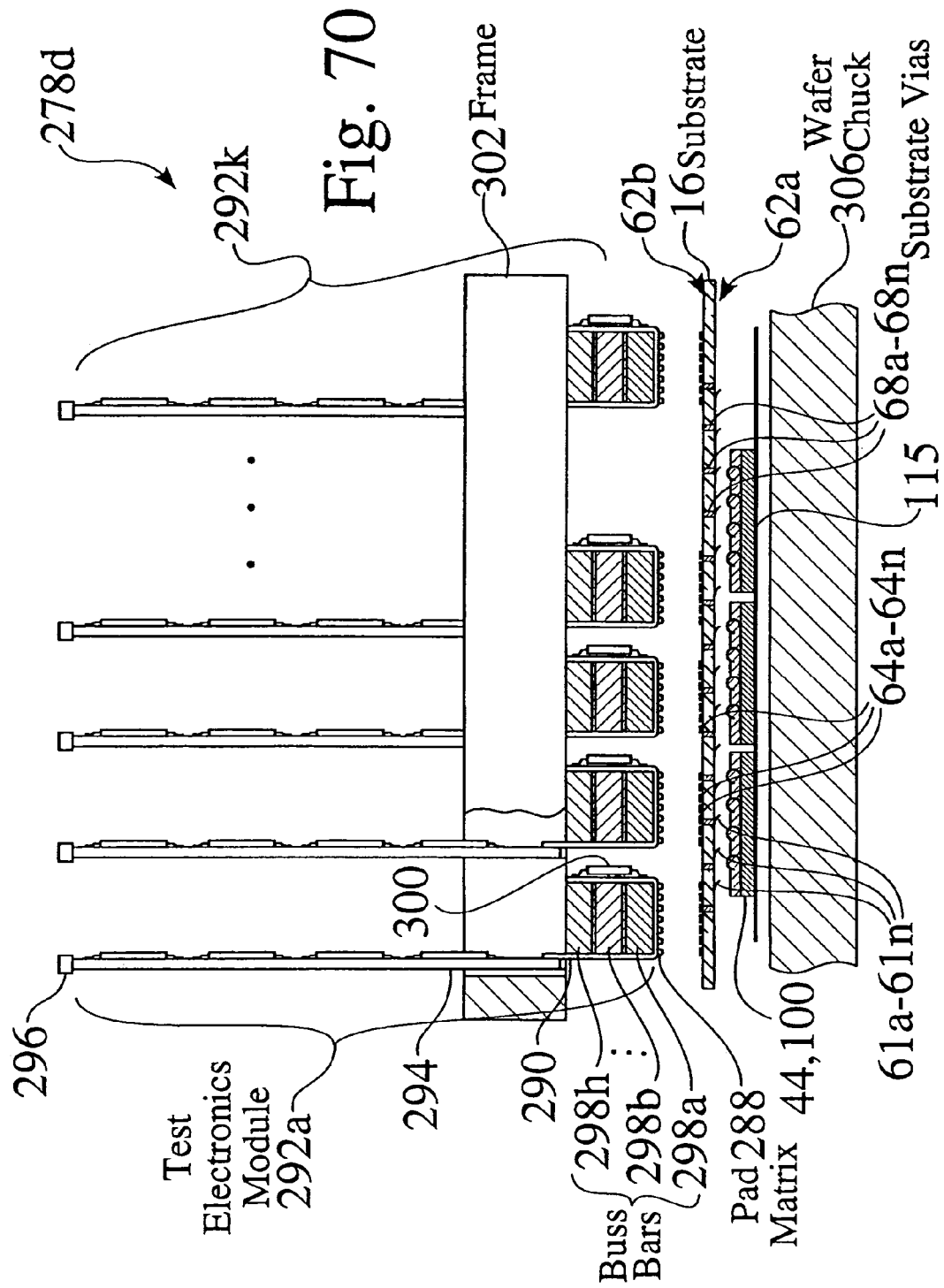
FIG. 70 is a partial cutaway assembly view of a basic massively parallel test assembly, in which a substrate having spring probes is directly connected to the test electronics modules.
Figure 71:
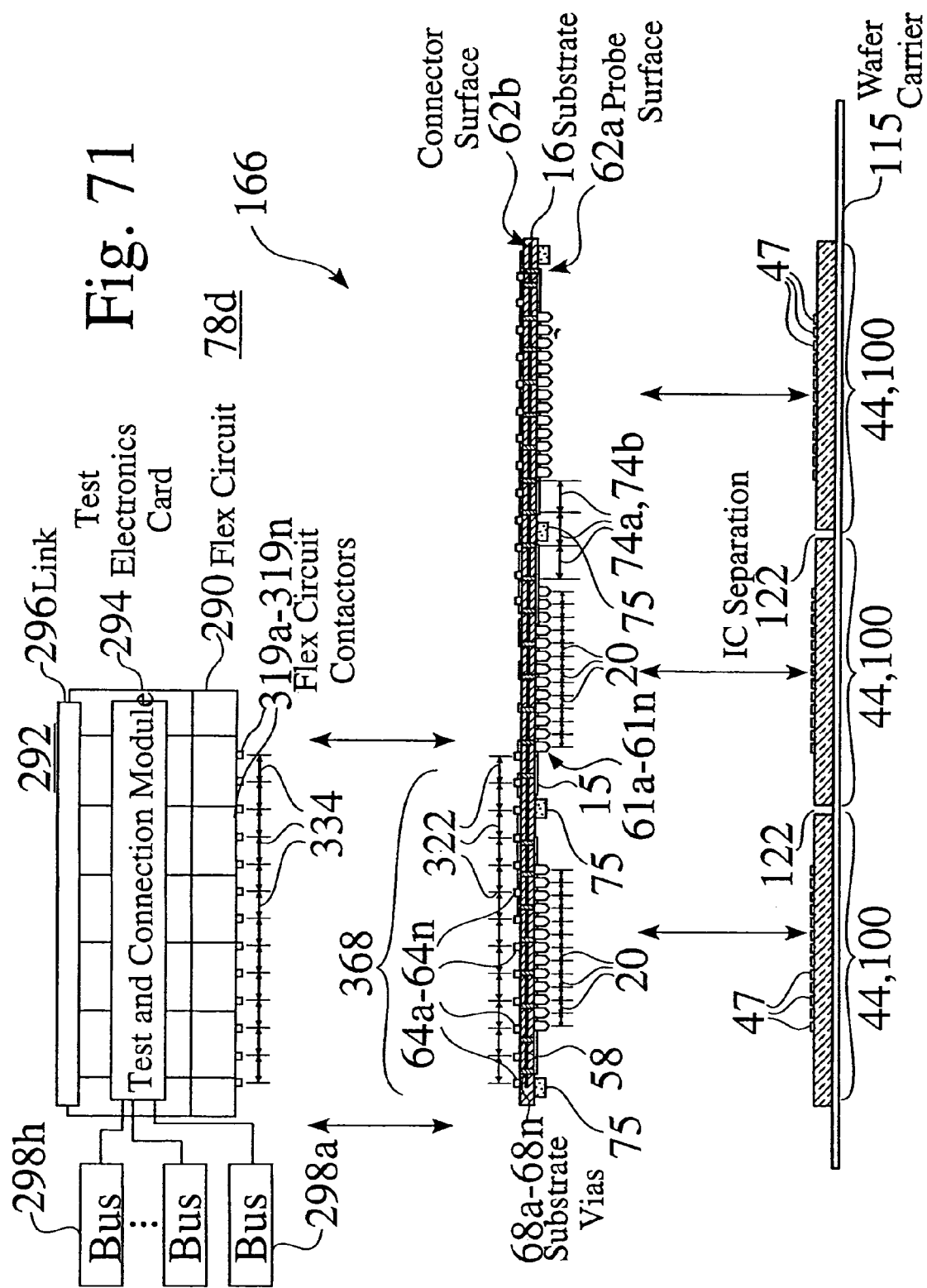
FIG. 71 is a partial expanded cross-sectional view of a basic massively parallel test assembly, which shows staged pitch and distribution across a substrate and a flex circuit having a pad matrix.

FIG. 70 is a partial cutaway assembly view of a basic massively parallel test assembly 278d, in which a substrate 16 has spring probes 61a–61n on a lower probe surface 62a, and vias 68a–68n which are connected between the spring probes 61a–61n and conductors 64a–64n located on an upper surface 62b of the substrate 16, wherein the substrate 16 is directly connected to the test electronics modules 292a–292k. FIG. 71 is a partial expanded cross-sectional view 366 of the basic massively parallel test assembly 278d, which shows staged pitch and distribution across a substrate 16 and a test electronics module 292 having a pad matrix 288 of electrical contactors 319.

Figure 72:
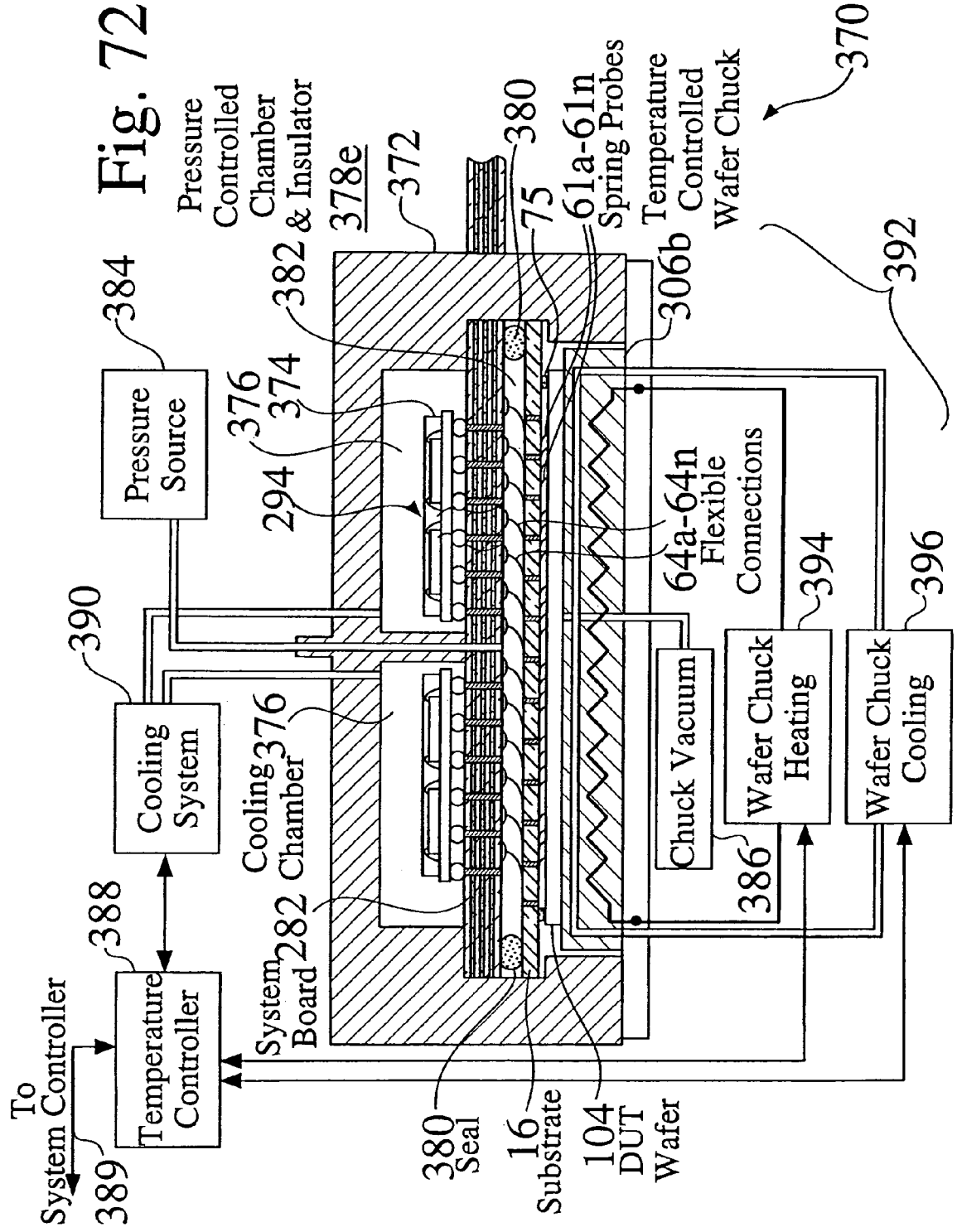
FIG. 72 is a partial cutaway assembly view of a massively parallel burn-in test assembly, in which burn-in test modules are connected directly to the system board, and in which separate temperature control systems are provided for the wafer-mounted integrated circuit devices under test and for the test electronics modules.

FIG. 72 is a partial cross sectional view 370 of an alternate massively parallel interface assembly 378e, which shows one embodiment of a basic clamping structure 372. The interface assembly 378e is typically intended for burn-in testing only, whereby test electronics 294 are packaged in small modules 374. The modules 374 are mounted directly onto the system board 282, and are preferably used for burn-in testing, which typically requires significantly less test electronics than the test electronics modules 292a–292k (e.g. such as shown in FIG. 55). The clamping structure 372 shown in FIG. 72 may also be used for the wafer level massively parallel interface assemblies 278.

For the massively parallel interface assembly 378e shown in FIG. 71, the interposer substrate 16 is preferably fabricated from a thin substrate 16, such as a 10 mil thick glass plate, whereby the substrate 16 may flex slightly, to conform to the surface of integrated circuit dies 44 on a wafer 104, to accommodate for non-planarity or bowing between the wafer and the interposer substrate 16.

A seal 380 around the periphery of the interposer substrate 16 preferably provides an air-tight chamber 382. Air pressure is preferably applied between the system board 282 and the interposer substrate 16. An applied pressure 384 also thermally isolates the integrated circuit dies 44 on a wafer 104 from the test electronics 374,294. While integrated circuit dies 44 are typically required to operate at elevated temperatures during burn-in testing (e.g. such as at 125–160 degrees Celsius), the test electronics 294 should preferably operate at a lower temperature (e.g. such as below 75 degrees Celsius).

The wafer chuck 306, such as wafer chuck 306b in FIG. 72, preferably includes a wafer thermal control system 392, which preferably comprises a wafer heating system 394 and/or a wafer cooling system 396, such as to provide temperature control to the wafer under test 104. The wafer thermal control system 392 is preferably controlled by a test system temperature controller 388, which is typically linked 389 to the system controller 432 (FIG. 75).

The test electronics 374,294 are preferably located in one or more cooling chambers 376. A cooling system 390 is preferably used to control the operating temperature of the test electronics 374,294 within the cooling chambers 376, and is also preferably controlled by the test system temperature controller 388.

A wafer loading vacuum circuit 386, having vacuum tracks 408 (FIG. 73), is preferably built into the wafer chuck 306, to provide vacuum suction to hold the wafer 104 in position, and to improve planarity between the substrate connector 16 and the wafer 104.

Test System Architecture

The test system consists of an alignment set up, which performs wafer alignment, cooling unit, and tester electronics. The alignment subsystem and cooling units can be built with technology known in the art.

System Alignment

Figure 73:
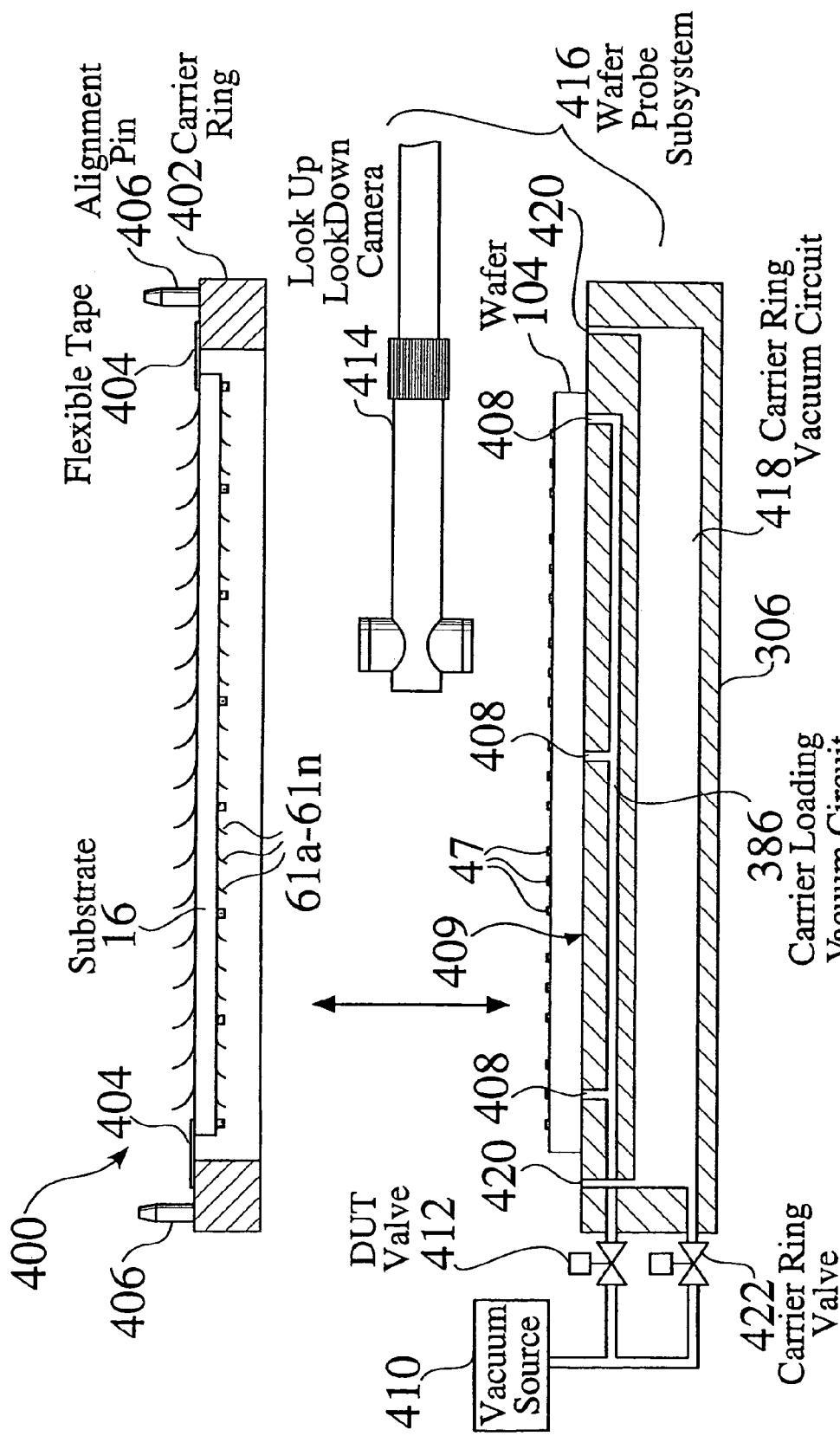
FIG. 73 is a first partial expanded cross-sectional view showing massively parallel test assembly and alignment hardware and procedures.
Figure 74:
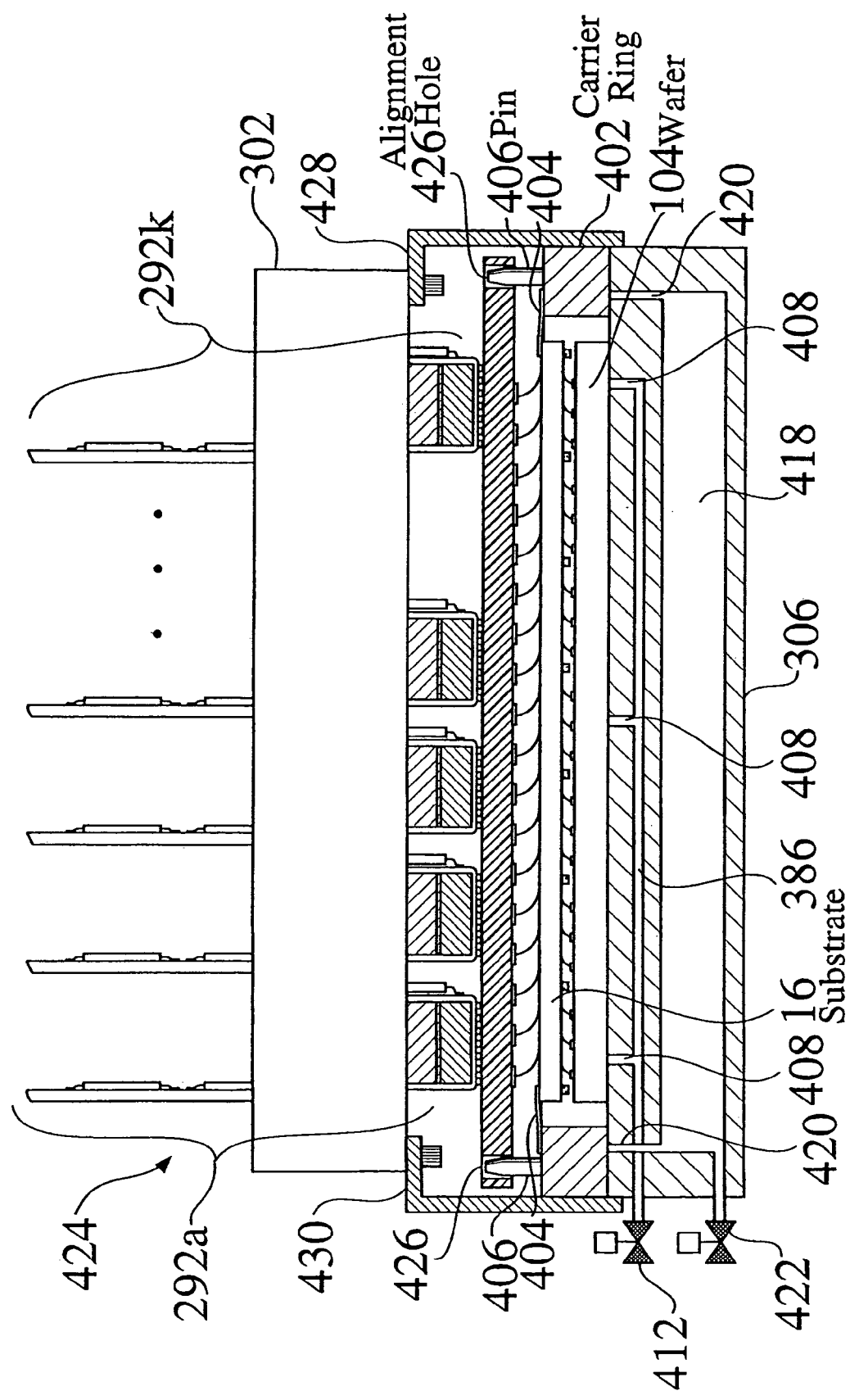
FIG. 74 is a second partial expanded cross-sectional view showing massively parallel test assembly and alignment hardware and procedures.

FIG. 73 is a first partial expanded cross-sectional view showing massively parallel test assembly 400 and alignment hardware and procedures for wafers 104. The test assembly 400 includes a carrier ring 402, which preferably includes one or more alignment features, such as alignment pins 406, whereby the carrier ring 402 may be aligned to a system board 282. The system board 282 preferably has mating alignment features, such as alignment holes 426 (FIG. 74).

A substrate 16 is releaseably mounted to a carrier ring 402, such as by a flexible tape 404 (e.g. such as a ring-shaped KAPTON™ tape), whereby the electrical connections 64a–64n (e.g. such as seen in FIG. 71) on the connector surface 62b of the substrate 16 are aligned to the alignment pins 406, such that the electrical connections 64a–64n on the connector surface 62b of the substrate 16 may be aligned to the conductive pads 284a–284n (FIG. 57) on the lower surface of the system board 282.

The wafer chuck 306 preferably includes a wafer loading vacuum circuit 386, having one or more wafer loading holes 408 on a wafer loading surface 409. The wafer loading vacuum circuit 386 is connectable to a vacuum source 410, and may be sealed by wafer loading vacuum circuit valve 412. A wafer to be tested 304 is placed onto the wafer chuck 306, and is held in place by a applied vacuum applied through the wafer loading holes 408.

A substrate 16, mounted on a carrier ring 402, which is to be mounted to the wafer chuck 306, is controllably positioned over the wafer 104, which is held in place by vacuum applied to the wafer chuck 306. The substrate 16 and the integrated circuit dies 44 are then accurately aligned, such as by a lookup/lookdown camera 414 within a modified wafer probe system 416, whereby the probe springs 61a–61n on the probe surface 62a (FIG. 57) of the substrate 16 are brought into alignment with the die pads 47 on the integrated circuit dies 44. Alignment is typically achieved, either by looking at spring tips 24 (FIG. 2), or at alignment marks 77 (FIG. 14) printed on the substrate 16.

The wafer chuck 306 also preferably includes a carrier ring vacuum circuit 418, having one or more carrier ring vacuum holes 420. The carrier ring vacuum circuit 418 is also connectable to a vacuum source 410, and may be sealed by carrier ring vacuum circuit valve 422. Once the substrate 16 and the integrated circuit dies 44 to be tested are accurately aligned, the lookup/lookdown camera 414 is removed, and the carrier ring 402 is controllably moved onto the wafer chuck 304, whereby the substrate 16 is accurately positioned over the wafer 104, such that the probe springs 61a–61n on the probe surface 62a of the substrate 16 contact the die pads 47 on the integrated circuit dies 44. The carrier ring 402 is held in place by a vacuum applied through the carrier ring vacuum holes 420.

The wafer loading vacuum circuit valve 412 and the carrier ring vacuum circuit valve 422 are then closed, such that the applied vacuum to the wafer loading vacuum circuit 406 and the carrier ring vacuum circuit 418 is maintained, while the entire test assembly can be handled as a unit, for mounting to the system board 282 and test electronics modules 292a–292k.In alternate embodiments of the wafer loading vacuum circuit 406 and the carrier ring vacuum circuit 418, a single valve is used to apply a sealable vacuum to both vacuum circuits 406,418. To enhance the vacuum sustaining ability after the vacuum circuit valves 412 and 422 are closed, each circuit 406,418 preferably includes a vacuum chamber, which serves to maintain the vacuum level over time.

FIG. 74 is a second partial expanded cross-sectional view showing massively parallel test assembly and alignment hardware and procedures 424, whereby a massively parallel interface test assembly 278 may be assembled into a system which may then be used for wafer testing. As described above, the system board 282 preferably includes a means for alignment 426 to the carrier ring and/or to the wafer chuck 306, such as alignment holes 426. The system board 282, which is mounted to the test electronics modules 292a–292k and the frame 302, is then positioned over the carrier ring 402, such that the alignment pins 406 engage the alignment holes 426. A means for attachment 428 is then typically provided, such as between the frame 302 and the wafer chuck 306 or the carrier ring 402, thus completing the assembly structure.

While accurate means (e.g. such as optical alignment) is typically used to align the fine pitch probe springs 61a–61n to the fine pitch pads 47 on the integrated circuit dies 44 to be tested, the mechanical alignment provided between the carrier ring 402 and the system board 282 (e.g. such as between alignment pins 406 and holes 426) is typically sufficient for the distributed electrical connections 64a–64n and pads 284a–284n, which preferably have larger features, and preferably have coarser pitches 322,324, respectively. As well, the flex circuit pitch 334 on the pad matrix is relatively large (e.g. on the order of 1 mm), making alignment between the test electronics modules 292a–292k and the system card 282 relatively easy using similar conventional mechanical alignment techniques.

Tester Electronics

FIG. 75 is a partial schematic block diagram of test circuitry 430 for the massively parallel interface test systems 278. The tester electronics 430 consists of but not limited to a control computer 432, a power subsystem, test electronics modules 292a–292k, DC parametric and measurement systems 436,438, and control electronics.

As seen in FIG. 75, a test electronics module 292 is typically connected to a group 464 of one or more integrated circuit dies 44,100 to be tested which are mounted on a compliant carrier 115, e.g. such as but not limited to a column 339 of devices under test 44,100.

The test electronics modules 292a–292k each provide stimulus signals 450 to the devices under test (DUT) 44,100, monitor the responses 454, and store the device under test pass or fail information 458 within the tester memory, or transfer the device under test pass or fail information 458 to the system controller 432.

For example, in memory testing, a test electronics module 292 has all the critical functions of a memory tester. This includes the hardware pattern generator 446 to drive the memory devices under test 44,100 connected to the same test electronics module 292, in parallel. Response detection and fail detection circuits in the test electronics module 292 records the fail locations for each device under test 44,100, as needed.

The test electronics modules 292 are preferably software re-configurable and programmable, making it possible to configure the test electronics modules 292 for a specific DUT design or test function. A built-in self-test (BIST) engine can also be integrated into the test electronics modules 292, such as to provide additional test features.

Each test electronics module 292 also provides analog multiplexing functions, to route the intended DUT pin 47 to the digital test electronics in the test electronics module 292, or to one or more DC measurement subsystems 438, which perform analog measurements of the output signals 454.

Sample Test Sequence

After the carrier-mounted integrated circuit dies 44,100 to be tested are loaded, aligned, and engaged, the system controller 432 sends a control signal to all the power control modules 300, to connect all power and ground pins 47 for a device under test (DUT) 44,100 to ground, except for a selected pin 47 to be tested, which is controllably connected to the DC parametric unit 436. The power supplies 434a–434h are disconnected from the power buses 298a–298h.The power pin integrity of the selected device 44,100 is then determined, through the DC parametric unit 436.

The DC parametric unit 436, which is connected to the power rails 298a–298h, via relay or solid state switches 435, is then programmed, to check for power to ground shorts. The same sequence is repeated for every power pin on every device under test 44,100.

Similar testing is performed on the DUT input and output pins 47, through the test electronics card 294, to determine short circuits and open circuits for a selected device under test 44,100. An open connection for a device under test 44,100 is typically detected by the absence of a parasitic diode in the input and output pins 47 of the device under test 44,100, as is commonly practiced in the art.

Upon the completion of setup testing, the integrity of the connections and the status of each device pin 47 is determined, in regard to open or short circuits. An excessive number of measured open circuits for one or more devices under test 44,100 on a wafer carrier 115 may be due to an originally defective wafer 104, to system setup, or to one or more defective devices under test 44,100.

The test circuitry 430 preferably provides diagnostic capabilities, to further diagnose faults. Shorts can be isolated from the power busses 298 and pin test electronics 294, by scanning the appropriate bit control pattern into the power control module 300 and pin test electronics module 292.

The remaining devices to be tested 44,100 can then be powered up, and tested in parallel. Short circuit detection and report circuitry is preferably built into each power control module 300, such that a particular device under test 44,100 may be disconnected, if a short circuit is developed in the device under test while the device 44,100 is tested. Other features, such as but not limited to transient device current testing circuitry, may preferably be included within the power control module 300, such as to provide additional test coverage.

Power Pin Testing

The system controller 432 selectively switches on the power connections to one or more devices under test 44,100. With the power supplies 434a–434h turned off (disconnected), a device under test 44,100 can be tested for open circuits and short circuits, using the DC parametric unit 436.

I/O Pin Testing

Similarly, the input and output pins 47 on a device under test 44,100 can be tested for leakage, open, shorts, through the system controller 432.

Device Functional Testing

With test results from power pin testing and I/O pin testing, for any devices under test 44,100 which have failed (e.g. due to power), the input and output pins 47 for the failed devices 44,100 are typically isolated from the tester common resources. The remaining devices under test 44,100 which have passed power pin testing and I/O pin testing are then powered up, and may then be tested in parallel.

Functional Testing

The stimulus unit 448 and pattern generator 446 generate the input pattern 450 to the device under test 44,100. The DUT response 454 is captured in the response block 456, which compares the device under test 44,100 output with the expected value from the pattern generator 446 or stimulus unit 448. A pattern generator 446 is commonly used in memory testing, whereas a truth table representing the device stimulus 450 and expected response 454 can be stored in the pattern memory of the stimulus unit 448 for logic device testing. A fail map or log 458 is maintained for each die 44,100. While FIG. 75 portrays one embodiment of the functional schematic of, the pattern generation and stimulus/response system architecture, other pattern generation and stimulus/response system architectures may suitably be used to meet the testing requirements of a device under test 44, as is commonly practiced in the art.

Alternate Interface Embodiments

Figure 76:
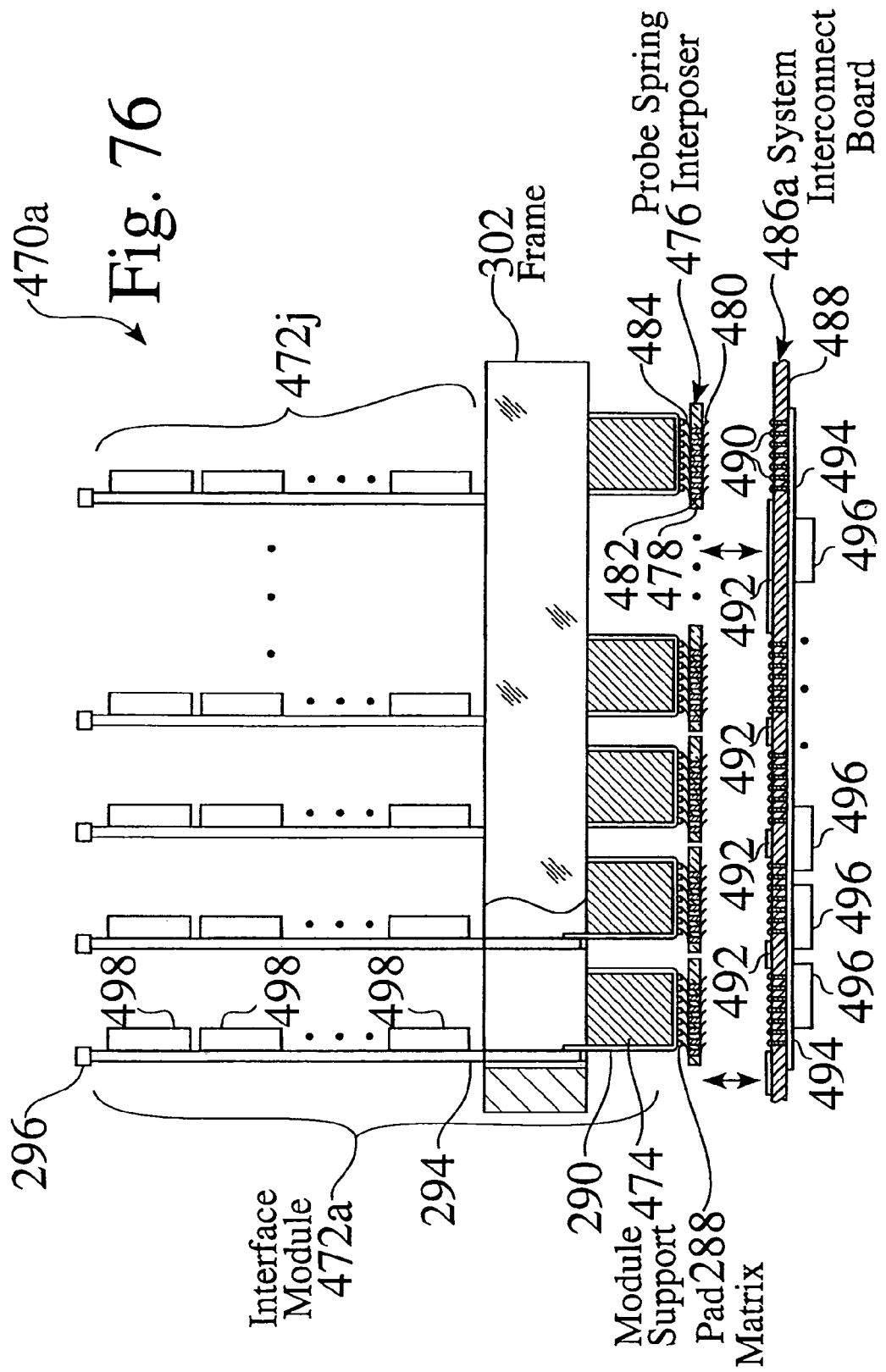
FIG. 76 is a partial cutaway assembly view of a massively parallel interface assembly, in which a plurality of interface modules are connected, through a plurality of probe spring interposers and a system interconnect board structure.

FIG. 76 is a partial cutaway assembly view of a massively parallel interface assembly 470a, in which a plurality of interface modules 472a–472j are electrically connected to a system interconnect board 486a. Each of the interface modules 472 (e.g. such as 472a) includes a pad matrix 288 of electrical conductors 319, which are each electrically connected to a probe spring interposer 476.

Each of the probe spring interposers 476 includes lower surface spring probes 480, electrically connected to upper surface spring probes 484 by vias 482. As described above, the lower surface spring probes 480, as well as the upper surface spring probes 484, may have a variety of tip geometries, such as single point springs 14, interleaved springs 34, or shoulder point springs 50, and are fabricated on the substrate 16, typically using thin-film or MEMS processing methods, to achieve low manufacturing cost, well controlled uniformity, very fine pad pitches 20, and large pin counts. In some embodiments, the flexible connections lower surface spring probes 480 and/or the upper surface spring probes 484 are built in compliance to photolithographic springs, such as described above, or as disclosed in either U.S. Pat. No. 5,848,685 or U.S. Pat. No. 5,613,861, which are incorporated herein by reference.

The probe spring interposers 476 are provide electrical connections between each of the interface modules 472a–472j and the system interconnect board 486a. The system interconnect board 486a has upper surface electrical contactors 490, vias 491, upper surface interconnection structures 492 and lower surface interconnection structures 492 494, such that one or more pads one each interface modules 472 may typically be connected together. The system interconnect board 486a may also preferably include board electrical componentry, which may be electrically connected to one or more of the interface modules 472. Each of the interface modules 472 includes links 296 which provide electrical connections to the system interconnect board 486a, and may also preferably include interface module circuitry 498.

Figure 77:
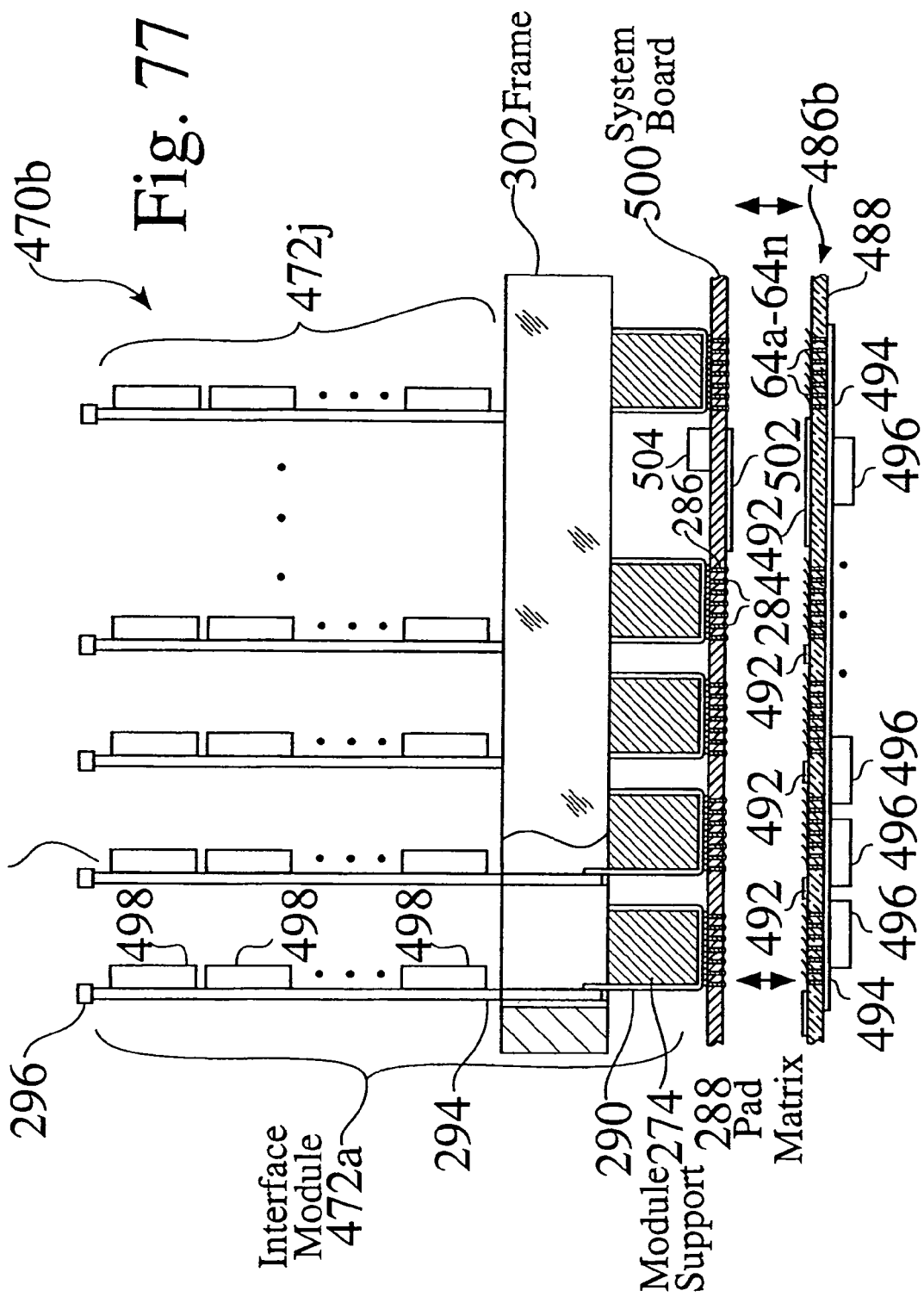
FIG. 77 is a partial cutaway assembly view of an alternate massively parallel interface assembly, in which a plurality of interface modules are connected through a system board and a system interconnect board structure.

FIG. 77 is a partial cutaway assembly view of an alternate massively parallel interface assembly 470b, in which a plurality of interface modules 472a–472j are electrically connected, through a system board interposer 500 to a system interconnect board 486b, which includes flexible probe spring 64a–64n, as described above. The system board interposer 500 may preferably include interconnection structures 502 and/or board electrical componentry 504, which may be electrically connected to one or more of the interface modules 472.

The massively parallel interface assemblies 470a,470b each provide a versatile and robust interface between a plurality of interconnected structures. The massively parallel interface assembly 470a may simply be used to provide a robust massively parallel interface, such as to provide complex parallel connections between similar components. In preferred interface embodiments, the massively parallel interface assemblies 470a,470b may also include module specific electronic circuitry 498, or shared circuitry 496.

Figure 78:
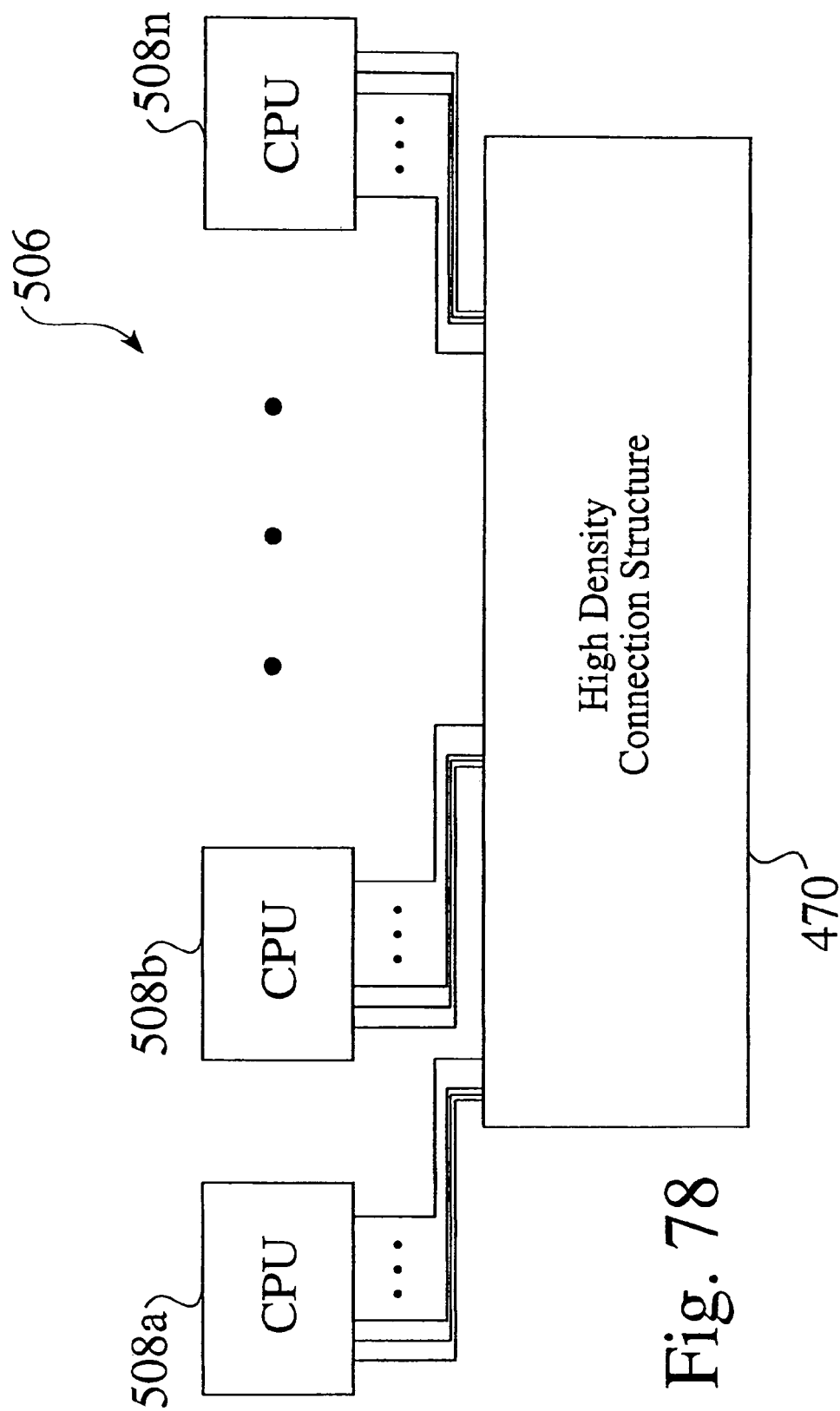
FIG. 78 is a schematic block diagram of connections between a plurality of computer systems, using a massively parallel interface assembly.
Figure 79:
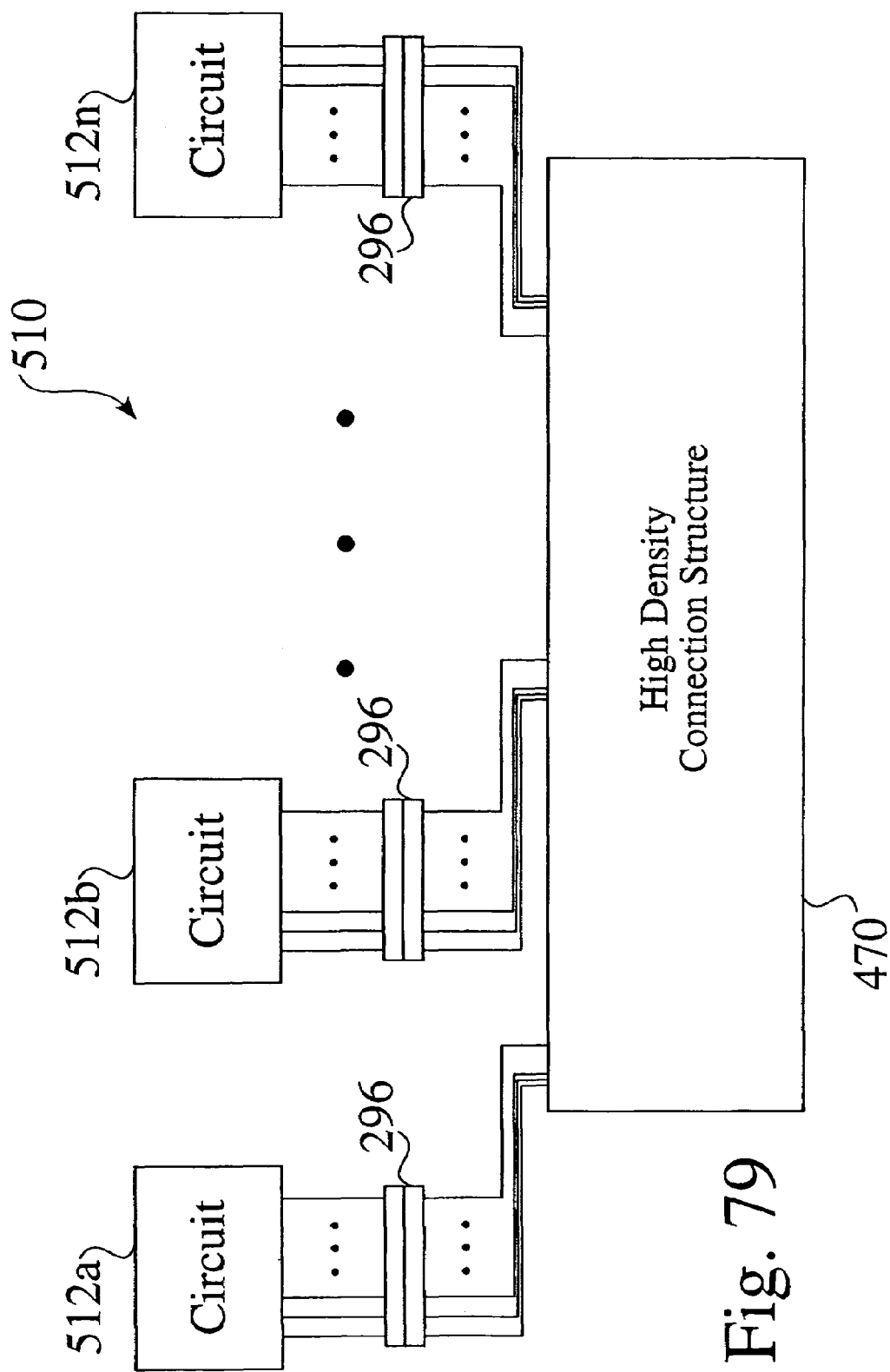
FIG. 79 is a schematic block diagram of connections between a plurality of electronic circuits, using a massively parallel interface assembly.

FIG. 78 is a schematic block diagram 506 of connections between a plurality of computer systems 508a–508n, using a massively parallel interface assembly 470. FIG. 79 is a schematic block diagram 510 of connections between a plurality of electronic circuits 512a–512n, using a massively parallel interface assembly 470.

System Advantages

The massively parallel interface assemblies 278a–278d provide signal and power interconnections between a test system and a large number of devices 44,100 located on a wafer carrier 115, while providing planarity compliance between the integrated circuits 44,100 and successive assembly layers (e.g. such as the system board 282 and the pad matrices 288 on the test electronics modules 292a–292k.

As well, the massively parallel interface assemblies 278a–278d provide short electrical paths for the power and input and output signals, between the test electronics modules 292a–292k and the devices under test 44,100, through the combined use of the system board 282 and the vertically packaged test electronics modules 292a–292k, which typically include flex circuits 290.

Furthermore, while the massively parallel interface assemblies 278a–278d provide short electrical paths for the power and input and output signals, between the test electronics modules 292a–292k and the devices under test 44,100 (thereby reducing round trip transit time), the massively parallel interface assemblies 278a–278d provide thermal isolation between the test electronics 294 and the devices under test 44,100, such that the devices under test 44,100 may be controllably operated over a wide temperature range, while the test electronics modules 292a 292k provide enhanced heat transfer away from heat sensitive components (e.g. such as through buss bars 298a–298h), and while preferably providing enhanced test module temperature control.

As described above, the massively parallel test interface assemblies 278 may be used to detect power to ground shorts in any die quickly, and to isolate power from a die having a detected power to ground short before damage is done to the test electronics. In addition, the massively parallel test interface assemblies 278 and related test system may be used to detect that the contacts to many, hundreds, or even hundreds of thousands of pads are reliably made and whether each of the contacts are within the contact resistance specification, and to assure that the self inductance and self capacitance of each signal line are below values that would adversely affect test signal integrity.

Furthermore, the massively parallel test interface assemblies 278 and related test system can be used to detect whether the mutual inductance and mutual capacitance between pairs of signal lines and between signal lines and power or ground lines are below values that would adversely affect test signal integrity.

As well, the massively parallel test interface assemblies 278 provide stimulus and response detection and analysis to many, hundreds, or even thousands, of die under test in parallel, and which preferably provides diagnostic tests to a failed die, in parallel with the continued testing of all other die.

In addition, the massively parallel test interface assemblies 278 can reliably and repeatedly establish contact to many, hundreds, or even thousands of pads 47, without the need to periodically stop and inspect and/or clean the probe interface structure 16.

Furthermore, the massively parallel test interface assemblies 278 inherently organize and manage the interconnections between the devices under test 44 and the tester electronics 430, while maintaining signal integrity and power and ground stability, and assures that no two or more adjacent pads 47 are contacted by a single test probe tip.

Although the disclosed massively parallel interface assemblies are described herein in connection with integrated circuit testing, computer networking, and circuit connections, the assemblies and techniques can be implemented with a wide variety devices and circuits, such as interconnections between integrated circuits and substrates within electronic components or devices, burn-in devices and MEMS devices, or any combination thereof, as desired.

Accordingly, although the invention has been described in detail with reference to a particular preferred embodiment, persons possessing ordinary skill in the art to which this invention pertains will appreciate that various modifications and enhancements may be made without departing from the spirit and scope of the claims that follow.

What is claimed is:

1. A contactor, comprising:
    at least one stress metal spring formed on a surface of a substrate, said stress metal spring having an anchor portion attached to said substrate surface and a free portion, initially attached to said substrate surface, said stress metal spring comprising a plurality of layers, at least two of the layers having different inherent levels of stress which effect rotation of said free portion of said stress metal spring from said substrate surface by an effective rotation angle upon release of said free portion from said substrate surface; and
    at least one plated metal layer substantially covering said stress metal spring.

2. The contactor of claim 1, wherein said at least one plated metal layer comprises any of nickel, an alloy of nickel which may be selected from the group comprising nickel iron, nickel cobalt, nickel cobalt iron, nickel molly, nickel tungsten, nickel iron tungsten, nickel cobalt tungsten, nickel rhodium, nickel cobalt manganese, nickel iron rhodium, nickel iron manganese, palladium, an alloy of palladium, palladium cobalt, gold, an alloy of gold, silver, rhodium, cobalt, an alloy of cobalt, tin, an alloy of tin, copper, an alloy of copper, and lead containing or lead free solder materials.

3. The contactor of claim 1 wherein said at least one plated metal layer is applied any of before or after release of said free portion from said substrate surface.

4. The contactor of claim 1 wherein said at least one plated metal layer is applied with any of electroplating, electroless plating, sputtering and evaporation.

5. The contactor of claim 1 wherein said at least one plated metal layer provides any of increased mechanical strength, reduced electrical resistance, increased resistance to mechanical wear and reduced debris pickup.

6. The contactor of claim 1 wherein said free portion of said at least one stress metal spring extends from said anchor portion to define a tip, and
    wherein said at least one plated metal layer envelopes at least a portion of said free portion of said at least one stress metal spring extending from the tip toward the anchor portion.

7. The contactor of claim 1 wherein said at least one stress metal spring provides an electrical connection to any of a printed wiring board, an integrated circuit, a chip scale package, and a solder ball.

8. The contactor of claim 1, wherein said at least one stress metal spring comprises a plurality said stress metal springs defining an array for providing any of tight pitch, vertical compliance, and planarity compliance.

9. The contactor of claim 1 wherein said contactor comprises any of an interposer, a separable connector, and an interface assembly.

10. The contactor of claim 1, wherein said substrate comprises any of an integrated circuit package, an integrated circuit device, and a printed circuit board.

11. An electrical connection made between a printed wiring board and a substrate comprising:
    at least one electrical contact pad on the surface of said printed wiring board;
    at least one stress metal spring having a contact area, said stress metal spring formed on a substrate surface having an anchor portion attached to said substrate surface and a free portion, initially attached to said substrate surface, said stress metal spring comprising a plurality of layers, at least two of the layers having different inherent levels of stress which effect rotation of said free portion of said stress metal spring from said substrate surface by an effective rotation angle upon release of said free portion from said substrate surface, and one or more plating layers substantially covering said stress metal spring; and
    at least one solder ball contact between said printed wiring board contact pad and said contact area of said stress metal spring.

12. The electrical connection of claim 11, wherein said at least one stress metal spring provides any of a permanent and a demountable connection to said solder ball.

13. The electrical connection of claim 11, further comprising an array of said solder balls on any of an integrated circuit, an active device, a printed wiring board, and a chip scale package.

14. The electrical connection of claim 11, wherein said plating layers substantially cover said free portion of said stress metal spring.

15. The electrical connection of claim 11, wherein said plating layers comprise any of nickel, an alloy of nickel which may be selected from the group comprising nickel iron, nickel cobalt, nickel cobalt iron, nickel molybdenum, nickel tungsten, nickel iron tungsten, nickel cobalt tungsten, nickel rhodium, nickel cobalt manganese, nickel iron rhodium, nickel iron manganese, palladium, an alloy of palladium, palladium cobalt, gold, an alloy of gold, silver, rhodium, cobalt, an alloy of cobalt, tin, an alloy of tin, copper, an alloy of copper, and lead containing or lead free solder materials.

16. The electrical connection of claim 11, wherein said at least one metal layer is applied before or after release of said free portion from said substrate surface.

17. The electrical connection of claim 11, wherein said at least one metal layer is applied with any of electroplating, electroless plating, sputtering, evaporation, or equivalent processes.

18. The electrical connection of claim 11, wherein said at least one metal layer provides any of increased mechanical strength, reduced electrical resistance, increased resistance to mechanical wear, reduced debris pickup, and increased solder connection compatibility.

19. The electrical connection of claim 11, wherein said free portion of said at least one stress metal spring extends from said anchor portion to define a tip, and wherein said at least one metal layer envelopes at least a portion of said free portion of said at least one stress metal spring extending from the tip toward the anchor portion.

20. The electrical connection of claim 11, wherein said at least one stress metal spring comprises a plurality of stress metal springs defining an array for providing any of tight pitch, vertical compliance, and planarity compliance.

21. The electrical connection of claim 11, wherein said substrate comprises any of an interposer, a separable connector, and an interface assembly.

22. The electrical connection of claim 11, wherein said substrate comprises any of an integrated circuit package substrate, an integrated circuit device, and a printed circuit board.

* * * * *